(12) United States Patent
Lee et al.

(10) Patent No.: US 11,935,754 B2
(45) Date of Patent: *Mar. 19, 2024

(54) TRANSISTOR GATE STRUCTURE AND METHOD OF FORMING

(71) Applicant: Taiwan Semiconductor Manufacturing Co., Ltd., Hsinchu (TW)

(72) Inventors: Hsin-Yi Lee, Hsinchu (TW); Cheng-Lung Hung, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/854,175

(22) Filed: Jun. 30, 2022

(65) Prior Publication Data
US 2022/0328319 A1    Oct. 13, 2022

Related U.S. Application Data

(63) Continuation of application No. 17/078,911, filed on Oct. 23, 2020, now Pat. No. 11,437,240.
(Continued)

(51) Int. Cl.
*H01L 21/285*    (2006.01)
*H01L 21/8238*   (2006.01)
(Continued)

(52) U.S. Cl.
CPC ............... *H01L 21/28568* (2013.01); *H01L 21/823842* (2013.01); *H01L 27/092* (2013.01);
(Continued)

(58) Field of Classification Search
CPC ....... H01L 21/28568; H01L 21/823842; H01L 27/092; H01L 29/0673; H01L 29/401;
(Continued)

(56) References Cited

U.S. PATENT DOCUMENTS 9,105,490 B2    8/2015    Wang et al.
9,236,267 B2    1/2016    De et al.
(Continued)

FOREIGN PATENT DOCUMENTS

KR    20190024569 A    3/2019
KR    20190037057 A    4/2019
KR    20200035837 A    4/2020

*Primary Examiner* — Tong-Ho Kim
(74) *Attorney, Agent, or Firm* — Slater Matsil, LLP

(57) ABSTRACT

A device includes a first nanostructure; a second nanostructure over the first nanostructure; a high-k gate dielectric around the first nanostructure and the second nanostructure, the high-k gate dielectric having a first portion on a top surface of the first nano structure and a second portion on a bottom surface of the second nanostructure; and a gate electrode over the high-k gate dielectric. The gate electrode comprises: a first work function metal around the first nanostructure and the second nanostructure, the first work function metal filling a region between the first portion of the high-k gate dielectric and the second portion of the high-k gate dielectric; and a tungsten layer over the first work function metal, the tungsten layer being free of fluorine.

20 Claims, 59 Drawing Sheets

Related U.S. Application Data

(60) Provisional application No. 63/061,361, filed on Aug. 5, 2020.

(51) Int. Cl.
*H01L 27/092* (2006.01)
*H01L 29/06* (2006.01)
*H01L 29/40* (2006.01)
*H01L 29/423* (2006.01)
*H01L 29/786* (2006.01)

(52) U.S. Cl.
CPC ........ *H01L 29/0673* (2013.01); *H01L 29/401* (2013.01); *H01L 29/42392* (2013.01); *H01L 29/78696* (2013.01)

(58) Field of Classification Search
CPC ......... H01L 29/42392; H01L 29/78696; H01L 21/823807; H01L 29/66545; H01L 29/775; H01L 29/66439; H01L 29/4966; H01L 29/7848; H01L 29/42356; H01L 21/28008; H01L 29/42364; H01L 21/823828; H01L 21/28079; H01L 21/823857; H01L 29/4958; H01L 29/516
USPC ........................................................ 257/412
See application file for complete search history.

(56) References Cited

U.S. PATENT DOCUMENTS

| | | | |
|---|---|---|---|
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 9,935,173 | B1 | 4/2018 | Wu et al. |
| 10,700,064 | B1 | 6/2020 | Zhang et al. |
| 11,437,240 | B2 * | 9/2022 | Lee ................ H01L 29/66545 |
| 2018/0151373 | A1 | 5/2018 | Tsai et al. |
| 2019/0051542 | A1 | 2/2019 | Liu et al. |
| 2019/0096680 | A1 | 3/2019 | Wei et al. |
| 2019/0131396 | A1 * | 5/2019 | Zhang ............... H01L 21/02236 |
| 2019/0296128 | A1 | 9/2019 | Smith et al. |
| 2019/0305102 | A1 | 10/2019 | Lavric et al. |
| 2020/0083221 | A1 | 3/2020 | Ando et al. |
| 2021/0013111 | A1 | 1/2021 | Smith et al. |
| 2021/0296439 | A1 | 9/2021 | Yang et al. |
| 2021/0366778 | A1 | 11/2021 | Savant et al. |

\* cited by examiner

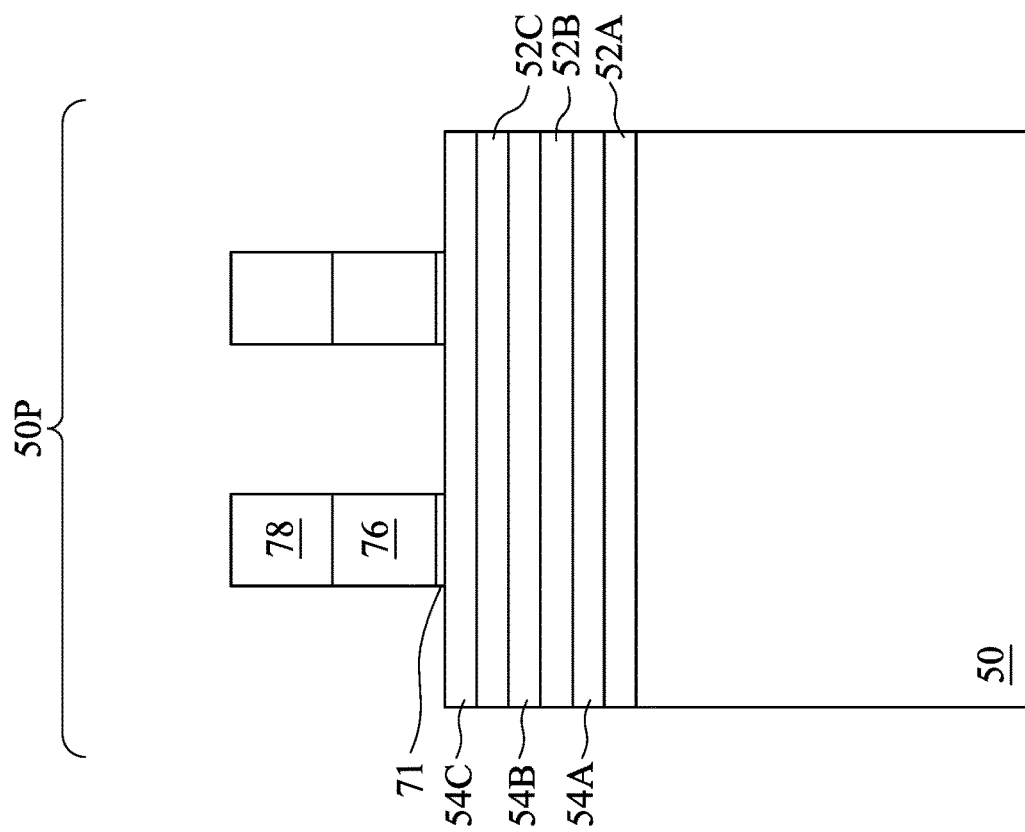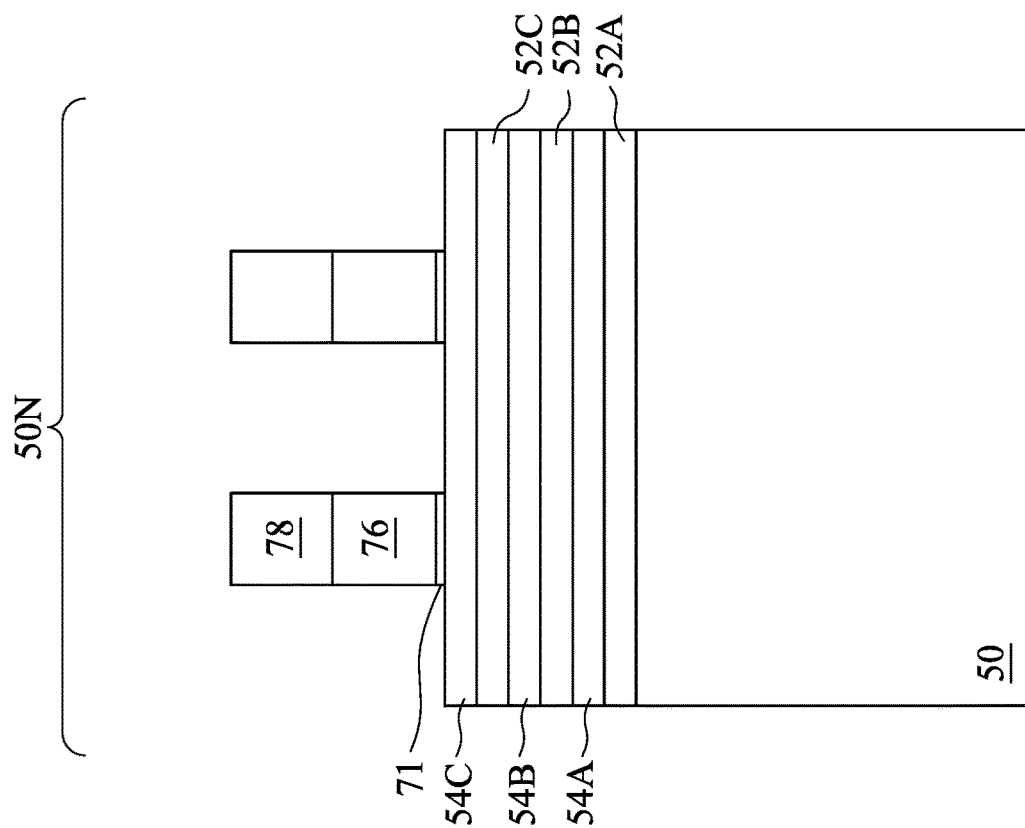
Fig. 6B

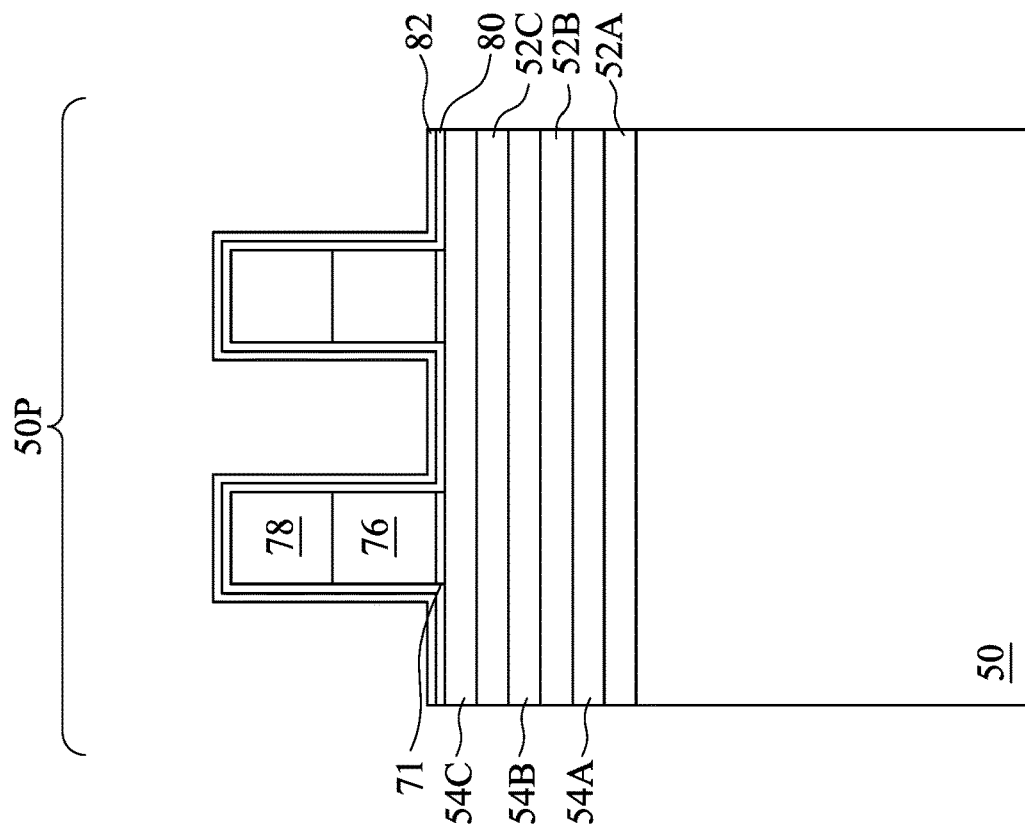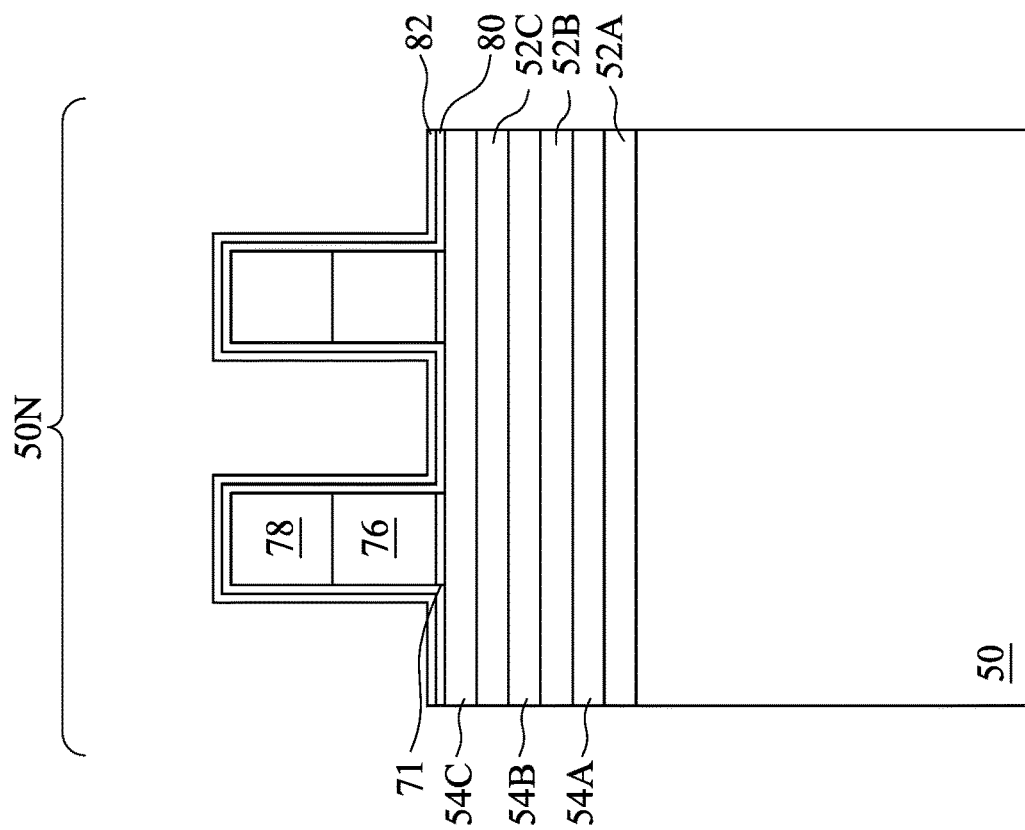
Fig. 7B

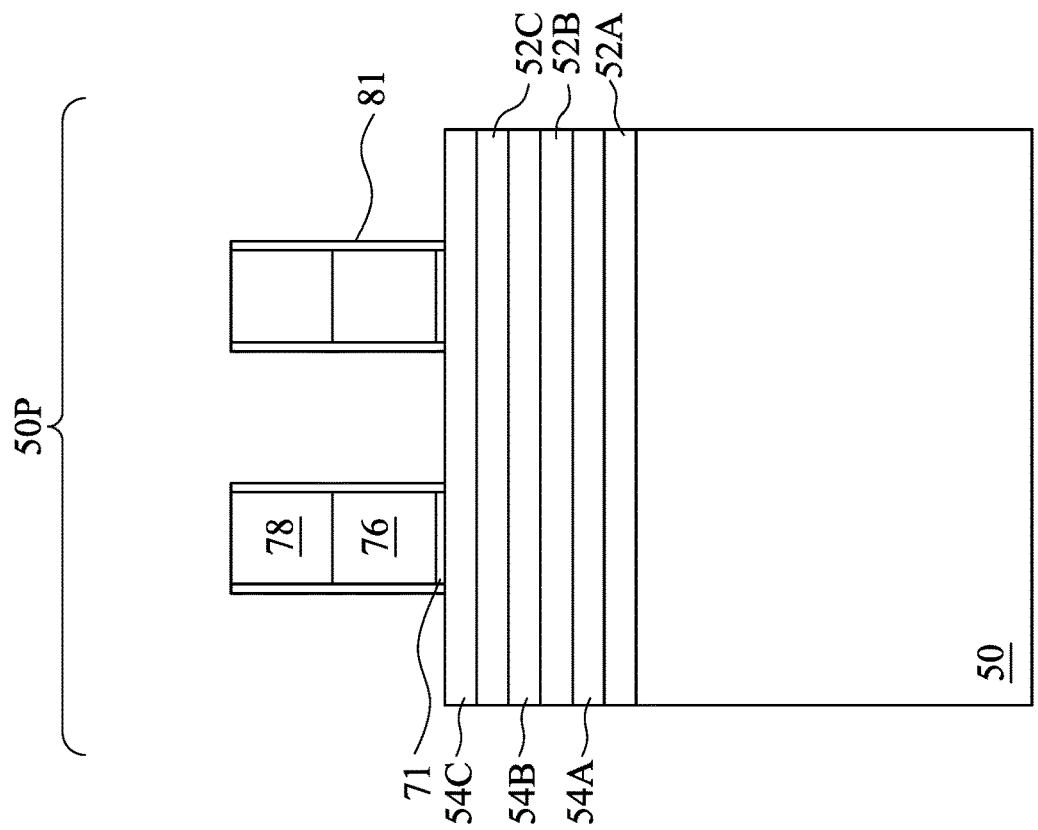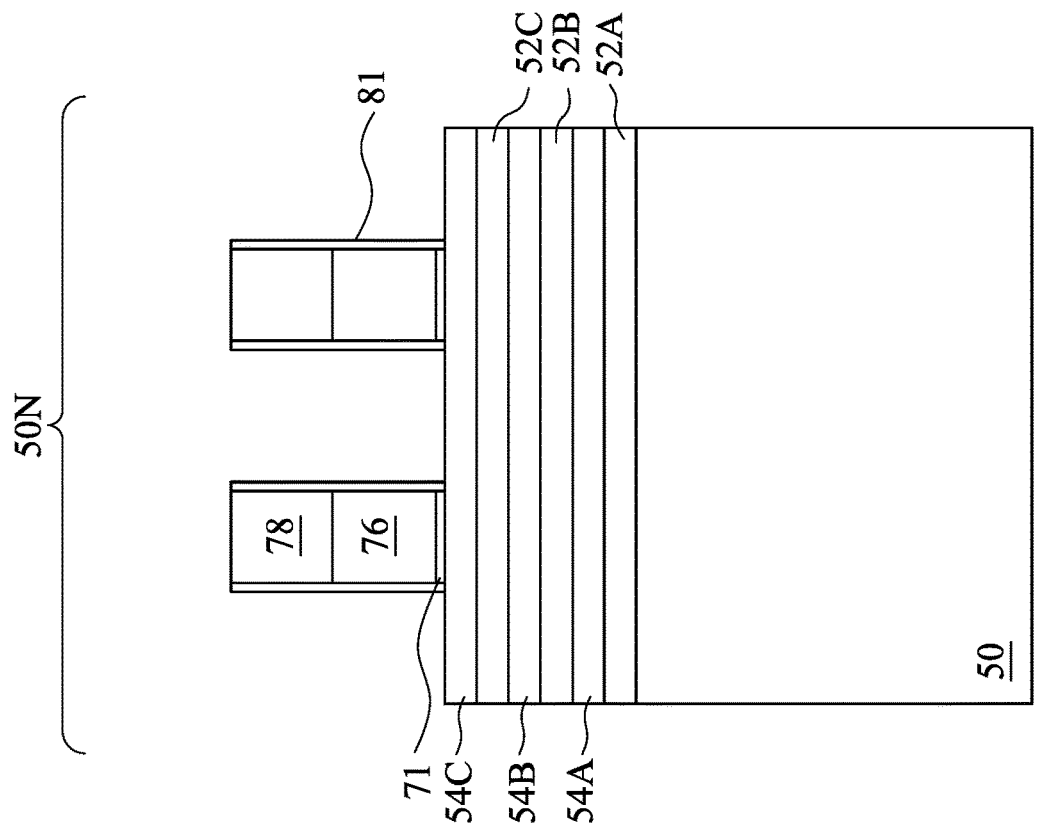
Fig. 8B

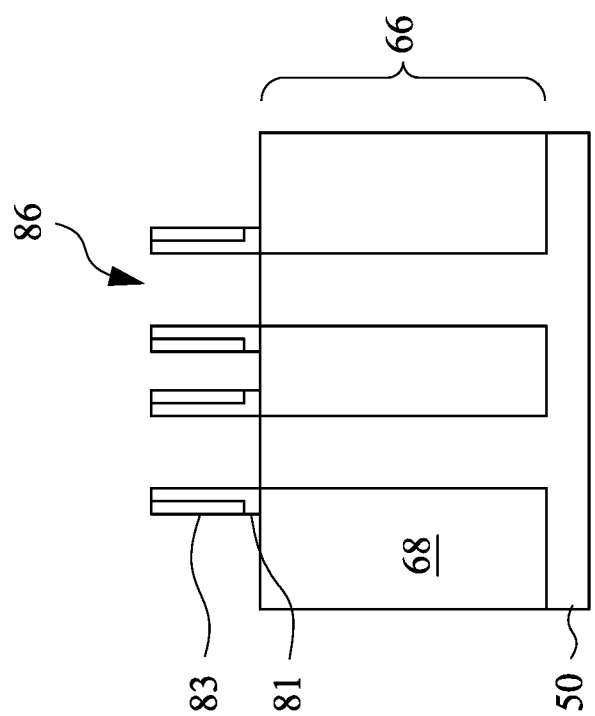

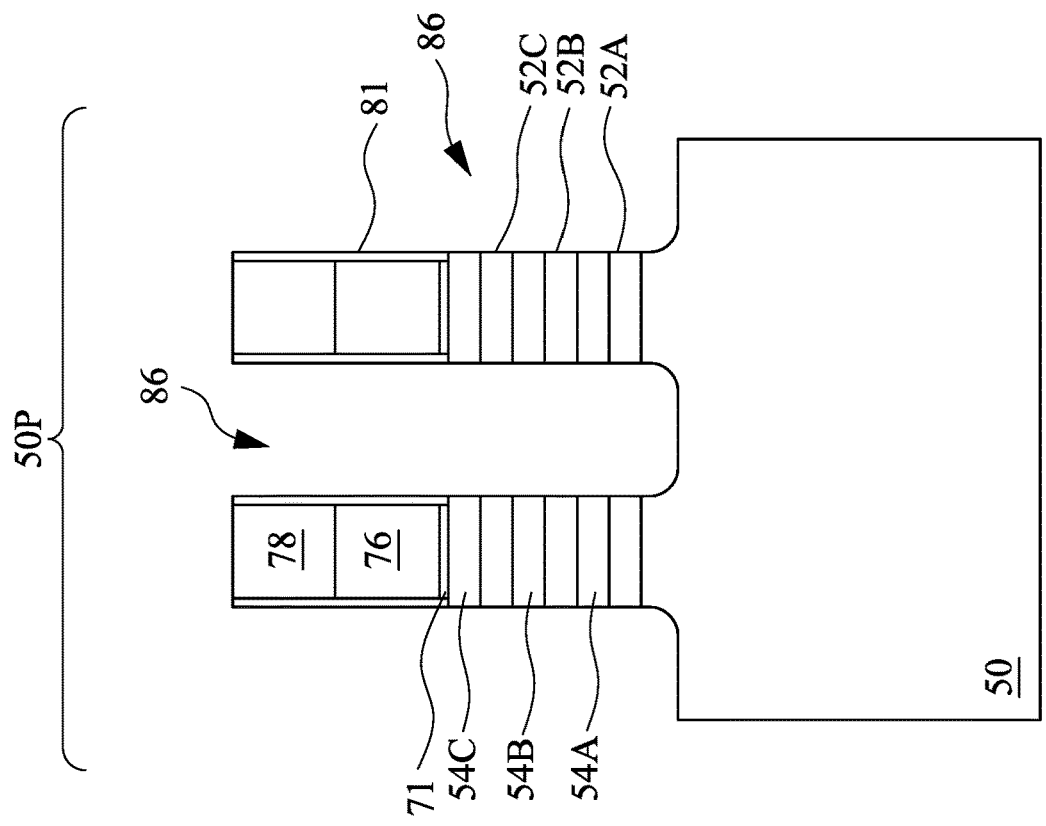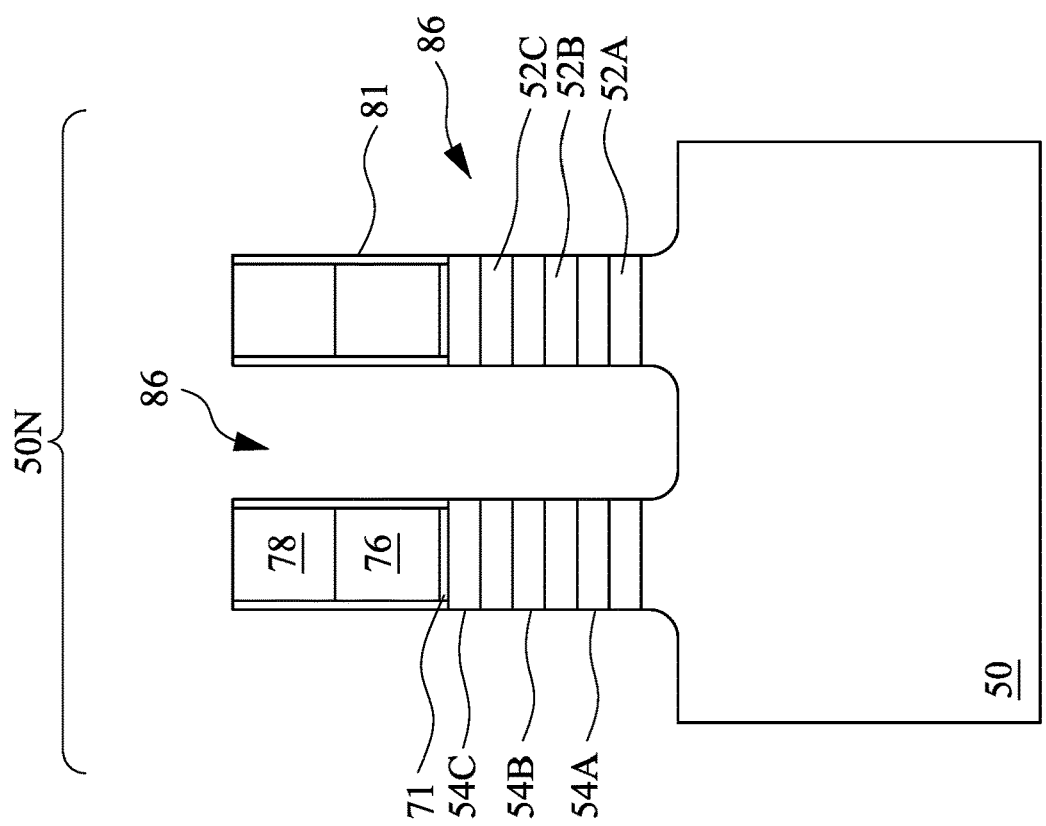
Fig. 9B

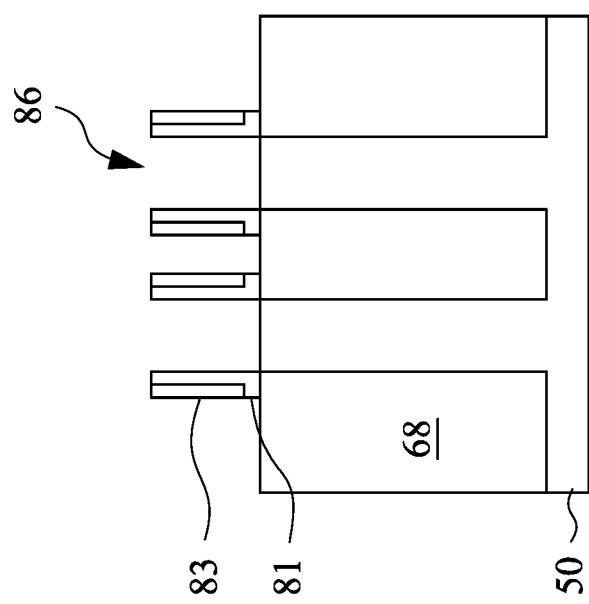

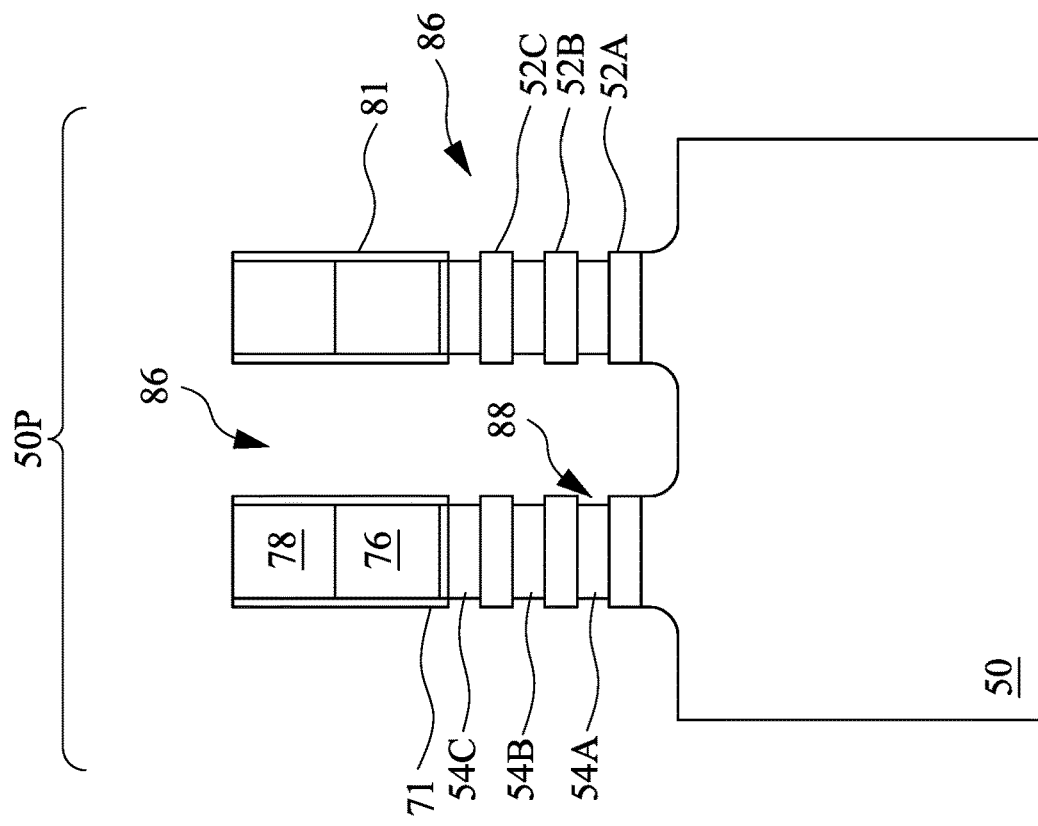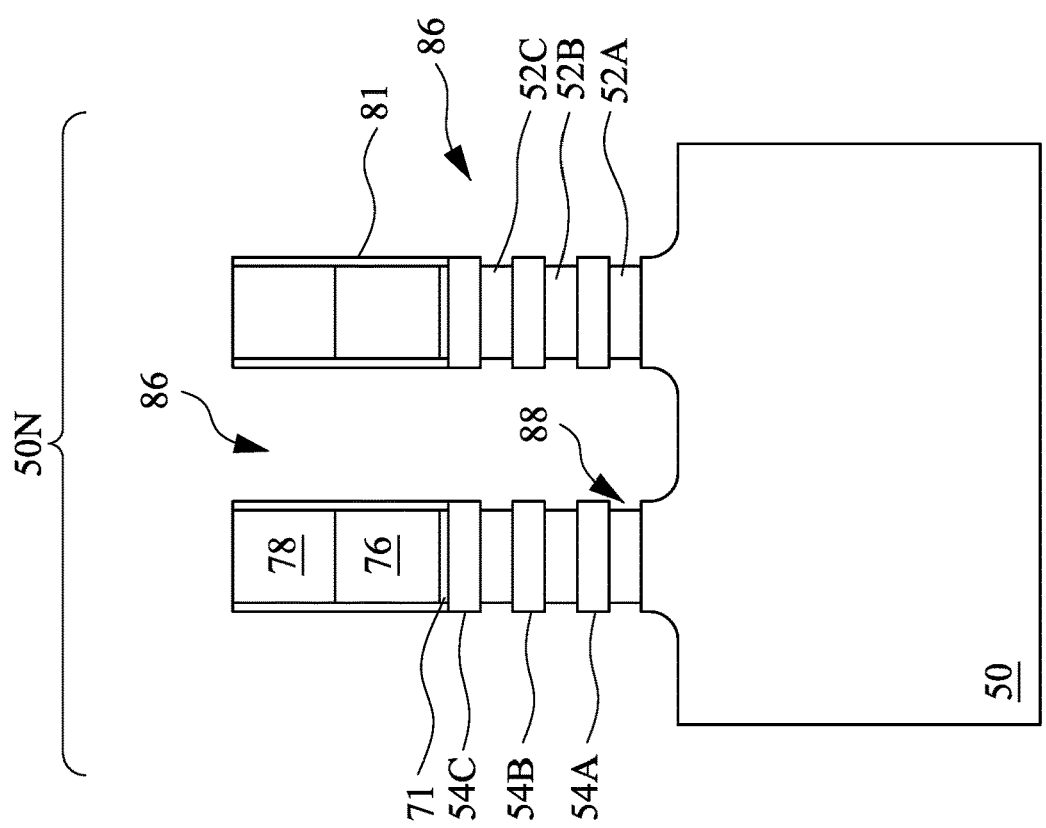
Fig. 10B

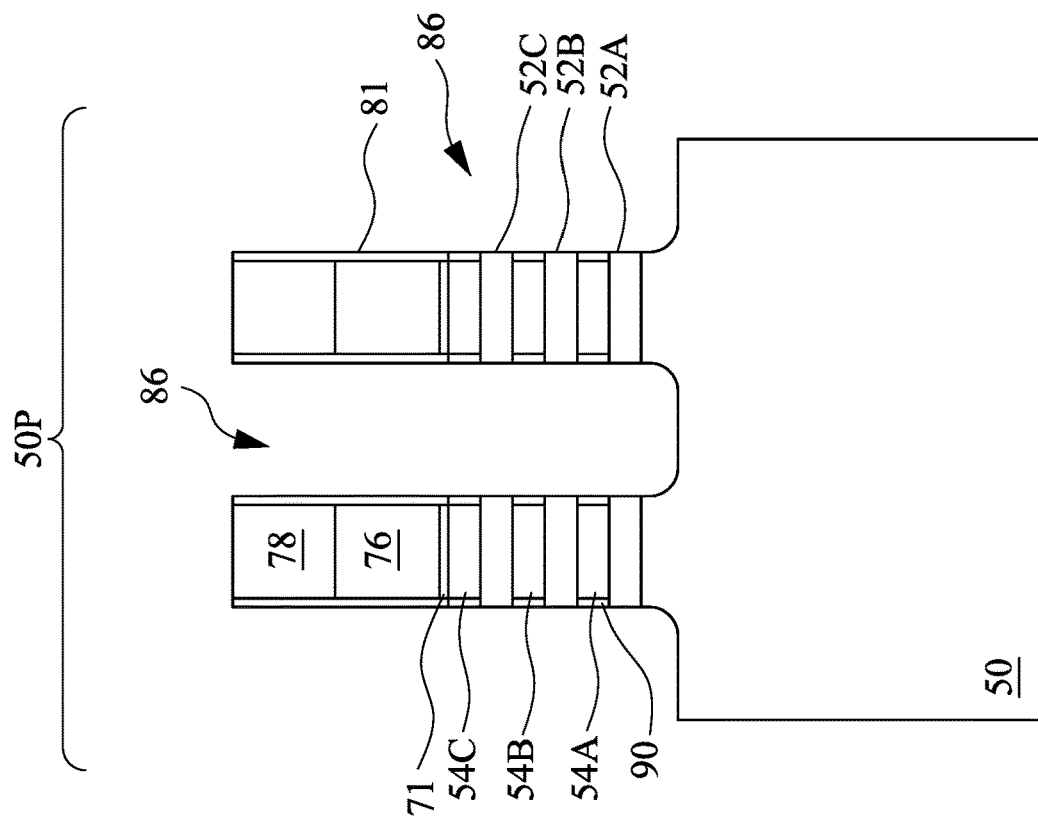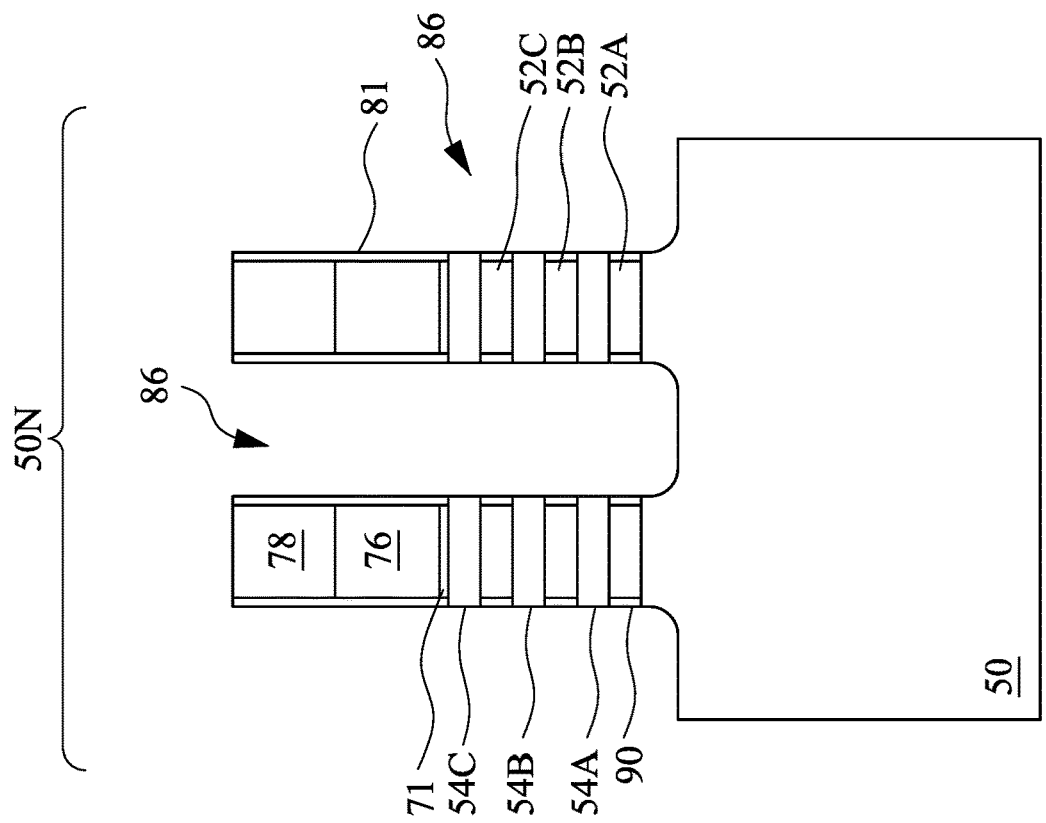
Fig. 11B

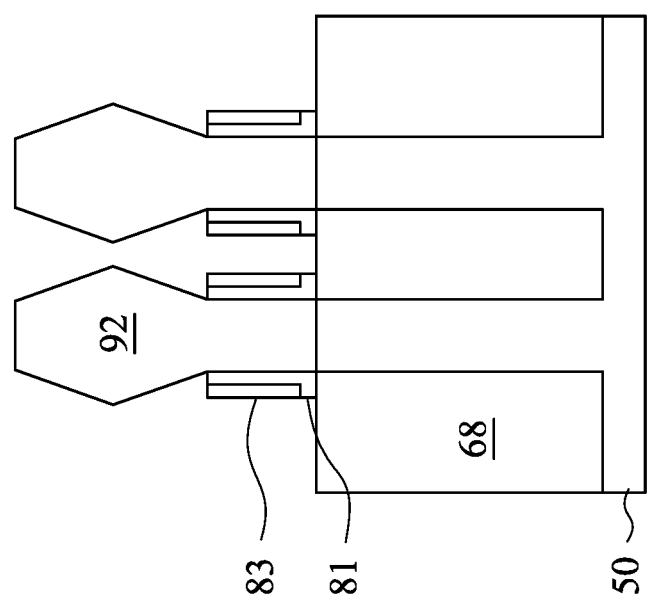

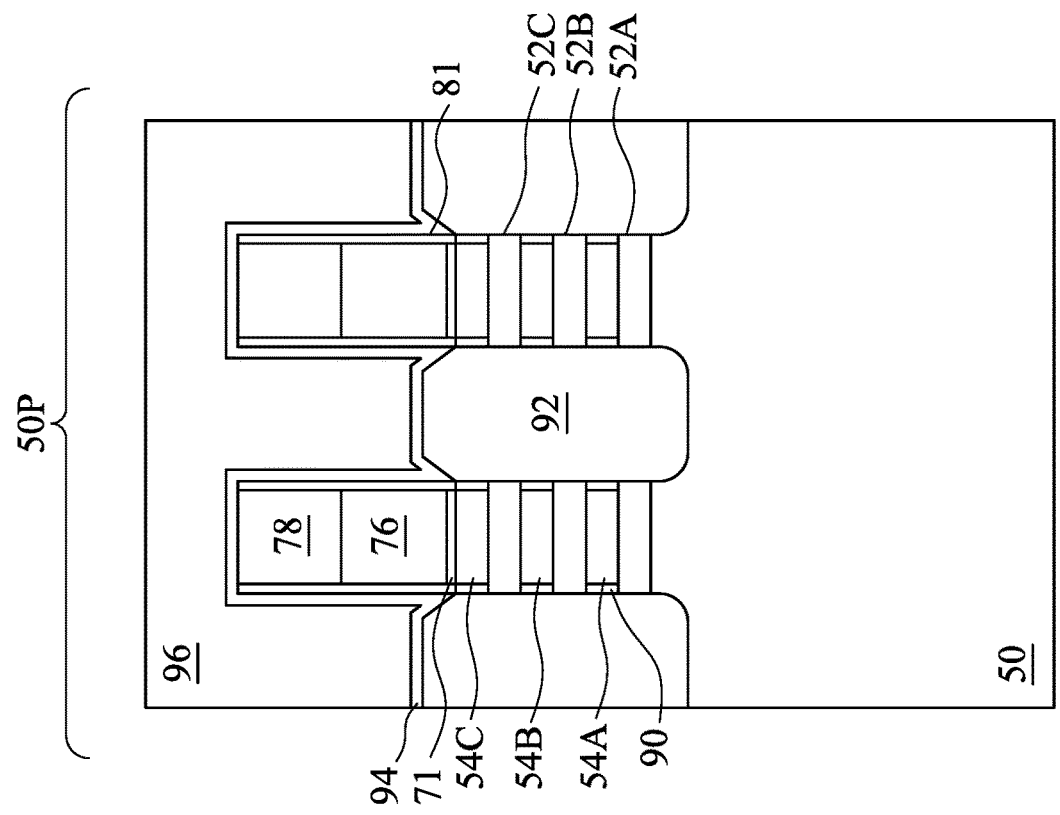
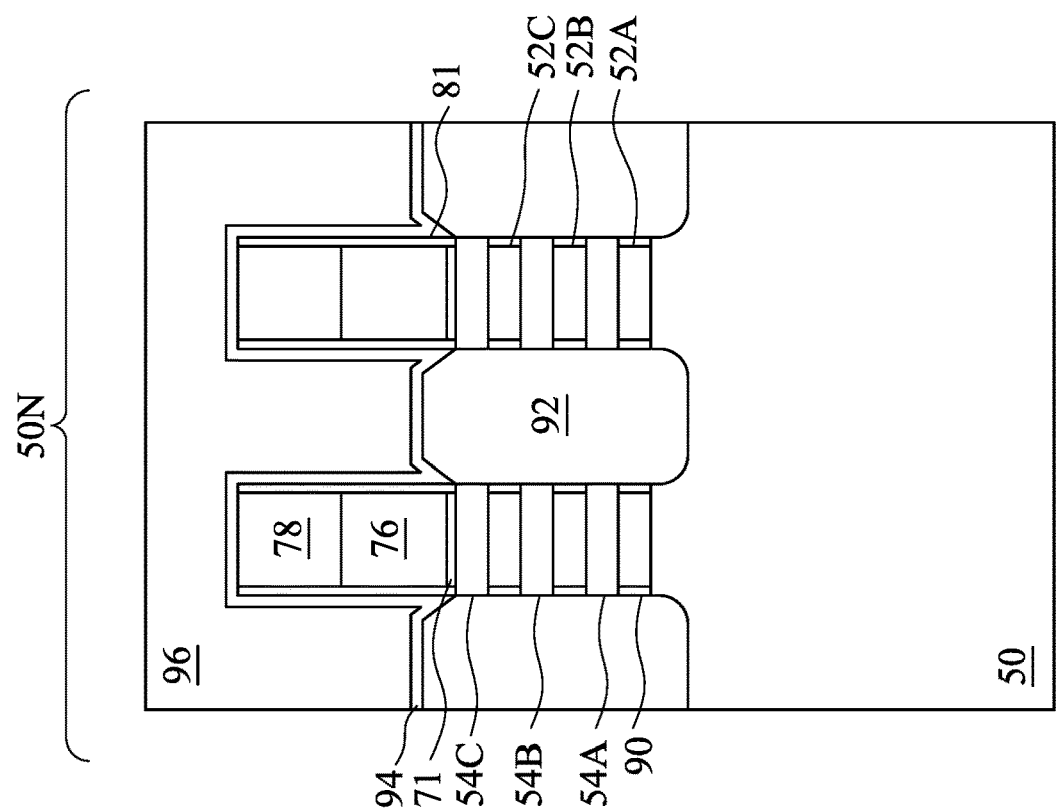
Fig. 13B

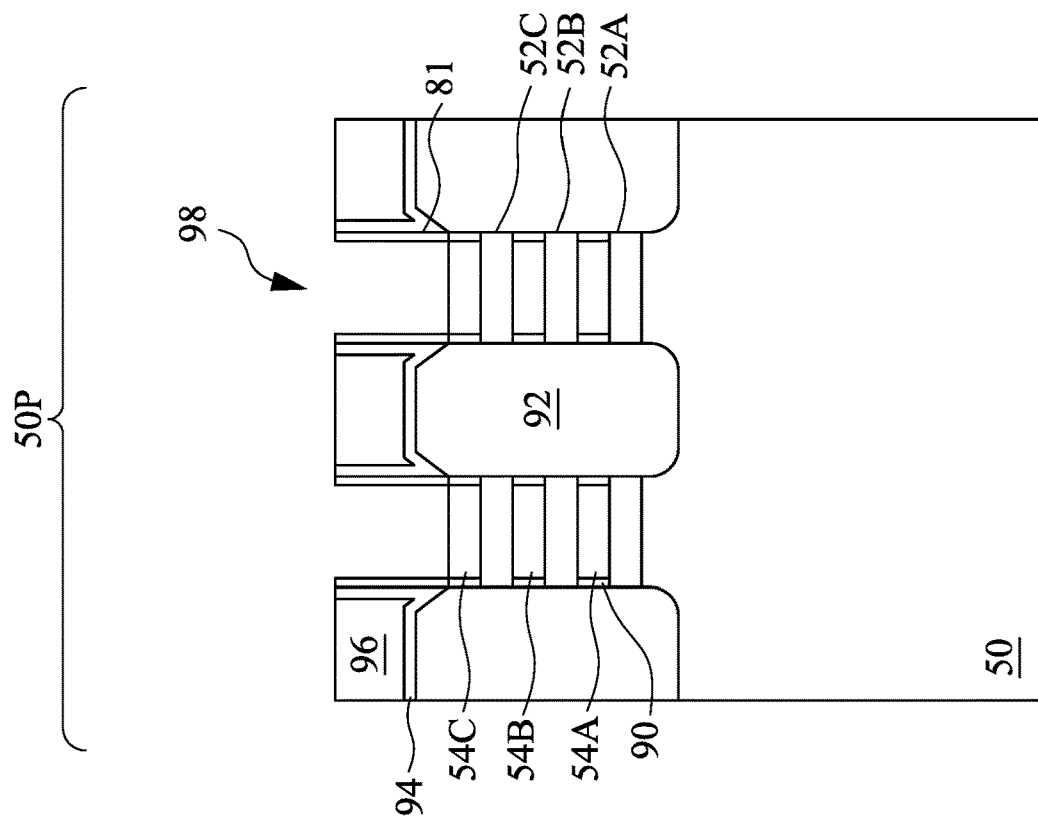
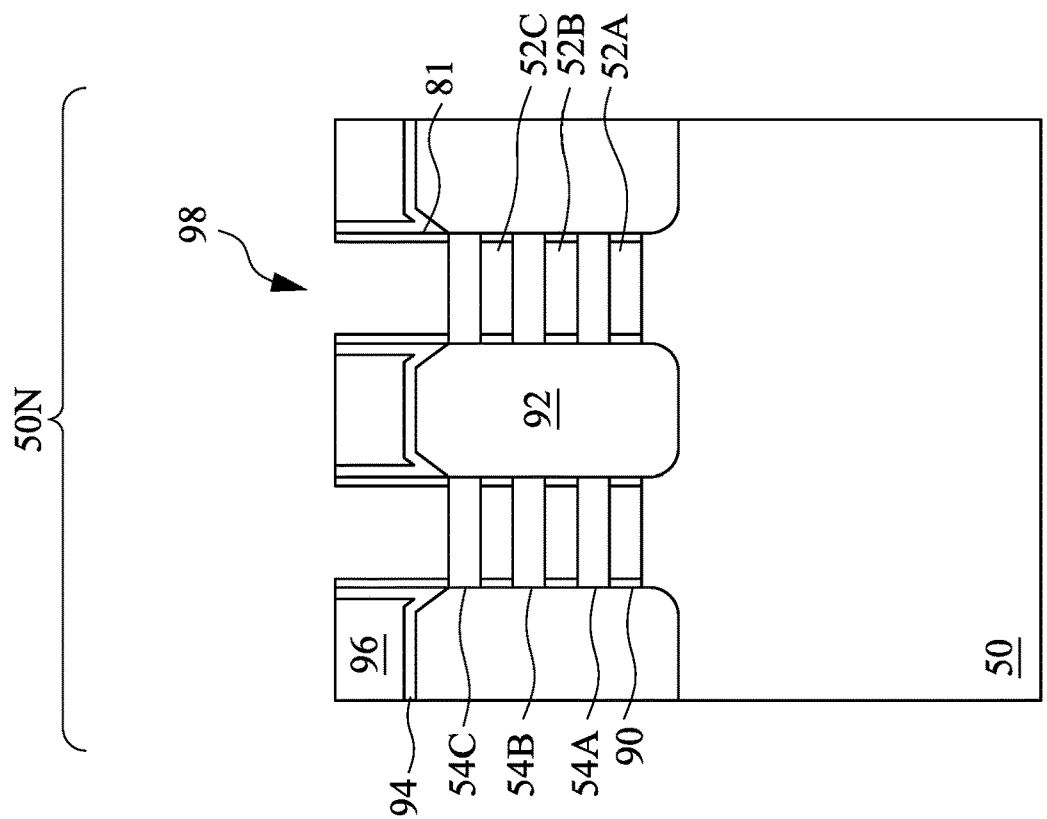
Fig. 15B

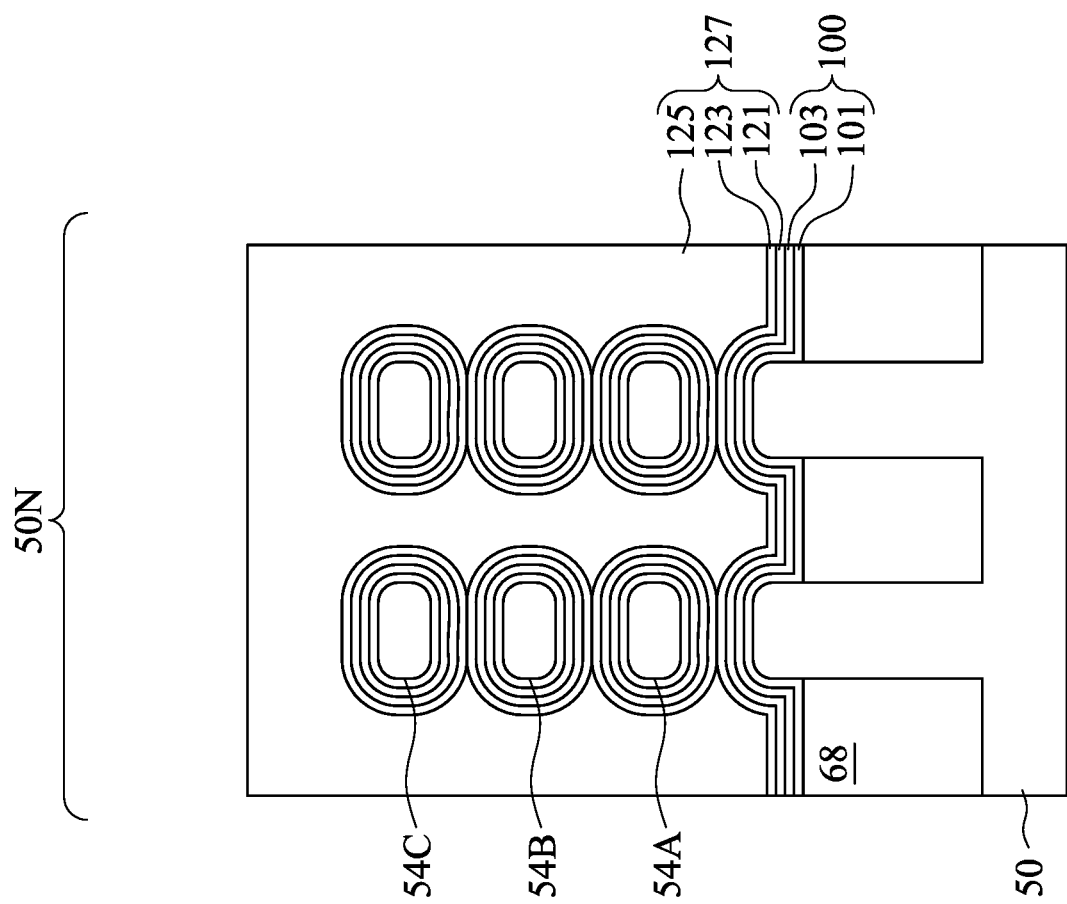

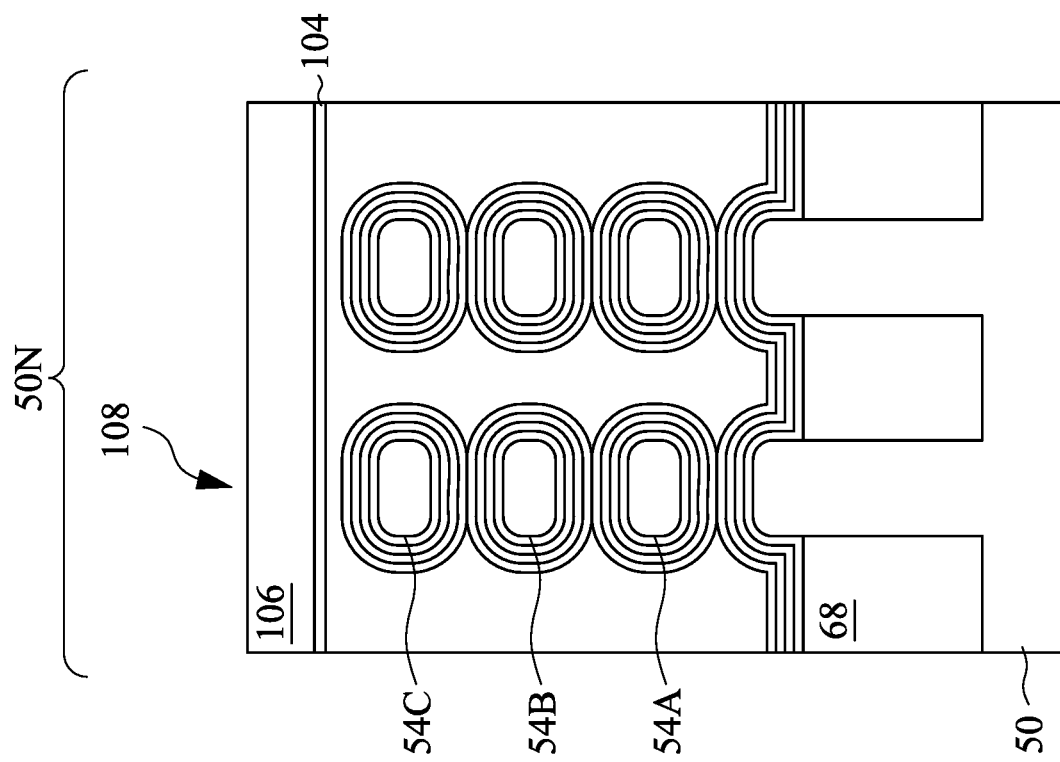
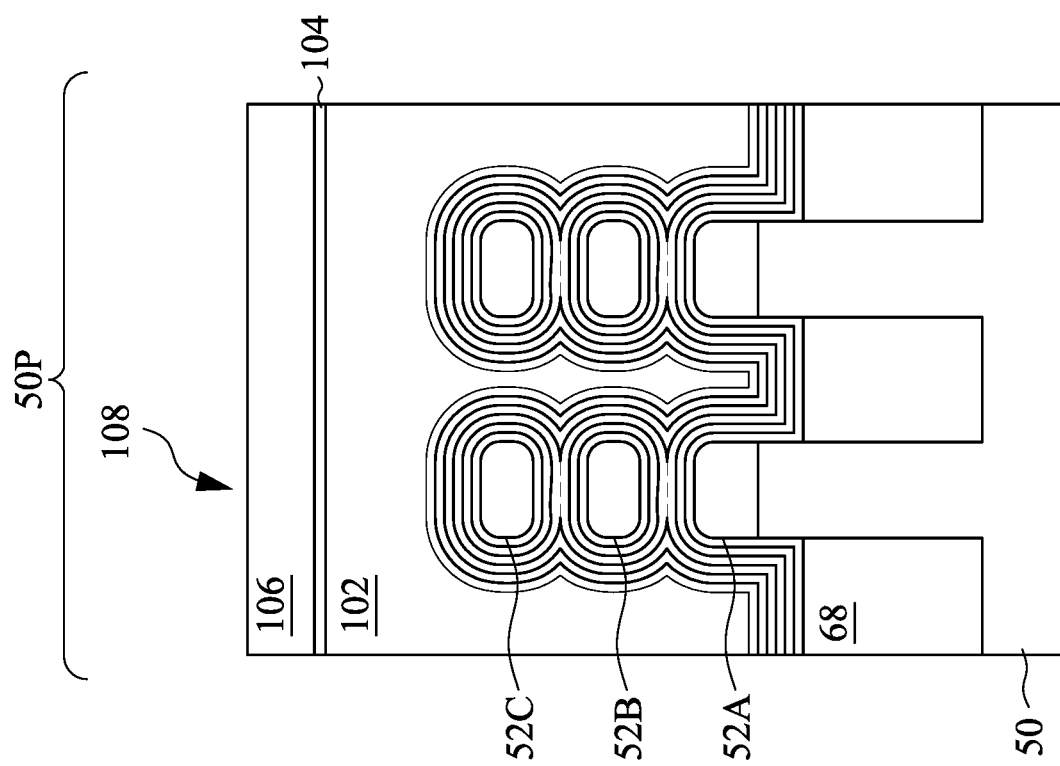
Fig. 23A

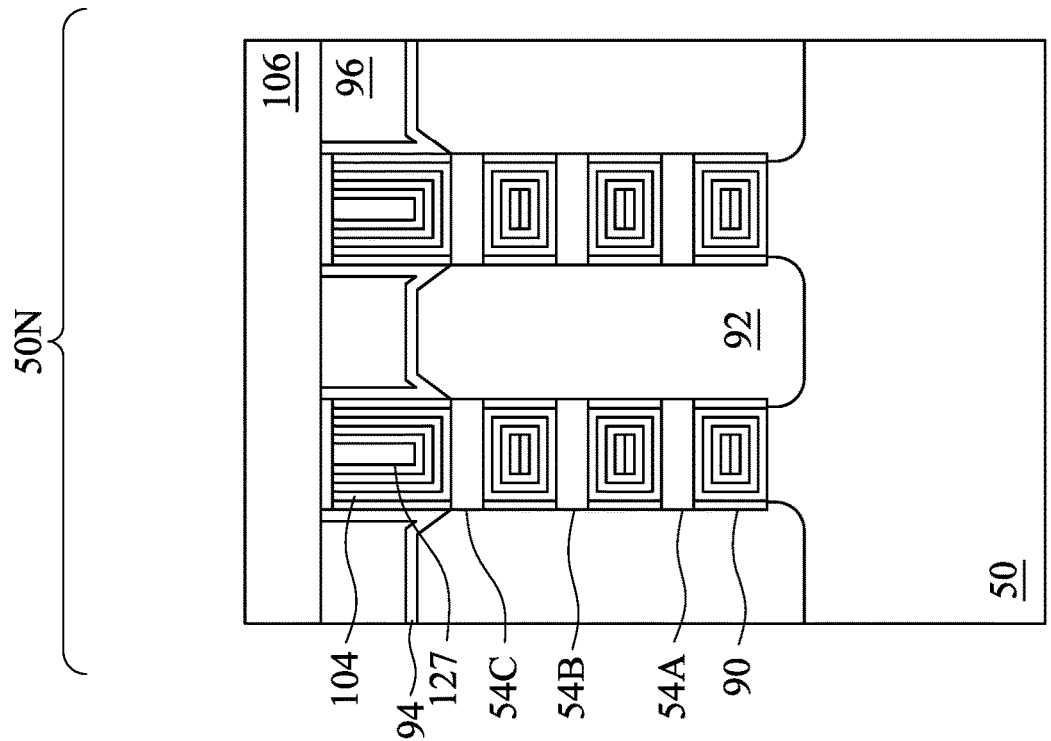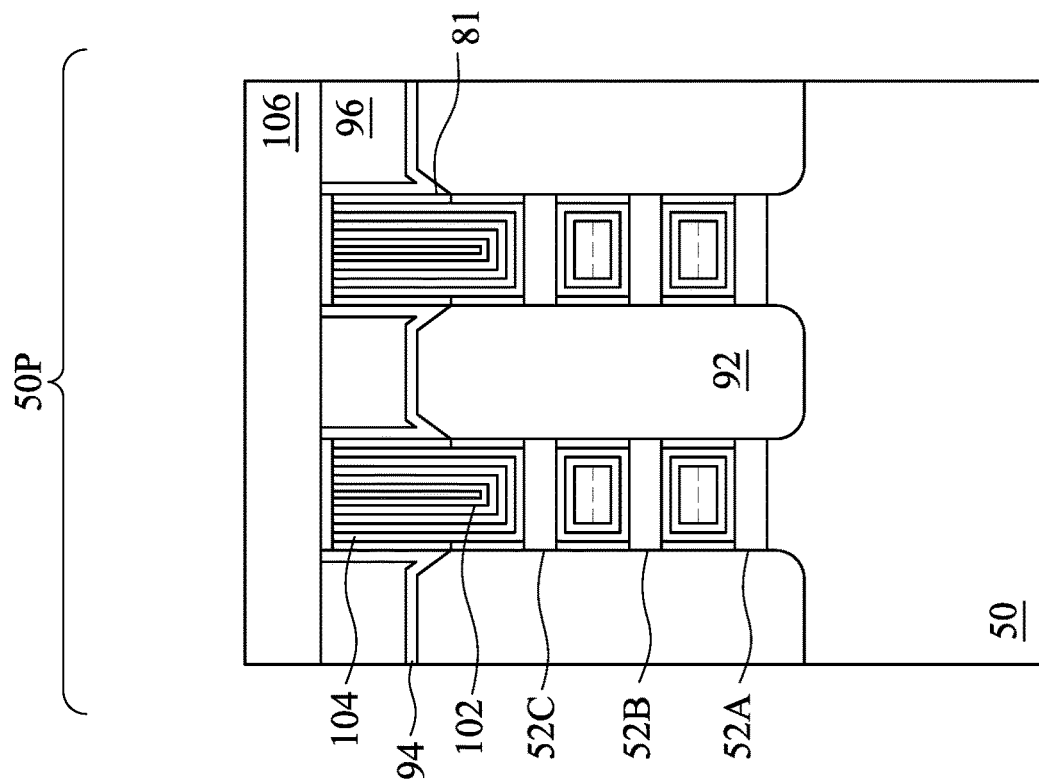
Fig. 23B

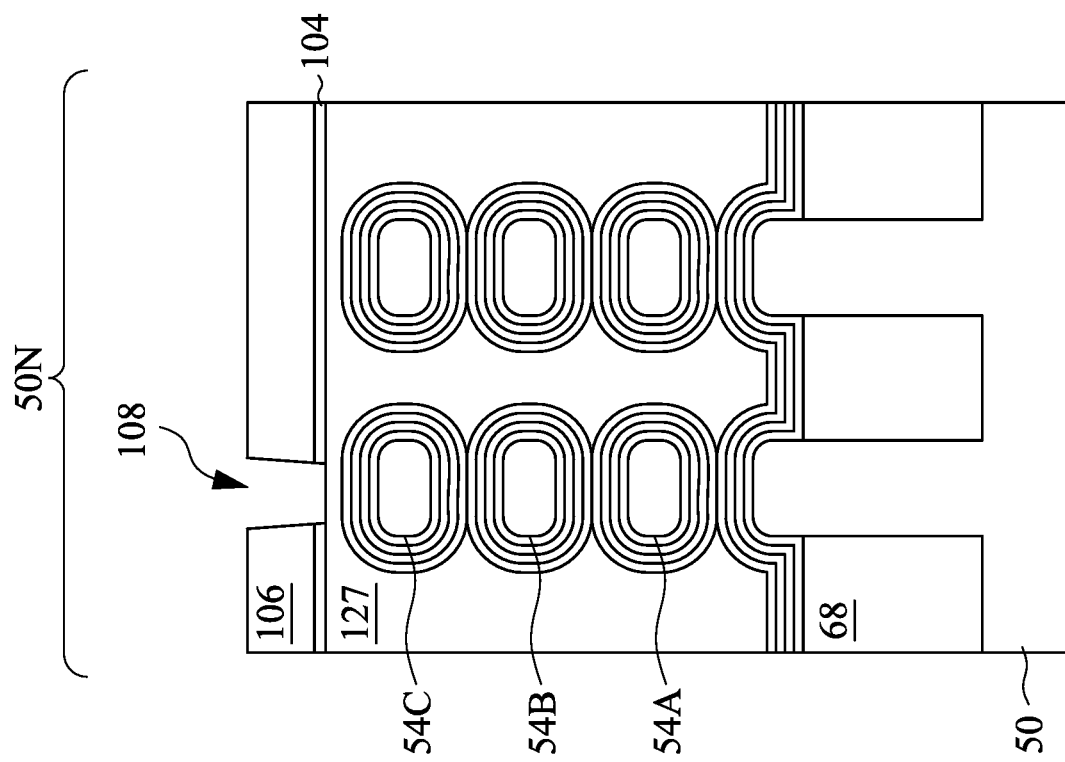
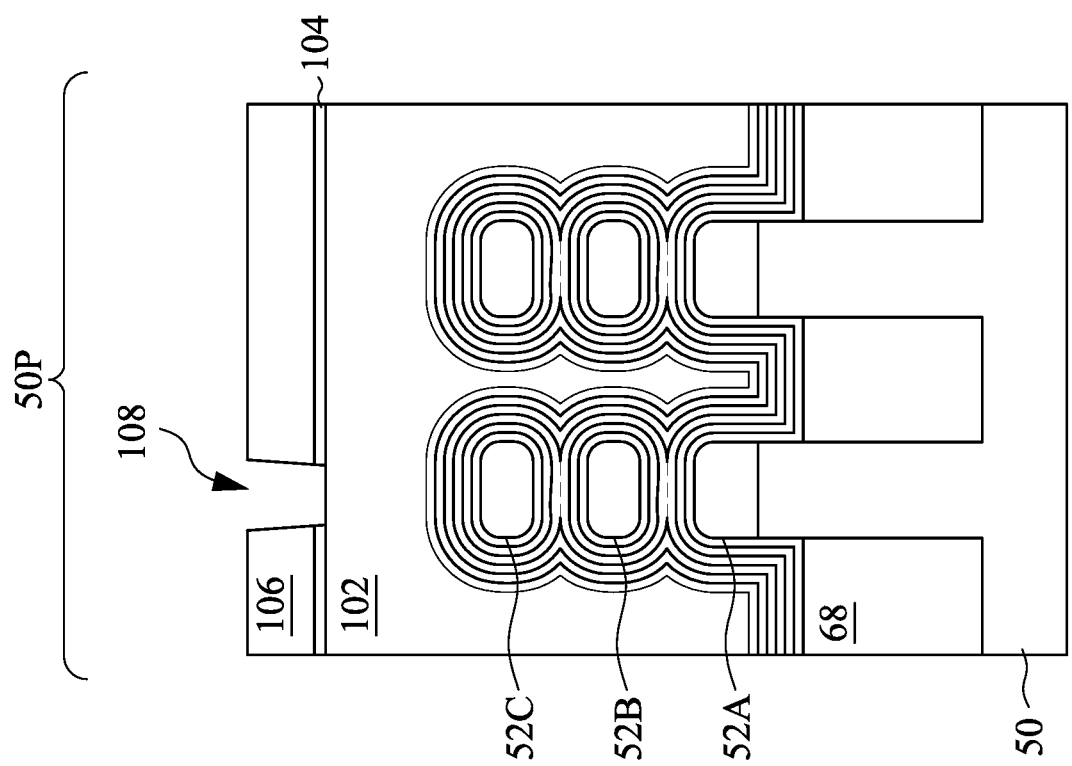
Fig. 24A

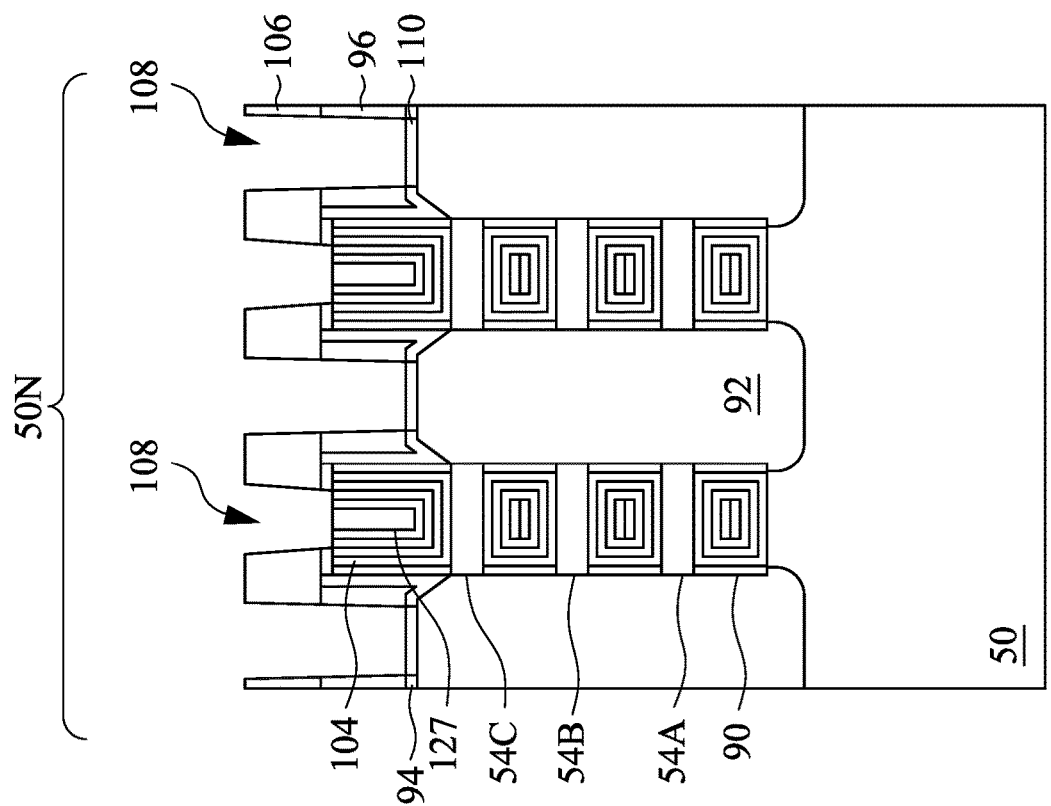
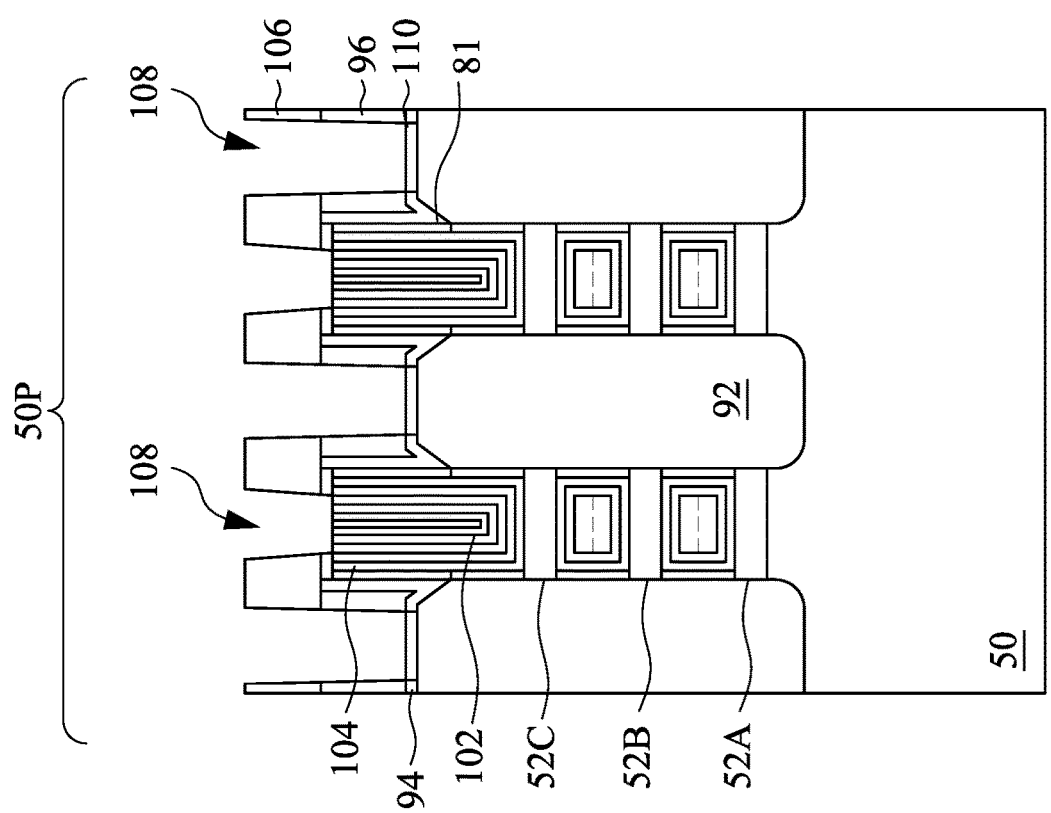
Fig. 24B

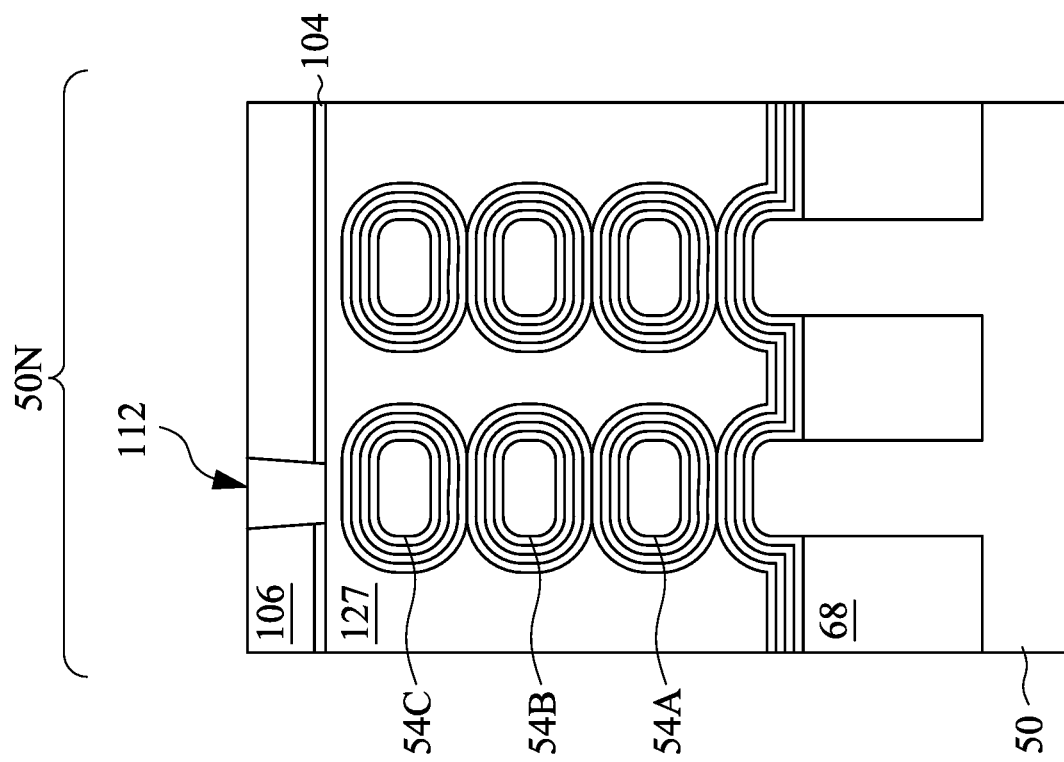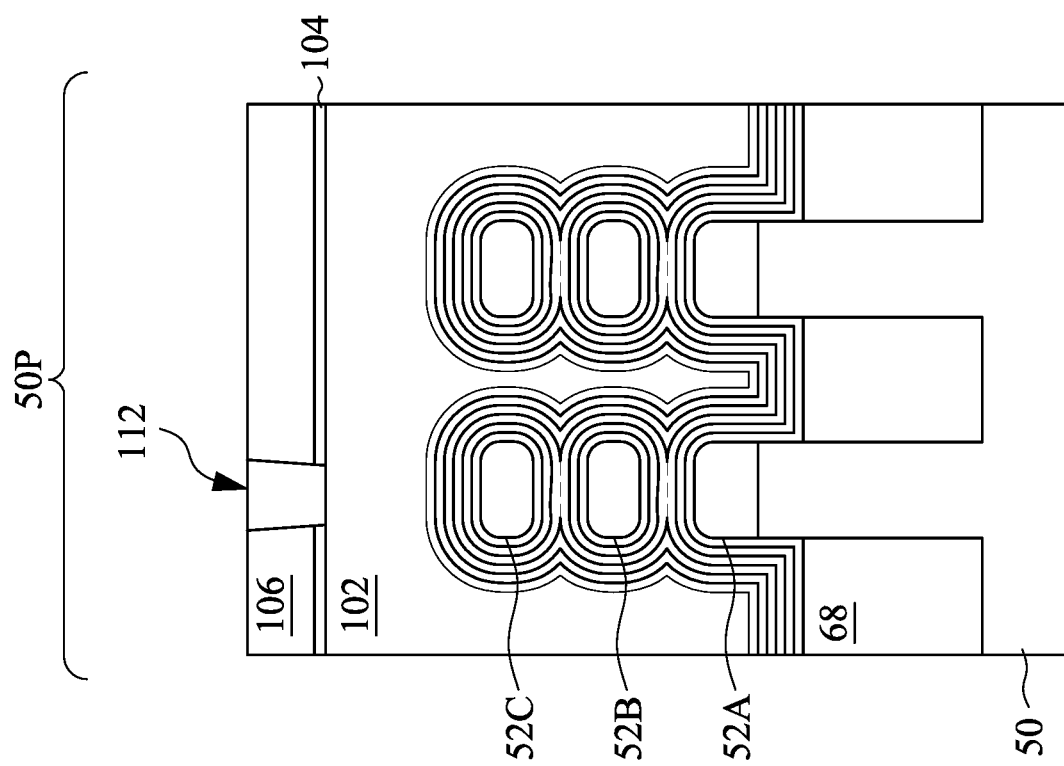
Fig. 25A

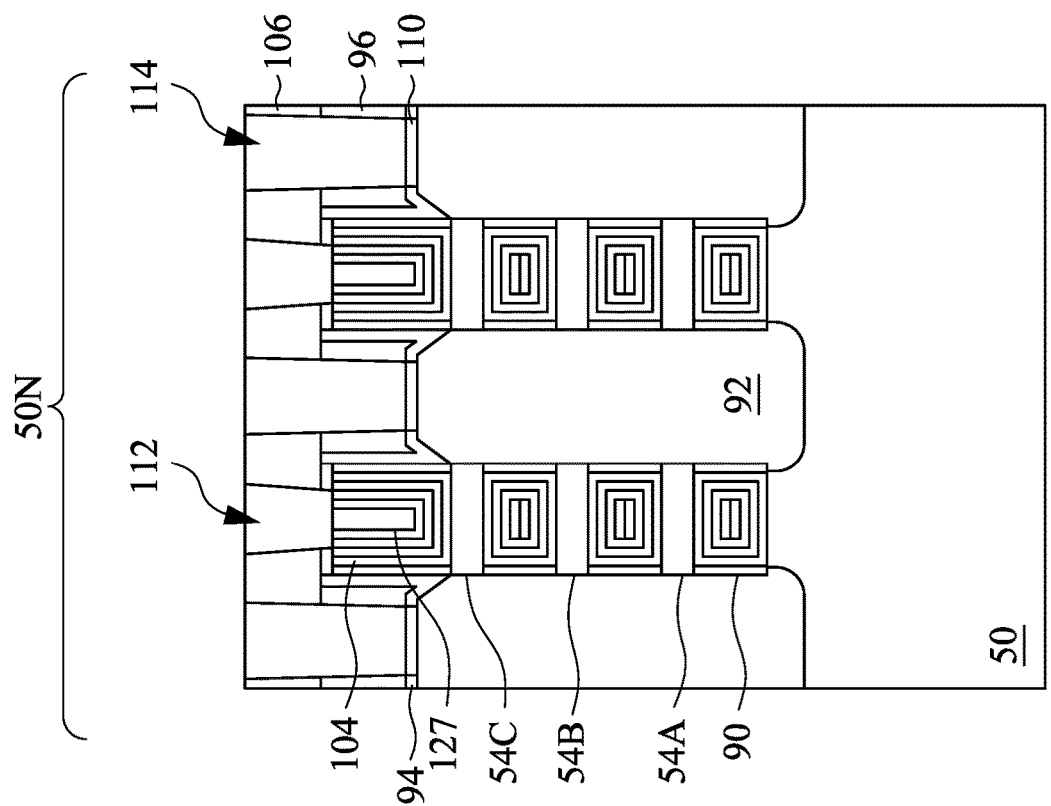
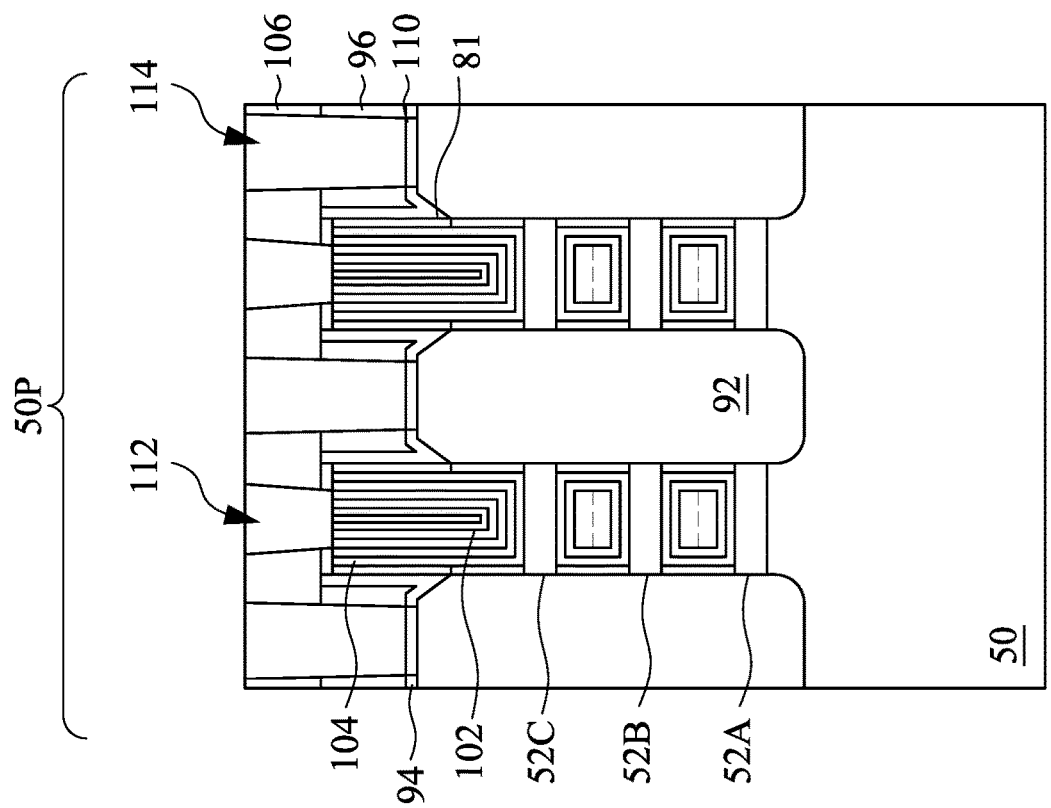
Fig. 25B

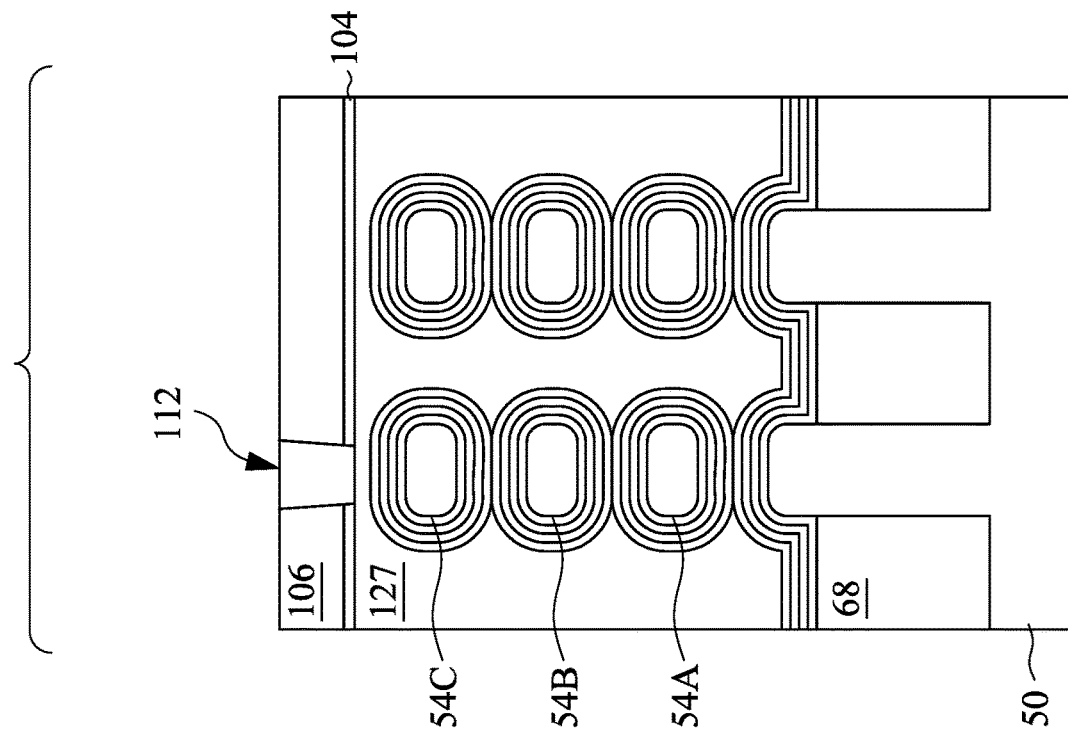
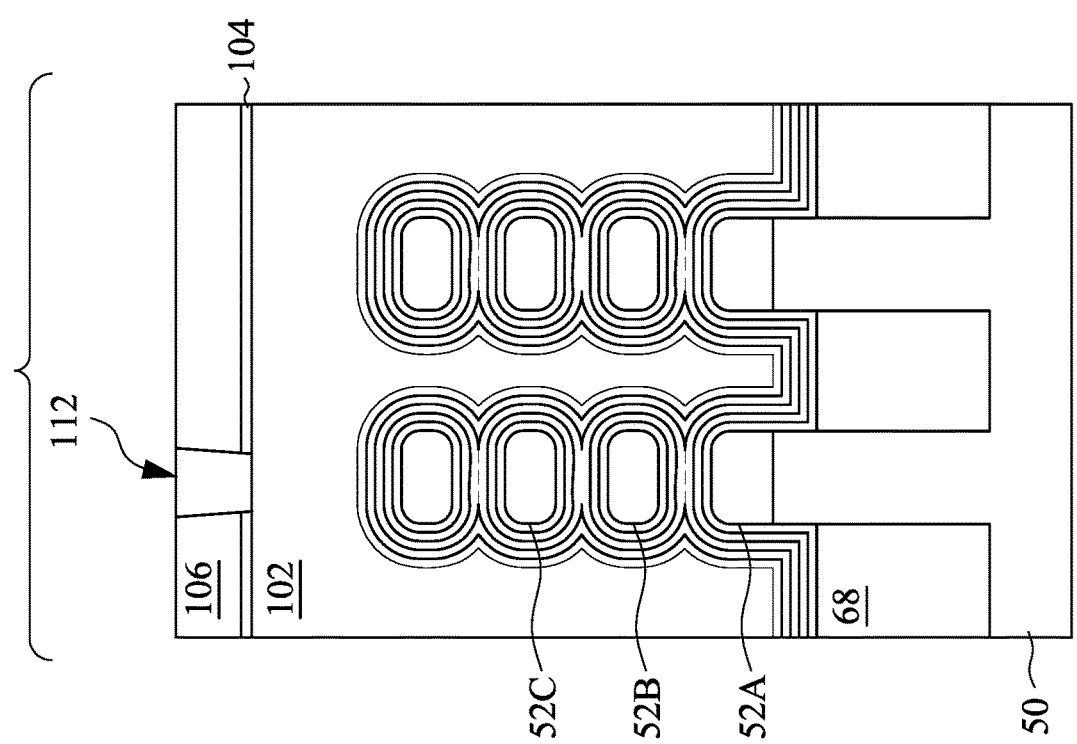
Fig. 26A

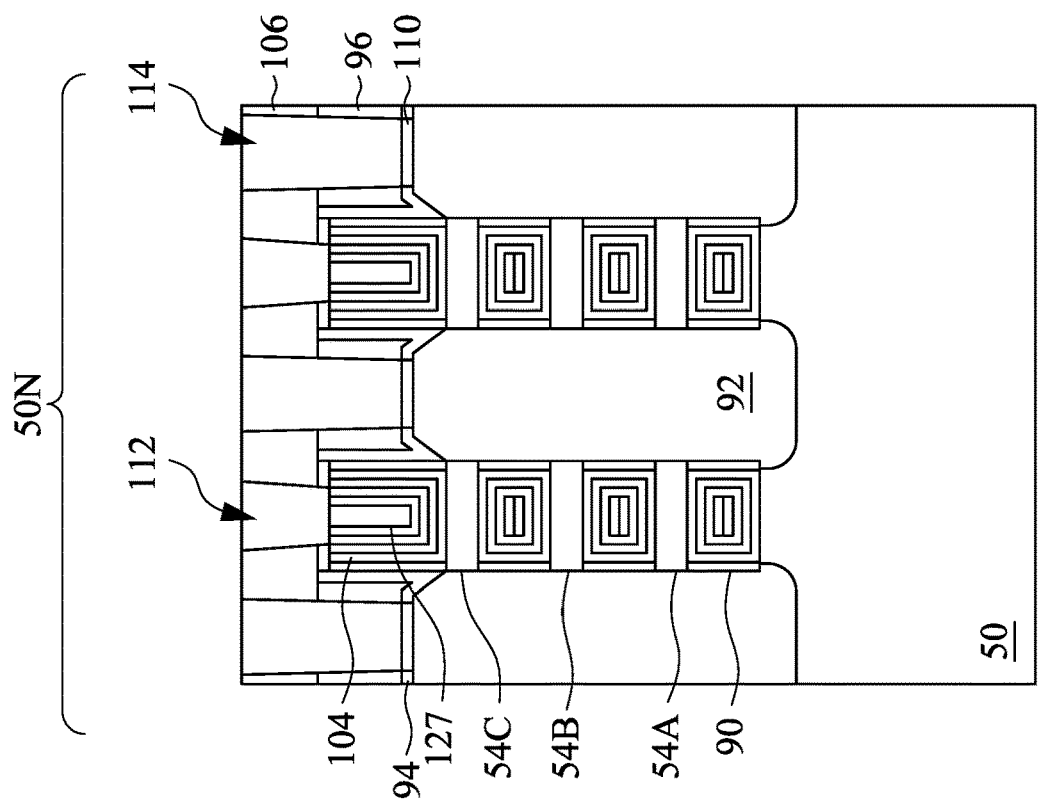
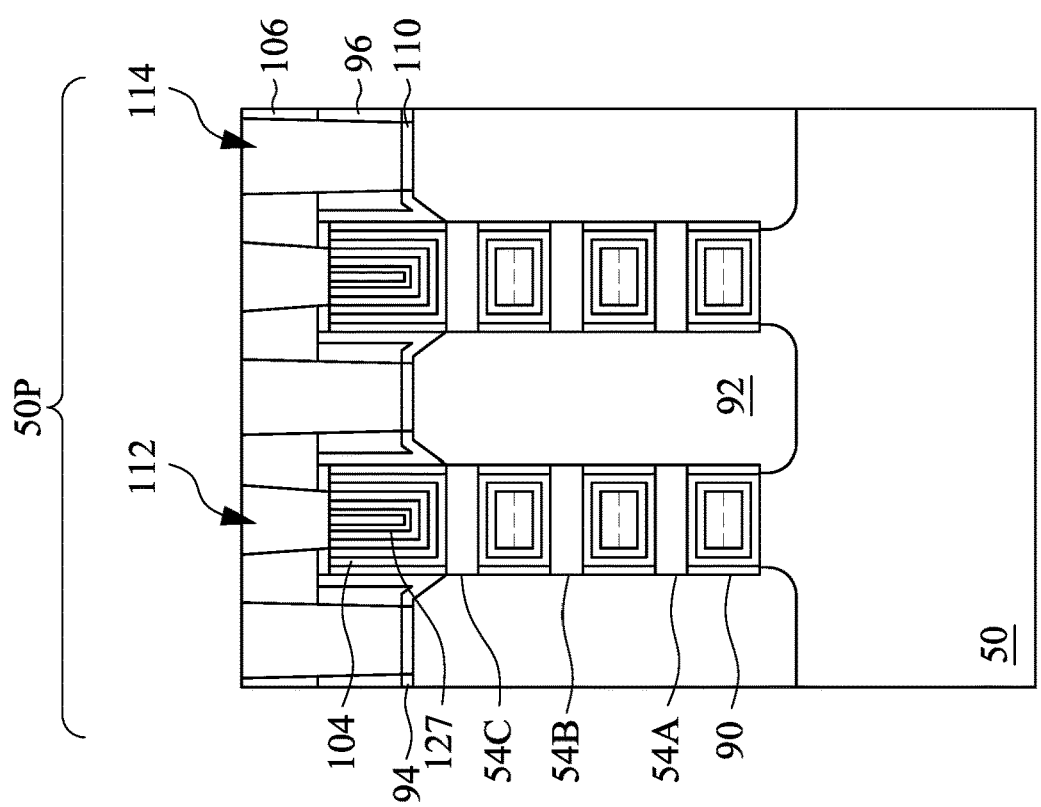
Fig. 26B

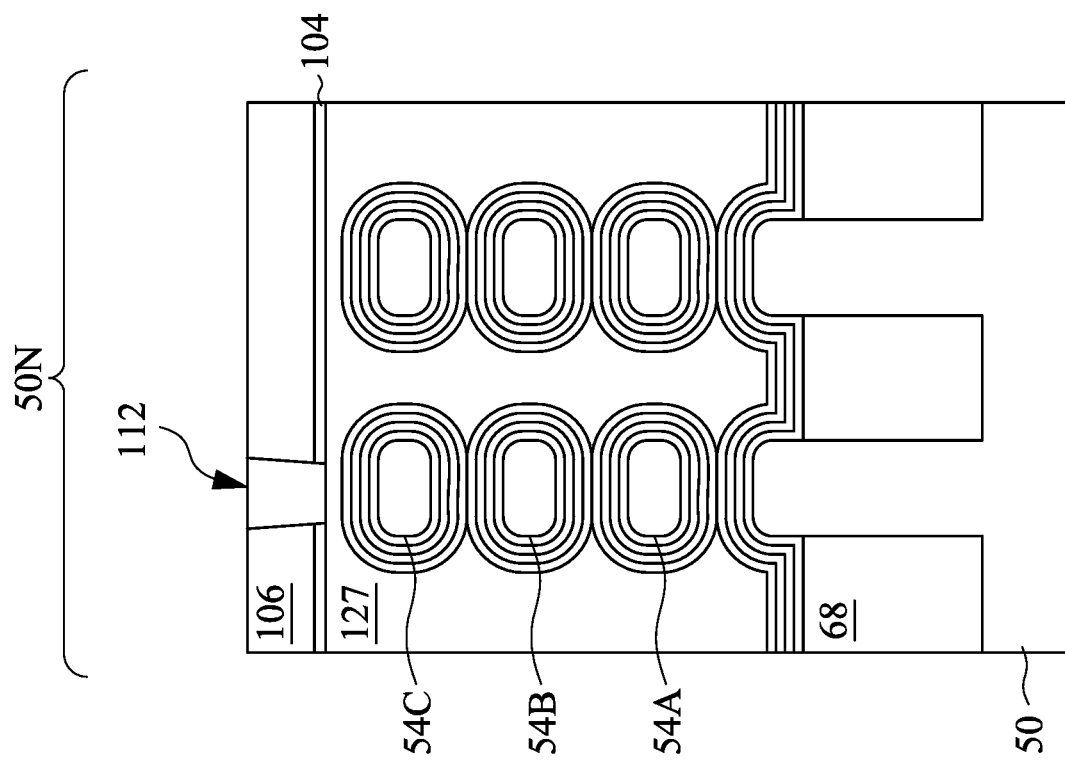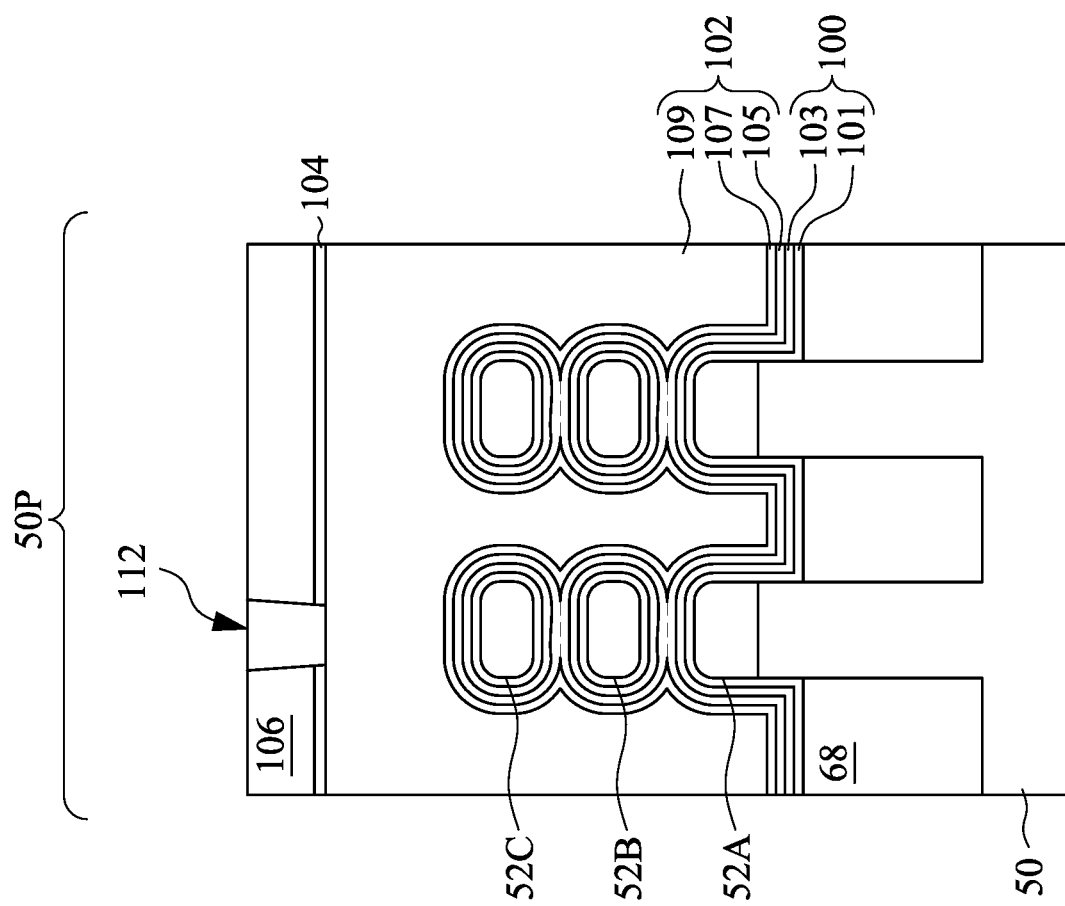
Fig. 27A

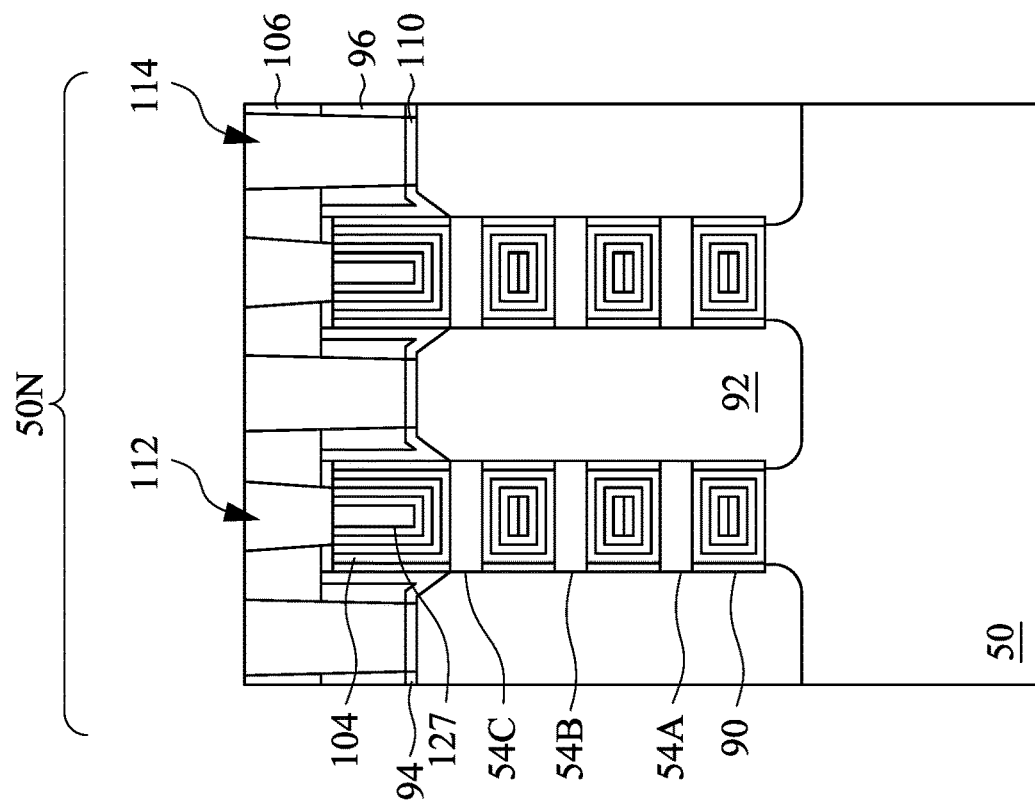
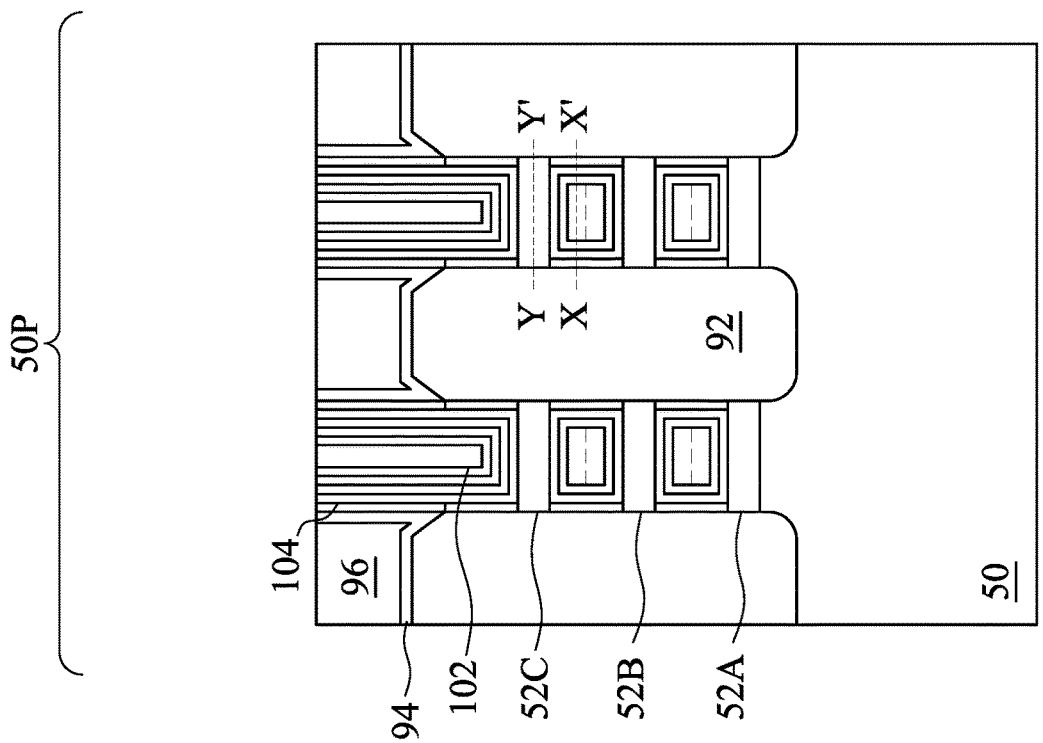
Fig. 27B

TRANSISTOR GATE STRUCTURE AND METHOD OF FORMING

PRIORITY CLAIM AND CROSS-REFERENCE

This application is a continuation of U.S. application Ser. No. 17/078,911, filed Oct. 23, 2020, which claims the benefit of U.S. Provisional Application No. 63/061,361, filed on Aug. 5, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B 8A, 8B, 9A, 9B, 10A, 10B, 11A, 11B, 11C, 12A, 12B, 12C, 12D, 13A, 13B, 13C, 14A, 14B, 15A, 15B, 16A, 16B, 17A, 17B, 18A, 18B, 19A, 19B, 20A, 20B, 21A, 21B, 21C, 21D, 21E, 22A, 22B, 23A, 23B, 23C, 24A, 24B, 24C, 25A, 25B, and 25C are cross-sectional views of intermediate stages in the manufacturing of nano-FETs, in accordance with some embodiments.

FIGS. 26A, 26B, and 26C are cross-sectional views of a nano-FET, in accordance with some embodiments.

FIGS. 27A, 27B, and 27C are cross-sectional views of a nano-FET, in accordance with some embodiments.

DETAILED DESCRIPTION

Figure 1:
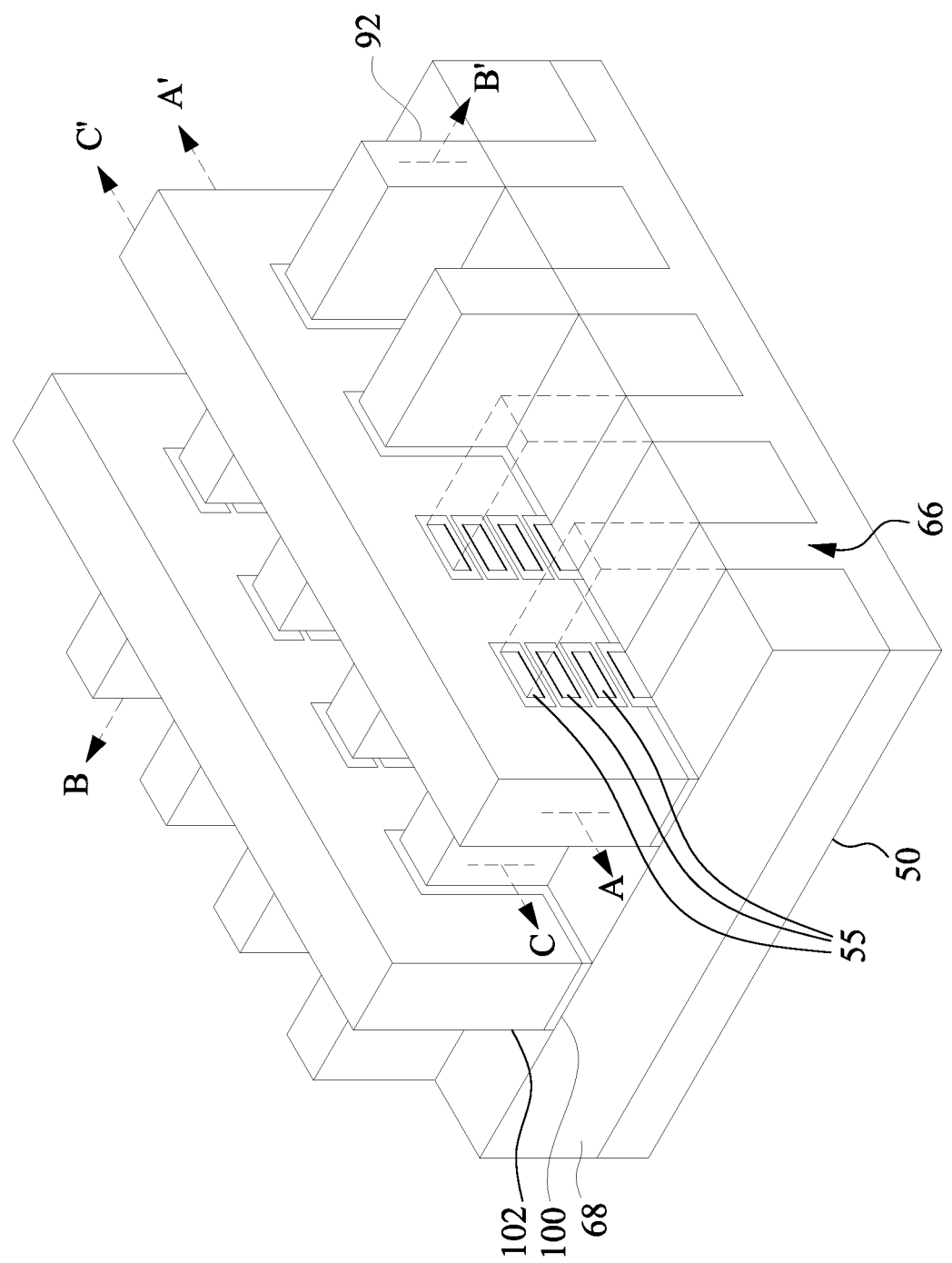
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In transistor gate stacks, a conductive material (e.g., tungsten) may be deposited as a fill metal with a chemical vapor deposition (CVD) process that uses a fluorine-comprising precursor. Depositing a fill metal in this manner may have advantages such as a relatively fast deposition process, which reduces manufacturing costs and increases yield. Various embodiments may further include a barrier layer between the fill metal and underlying work function metal (WFM) layers to prevent fluorine diffusion during deposition and/or the fill metal into the underlying WFM layers. For example, the barrier layer may comprise a tungsten layer that is deposited with fluorine free precursors. By preventing fluorine diffusion into the underlying layers, advantages maybe achieved. For example, by preventing fluorine diffusion into the underlying layers, uneven fluorine distribution in the WFM layers may be avoided in different areas of the gate stack, which results in improved threshold voltage (Vt) stability and control. Vt stability and control may be especially improved in nano-FETs, which are susceptible to uneven fluorine diffusion in regions of the WFM layers between nanosheets compared to other regions of the WFM layers.

FIG. 1 illustrates an example of nano-FETs (e.g., nanowire FETs, nanosheet FETs, or the like) in a three-dimensional view, in accordance with some embodiments. The nano-FETs comprise nano-structures 55 (e.g., nanosheets, nanowire, or the like) over fins 66 on a substrate 50 (e.g., a semiconductor substrate), wherein the nano-structures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectrics 100 are over top surfaces of the fins 66 and along top surfaces, sidewalls, and bottom surfaces of the nano-structures 55. Gate electrodes 102 are over the gate dielectrics 100. Epitaxial source/drain regions 92 are disposed on the fins 66 on opposing sides of the gate dielectric layers 96 and the gate electrodes 98.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 90 of a nano-FET. Cross-section B-B' is perpendicular to cross-section A-A' and is parallel to a longitudinal axis of a fin 66 of the nano-FET and in a direction of, for example, a current flow between the epitaxial source/drain regions 90 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 25C are cross-sectional views of intermediate stages in the manufacturing of nano-FETs, in accordance with some embodiments. FIGS. 2 through 5, 6A, 13A, 14A, 15A, 16A, 17A, 18A, 19A, 20A, 21A, 22A, 23A, 24A, 25A, 26A, and 27A illustrate reference cross-section A-A' illustrated in FIG. 1. FIGS. 6B, 7B, 8B, 9B, 10B, 11B, 11C, 12B, 12D, 13B, 14B, 15B, 16B, 17B, 18B, 19B, 20B, 21B, 22B, 23B, 24B, 25B, 26B, and 27B illustrate reference cross-section B-B' illustrated in FIG. 1. FIGS. 7A, 8A, 9A, 10A, 11A, 12A, 12C, 13C, 23C, 24C, 25C, 26C, and 27C illustrate reference cross-section C-C' illustrated in FIG. 1.

Figure 2:
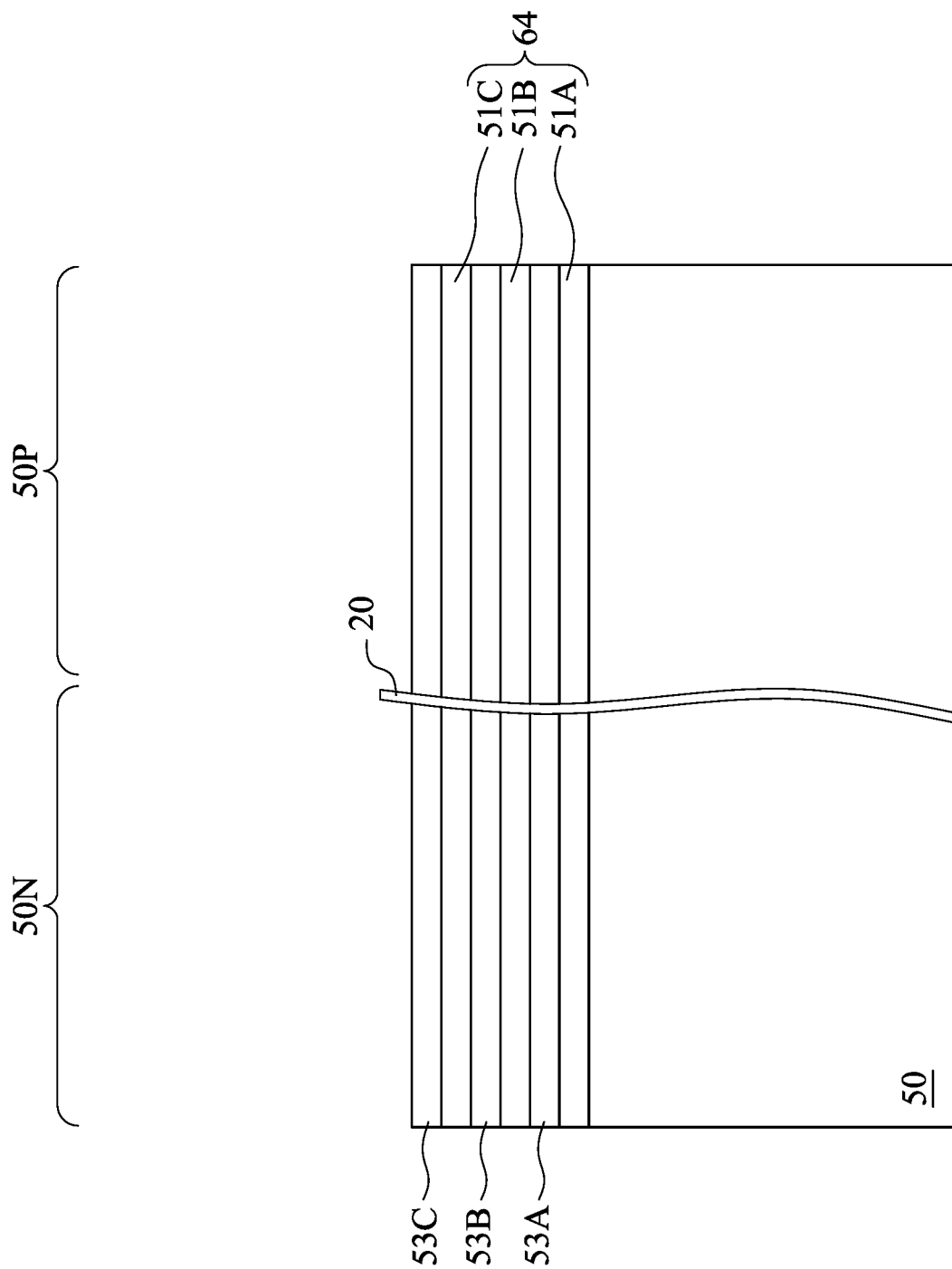

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided. In some embodiments, one or more wells and/or an anti-punch through (APT) layer may be formed in the substrate 50 through one or more suitable implantation steps.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type regions 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type regions 50P.

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of non-FETs in both the n-type region 50N and the p-type region 50P. In such embodiments, the channel regions in both the n-type region 50N and the p-type region 50P may have a same material composition (e.g., silicon, or the like) and be formed simultaneously. FIGS. 26A, 26B, and 27C illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type NSFETS. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type NSFETS. In other embodiments, the channel regions in the n-type region 50N and the p-type region 50P may be formed simultaneously and have a same material composition, such as silicon, silicon germanium, or the like. FIGS. 26A, 26B, and 27C illustrate a structure resulting from such embodiments where the channel regions in both the p-type region 50P and the n-type region 50N comprise silicon, for example.

Figure 3:
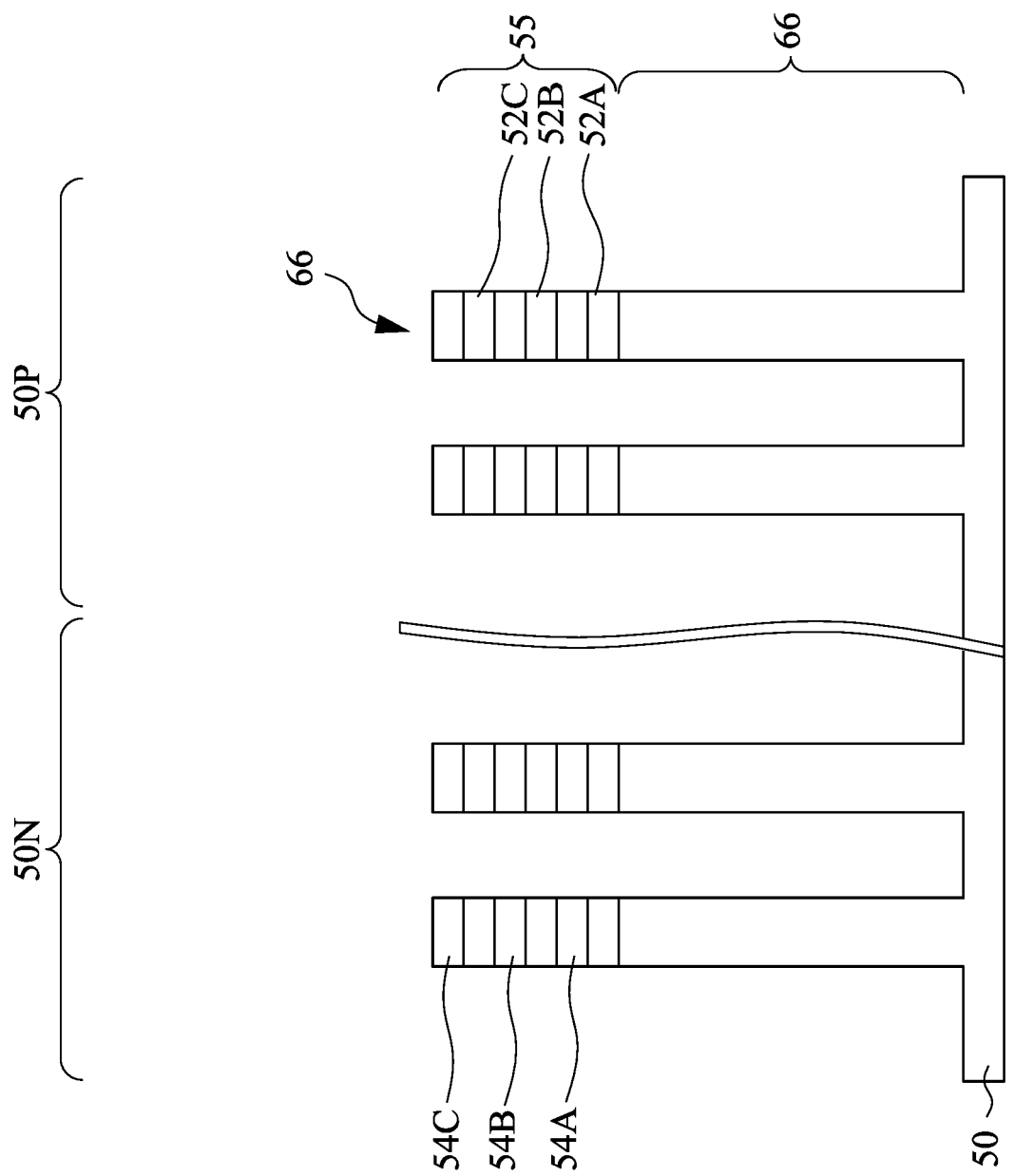

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
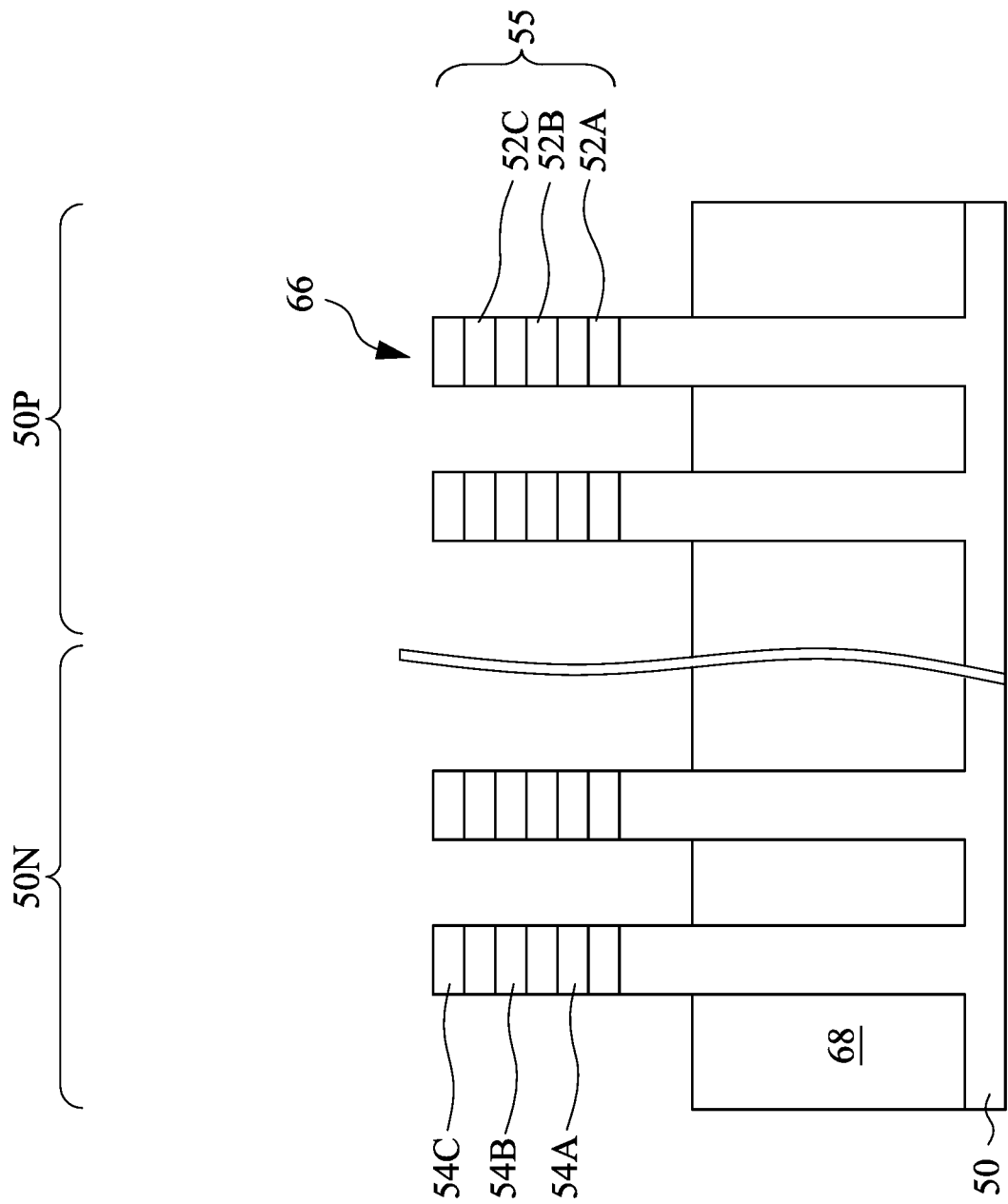

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the regions 50N and the region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting nanostructures 52) and the second semiconductor layers 53 (and resulting nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
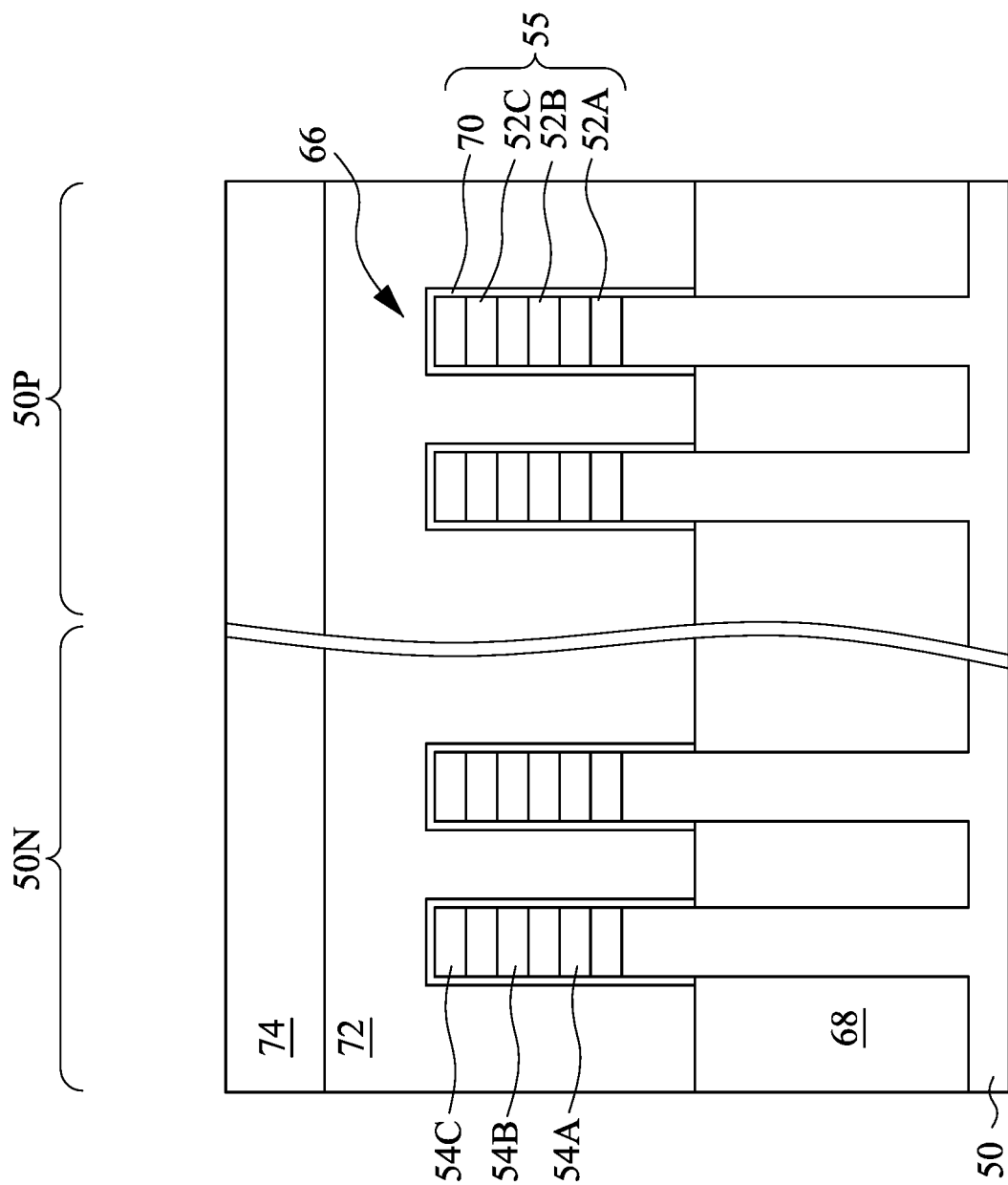

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
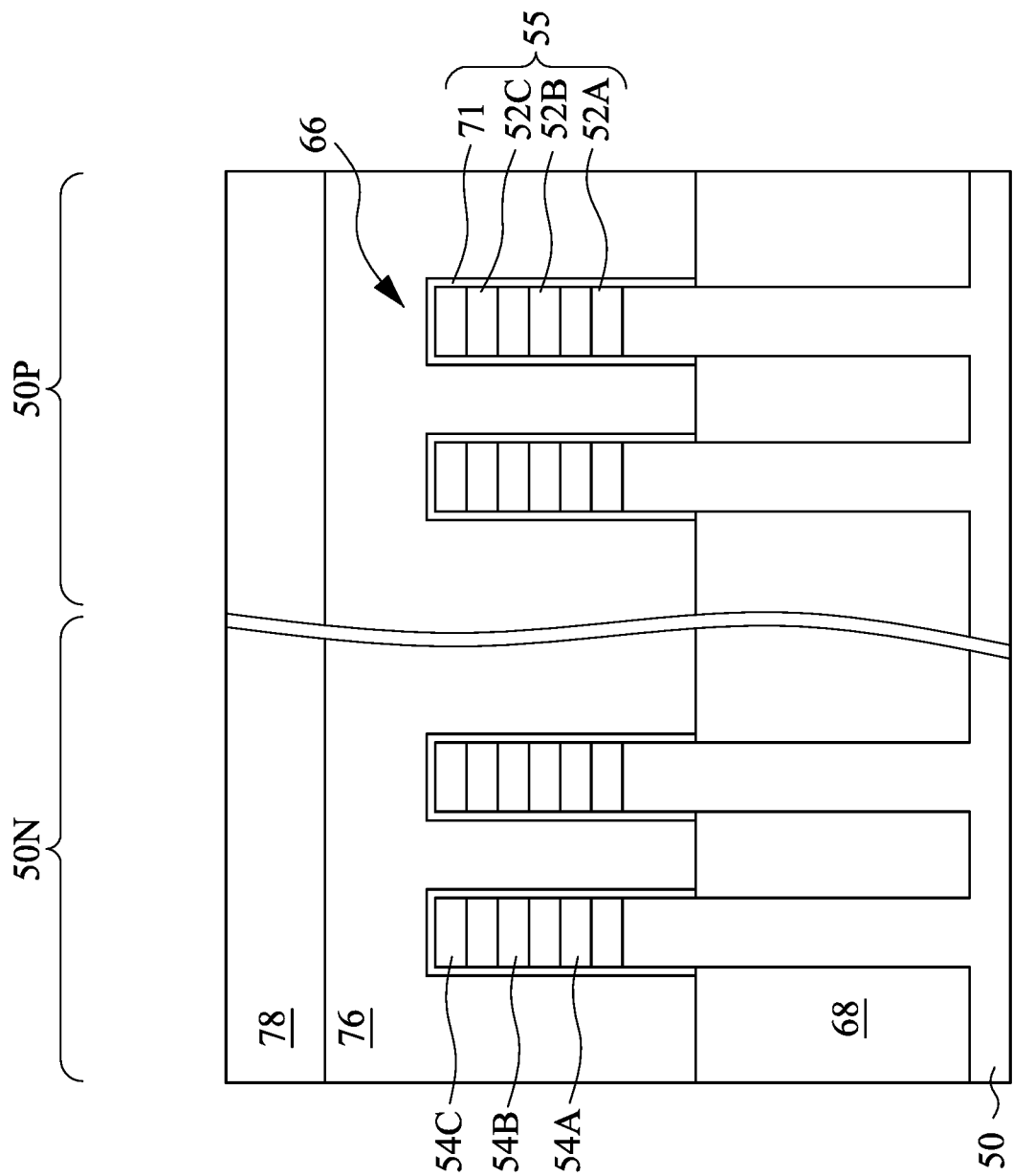

FIGS. 6A through 16B illustrate various additional steps in the manufacturing of embodiment devices. FIGS. 7A, 8A, 9A, 10A, 11A, 12A, 12C, 13A, 13C, 14A, and 15A illustrate features in either the regions 50N or the regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
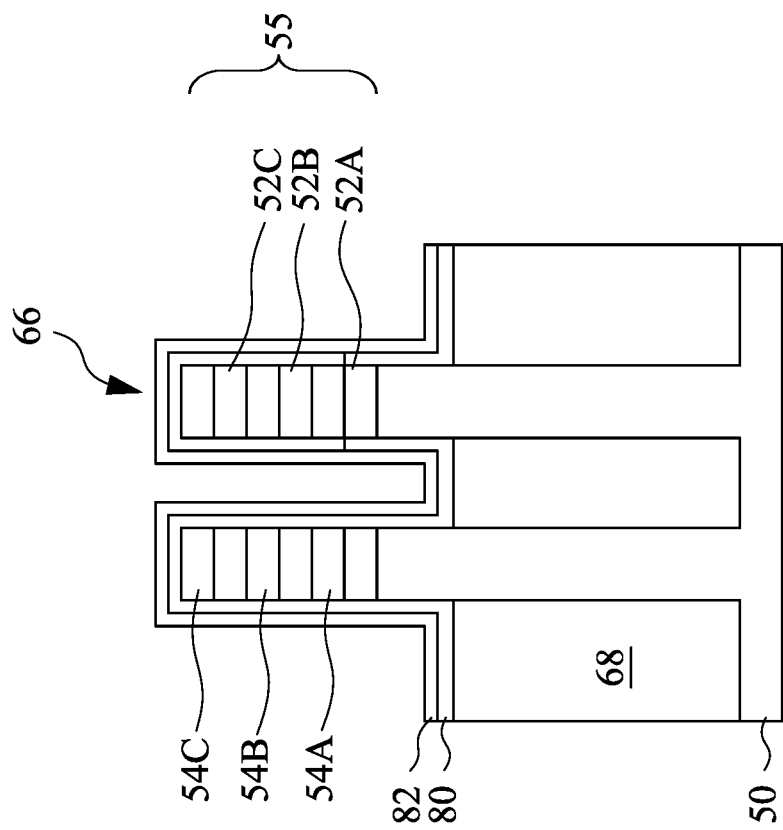

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8A:
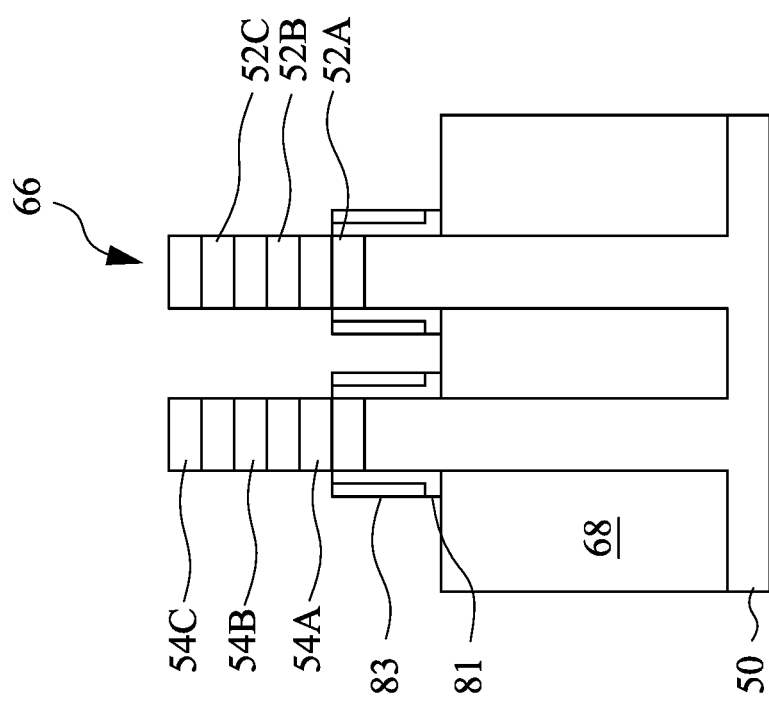

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy dielectric layers 60. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 58 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 56 formed of the second semiconductor materials (e.g., the second nanostructures 54) exposed by the first recesses 86 are etched to form sidewall recesses 88 in the p-type region 50N. Although sidewalls of the first nanostructures 52 and the second nanostructures 54 in recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52 in the n-type region 50N, and a dry etch process with hydrogen fluoride, another fluorine-based gas, or the like may be used to etch sidewalls of the second nanostructures 54 in the p-type region 50P.

Figure 11A:
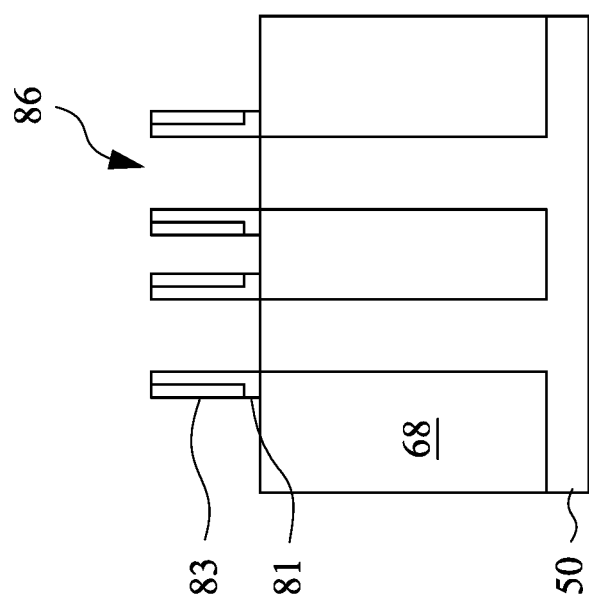
Figure 11C:
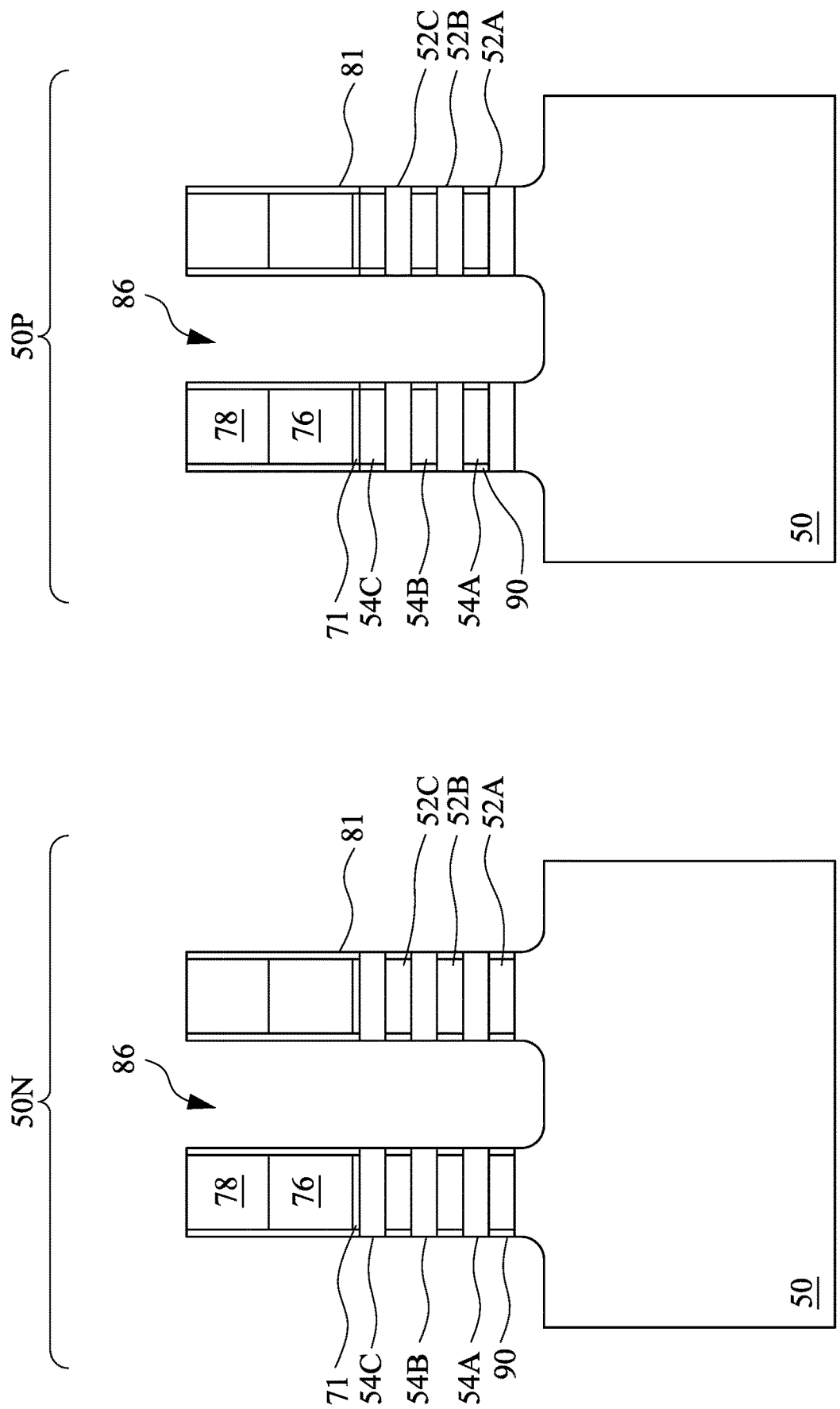

In FIGS. 11A-11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers are recessed from sidewalls of the second nanostructures 54 in the n-type region 50N. Also illustrated are embodiments in which sidewalls of the second nanostructures 54 are concave, outer sidewalls of the first inner spacers 90 are concave, and the first inner spacers are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A-12C) by subsequent etching processes, such as etching processes used to form gate structures.

Figure 12A:
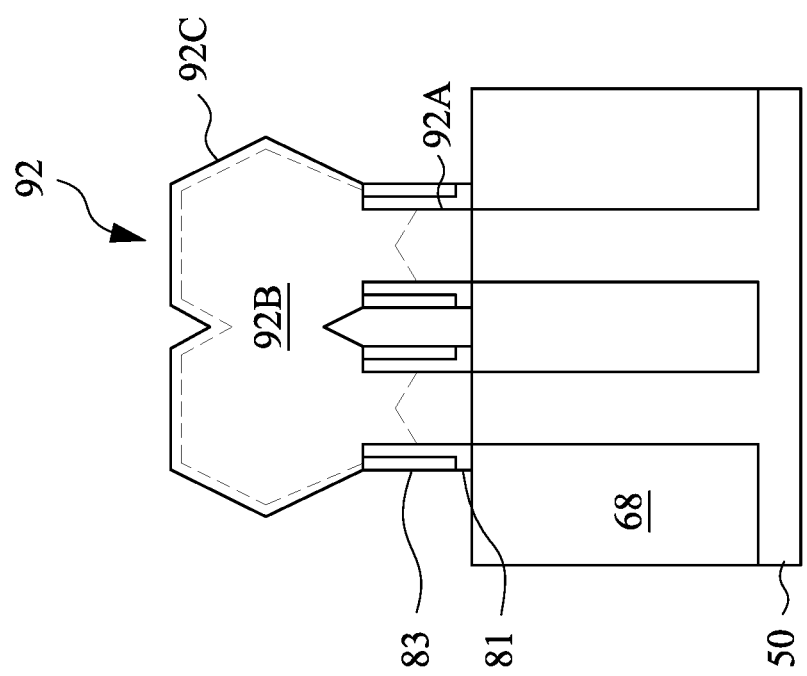
Figure 12B:
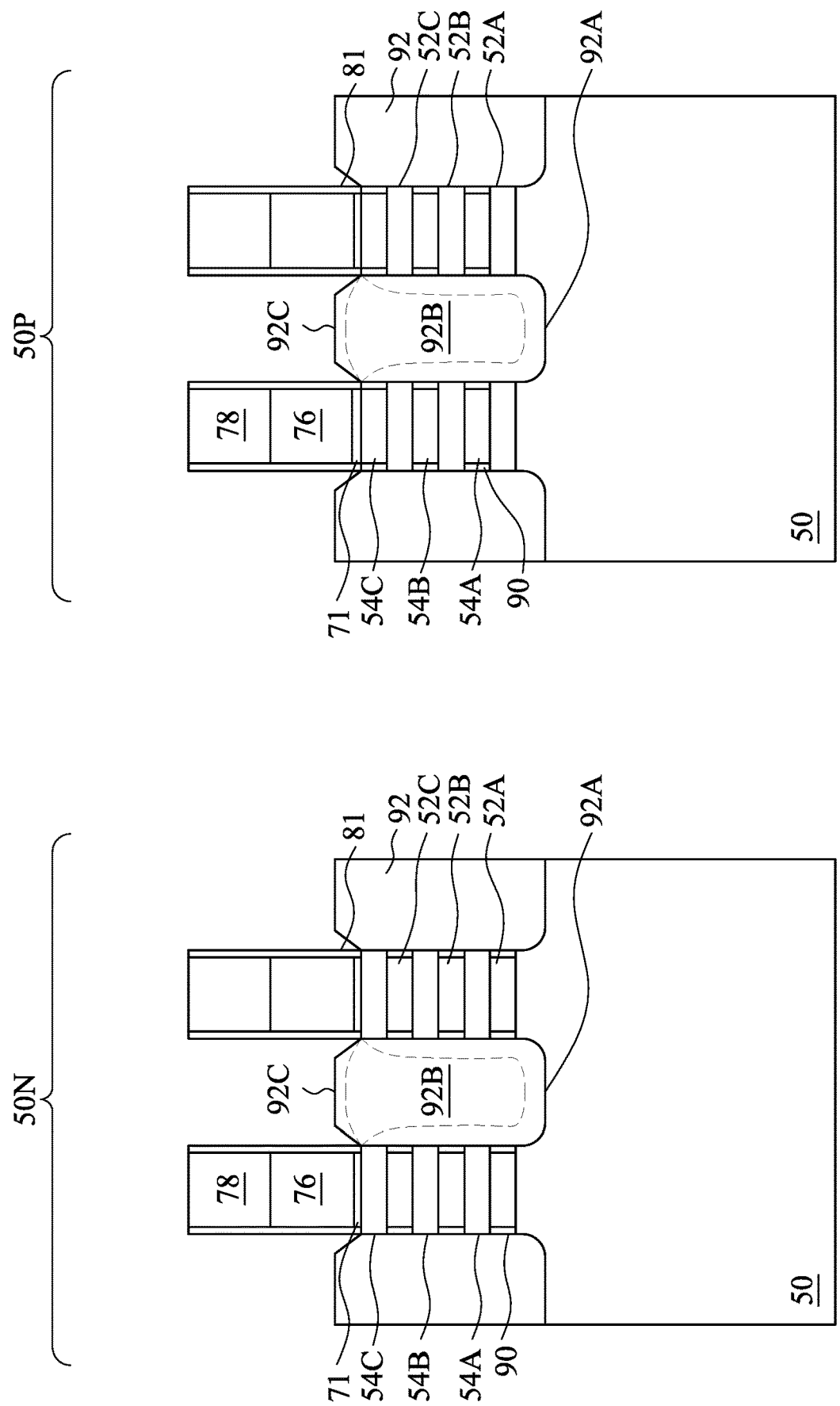

In FIGS. 12A-12C, epitaxial source/drain regions 92 are formed in the first recesses 86. In some embodiments, the source/drain regions 92 may exert stress on the second nanostructures 54 in the n-type region 50N and on the first nanostructures 52 in the p-type region 50P, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 72 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 56 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same NSFET to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12D:
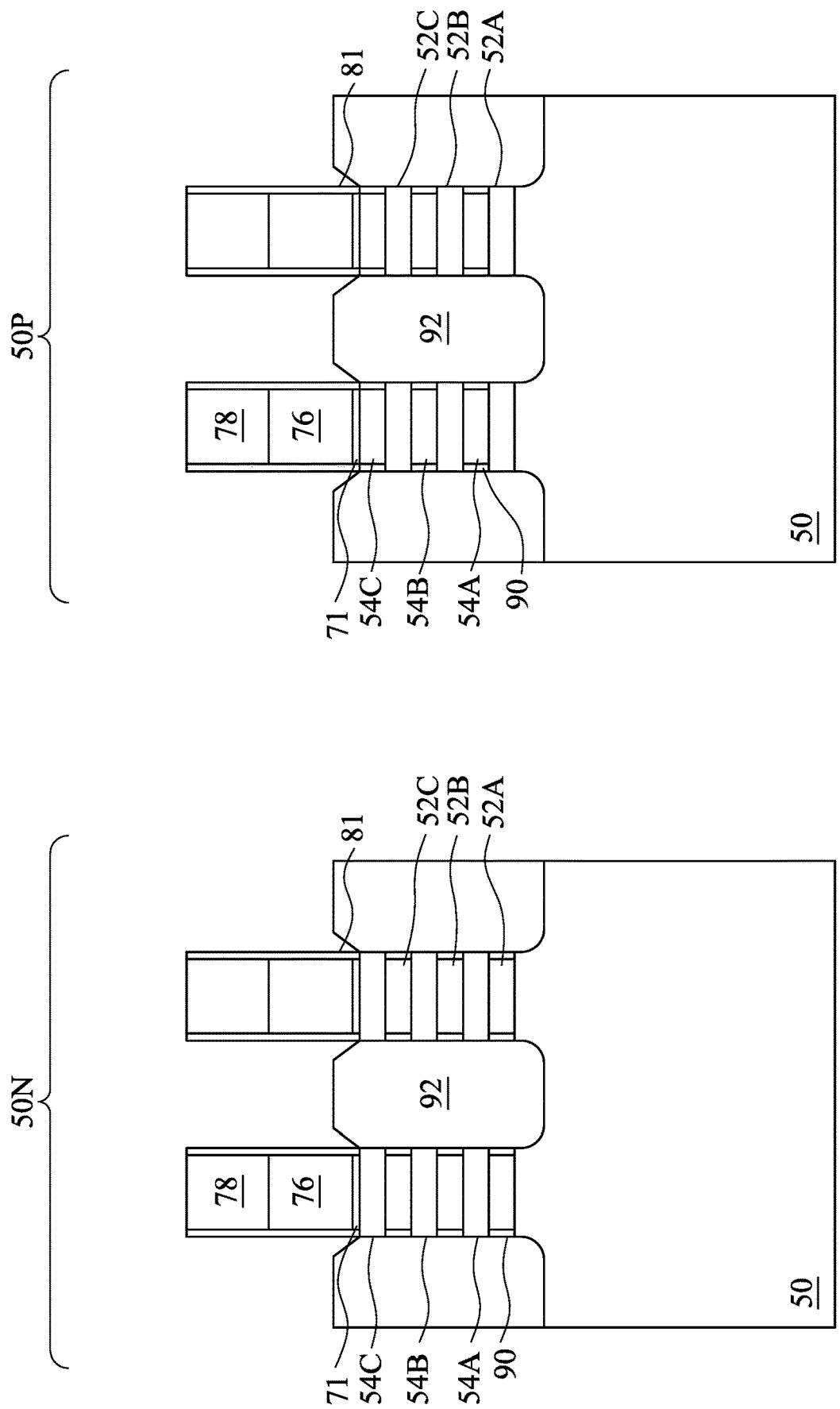

FIG. 12D illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 12D, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P. Further, in embodiments where the first inner spacers 90 are recessed from sidewalls of the second nanostructures 54 and/or the first nanostructures 52, the epitaxial source/drain regions 92 may be formed between the second nanostructures 54 and/or the first nanostructures 52, respectively.

Figure 13A:
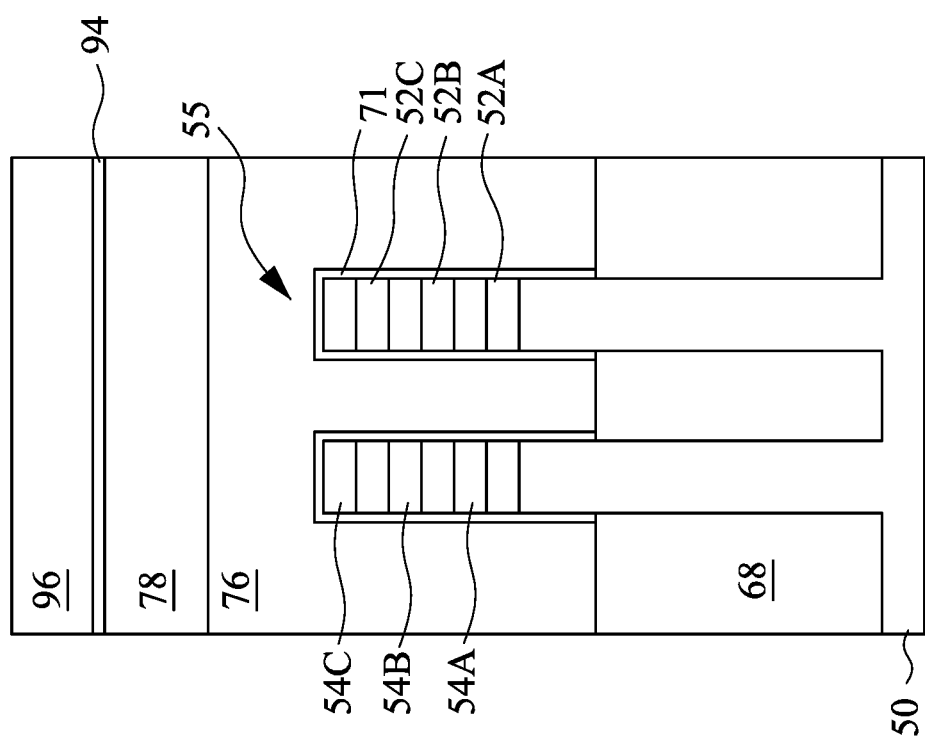
Figure 13C:
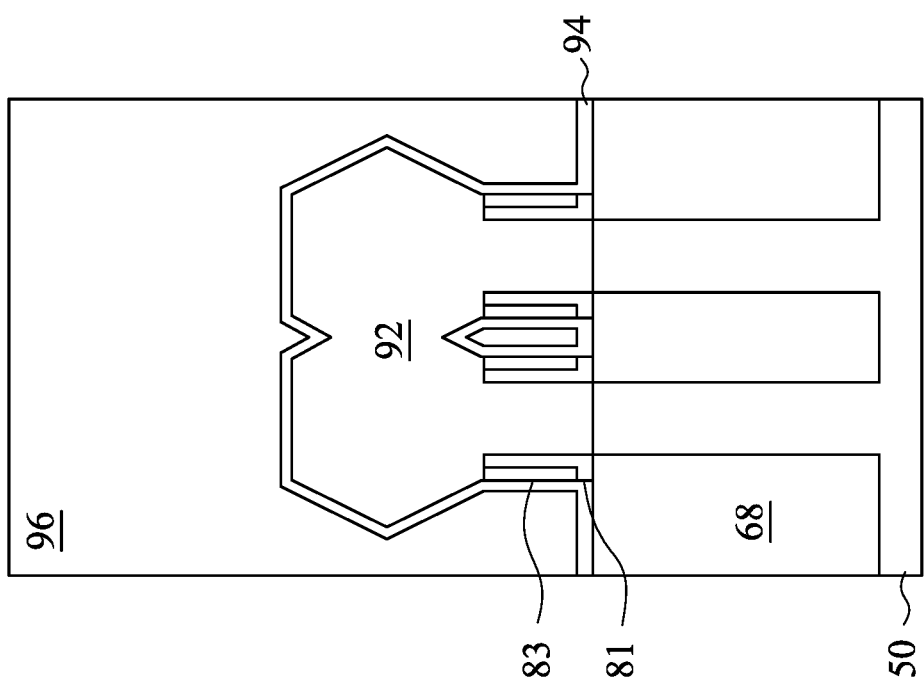

In FIGS. 13A-13C, a first interlayer dielectric (ILD) 96 is deposited over the structure illustrated in FIGS. 6A, 12B, and 12A (the processes of FIGS. 7A-12D do not alter the cross-section illustrated in FIG. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as, silicon nitride, silicon oxide, silicon oxynitride, or the like, having a different etch rate than the material of the overlying first ILD 96.

Figure 14A:
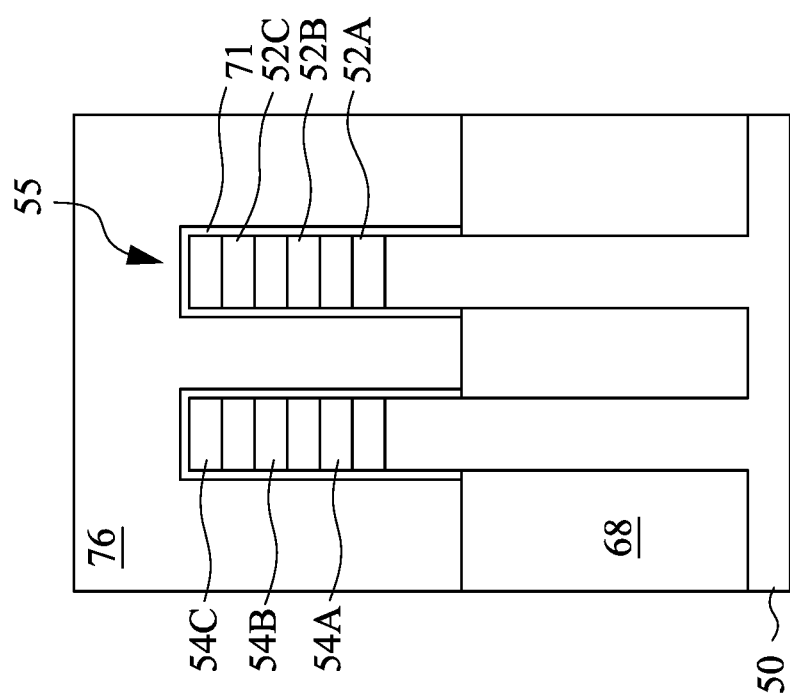
Figure 14B:
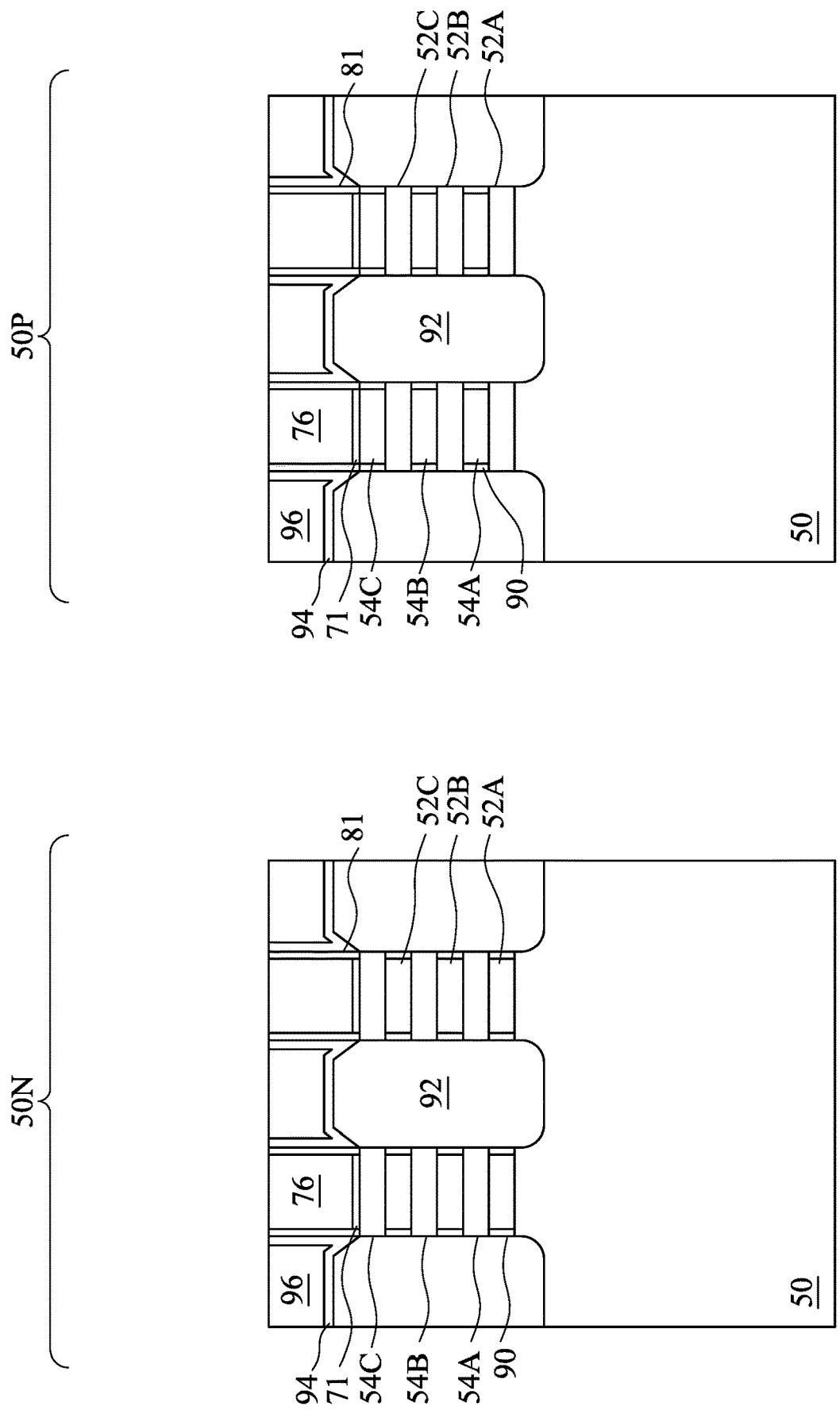

In FIGS. 14A-14C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 72 are exposed through the first ILD 96. In some embodiments, the masks 78 may remain, in which case the planarization process levels the top surface of the first ILD 96 with top surface of the masks 78 and the first spacers 81.

Figure 15A:
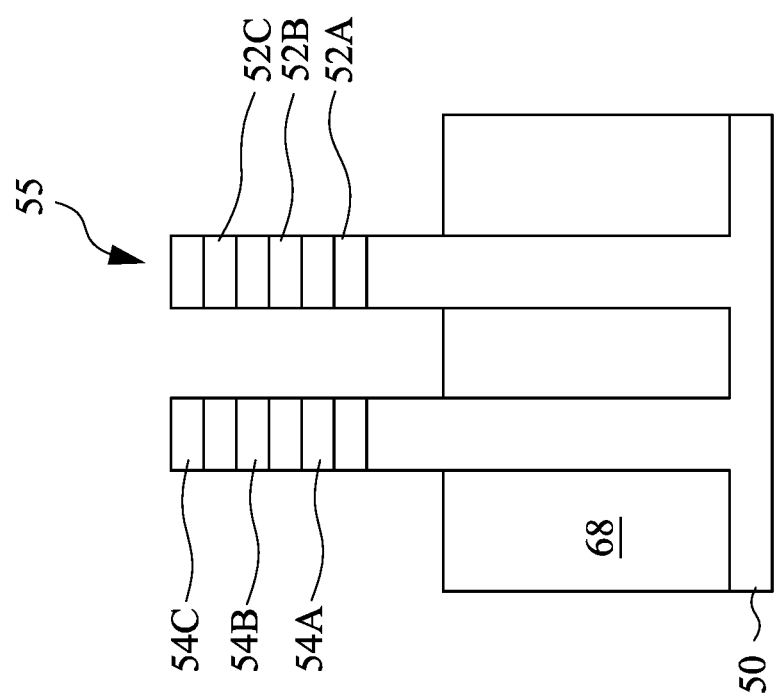

In FIGS. 15A and 15B, the dummy gates 72, and the masks 74 if present, are removed in one or more etching steps, so that second recesses 98 are formed. Portions of the dummy gate dielectrics 60 in the second recesses 98 are also be removed. In some embodiments, the dummy gates 72 and the dummy gate dielectrics 60 are removed by an anisotropic dry etch process. For example, the etching process may include a dry etch process using reaction gas(es) that selectively etch the dummy gates 72 at a faster rate than the first ILD 96 or the first spacers 81. Each second recess 98 exposes and/or overlies portions of nanostructures 55, which act as channel regions in subsequently completed nanoFETs. Portions of the nanostructures 55 which act as the channel regions are disposed between neighboring pairs of the epitaxial source/drain regions 92. During the removal, the dummy dielectric layers 60 may be used as etch stop layers when the dummy gates 72 are etched. The dummy dielectric layers 60 may then be removed after the removal of the dummy gates 72.

Figure 16A:
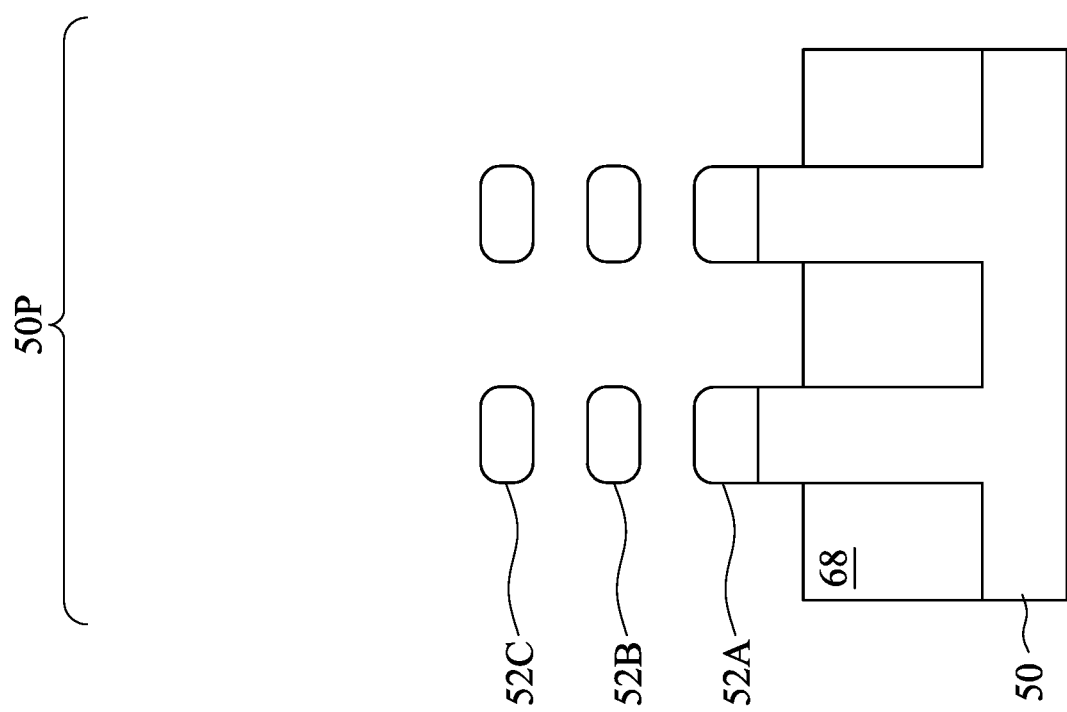
Figure 16B:
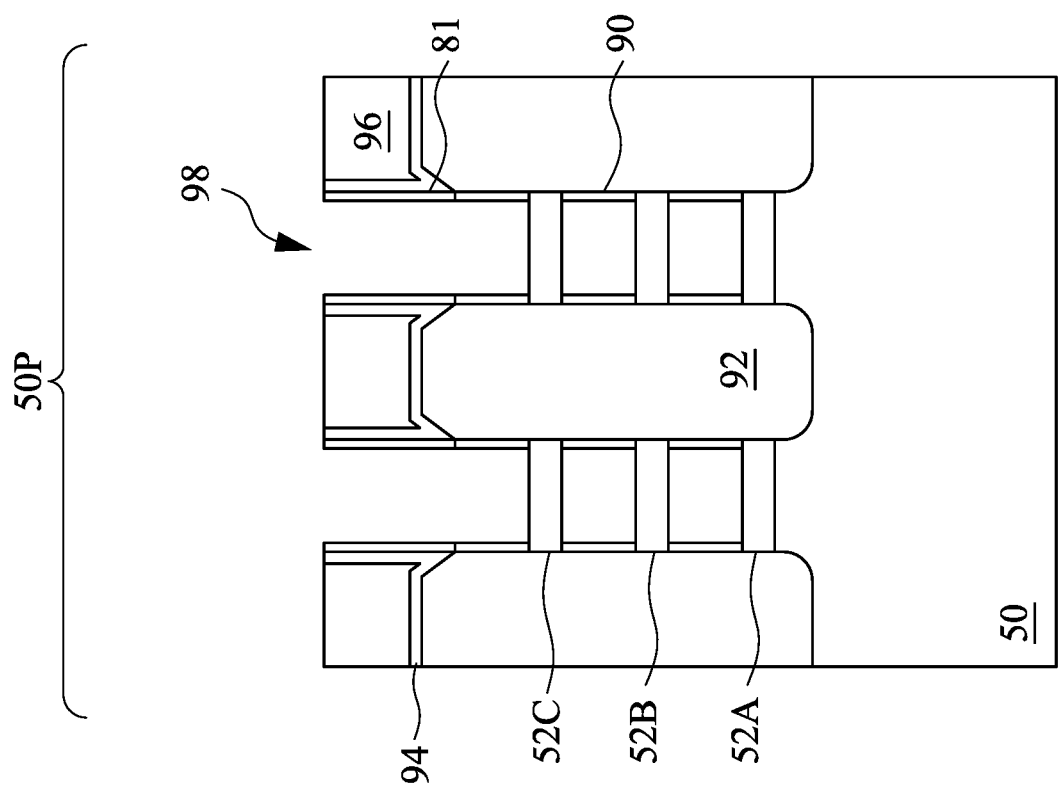

In FIGS. 16A and 16B, the second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 58 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based gas, or the like may be used to remove the second nanostructures 54 in the p-type region 50P.

In other embodiments, the channel regions in the n-type region 50N and the p-type region 50P may be formed simultaneously, for example by removing the first nanostructures 52 in both the n-type region 50N and the p-type region 50P or by removing the second nanostructures 54 in both the n-type region 50N and the p-type region 50P. In such embodiments, channel regions of n-type NSFETs and p-type NSFETS may have a same material composition, such as silicon, silicon germanium, or the like. FIGS. 26A and 26B illustrate a structure resulting from such embodiments where the channel regions in both the p-type region 50P and the n-type region 50N are provided by the second nanostructures 54 and comprise silicon, for example.

In FIGS. 17A through 22B gate dielectric layers and gate electrodes are formed for replacement gates in the second recesses 98 according to some embodiments. The gate electrodes include a barrier layer between the WFM layer(s) and a gate fill metal to prevent (or at least reduce) fluorine diffusion from the fill metal into the underlying WFM layers. As a result, uneven diffusion of fluorine in the WFM layer(s) can be avoided, and threshold voltage stability and control in the gates may be improved.

The formation of the gate dielectrics in the n-type region 50N and the p-type region 50P may occur simultaneously such that the gate dielectrics in each region are formed from the same materials, and the formation of the gate electrodes may occur simultaneously such that the gate electrodes in each region are formed from the same materials. In some embodiments, the gate dielectrics in each region may be formed by distinct processes, such that the gate dielectrics may be different materials and/or have a different number of layers, and/or the gate electrodes in each region may be formed by distinct processes, such that the gate electrodes may be different materials and/or have a different number of layers. Various masking steps may be used to mask and expose appropriate regions when using distinct processes. In the following description, the gate electrodes of the n-type region 50N and the gate electrodes of the p-type region 50P are formed separately.

FIGS. 17A through 21B illustrate forming the gate dielectrics 100 and the gate electrodes 102 in the p-type region 50P, and the n-type region 50N may be masked at least while forming the gate electrodes 102 in the p-type region 50P (e.g., as described below in FIGS. 18A through 21B).

Figure 17A:
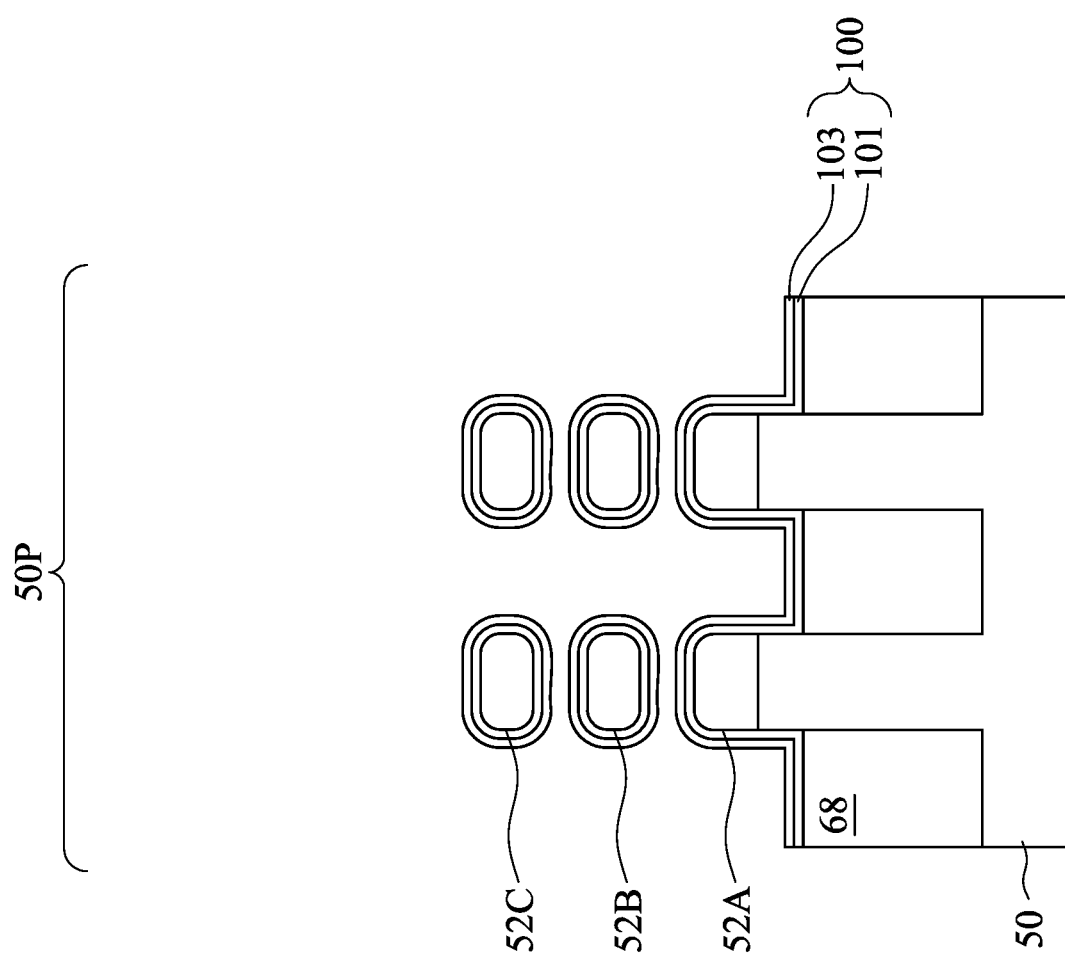
Figure 17B:
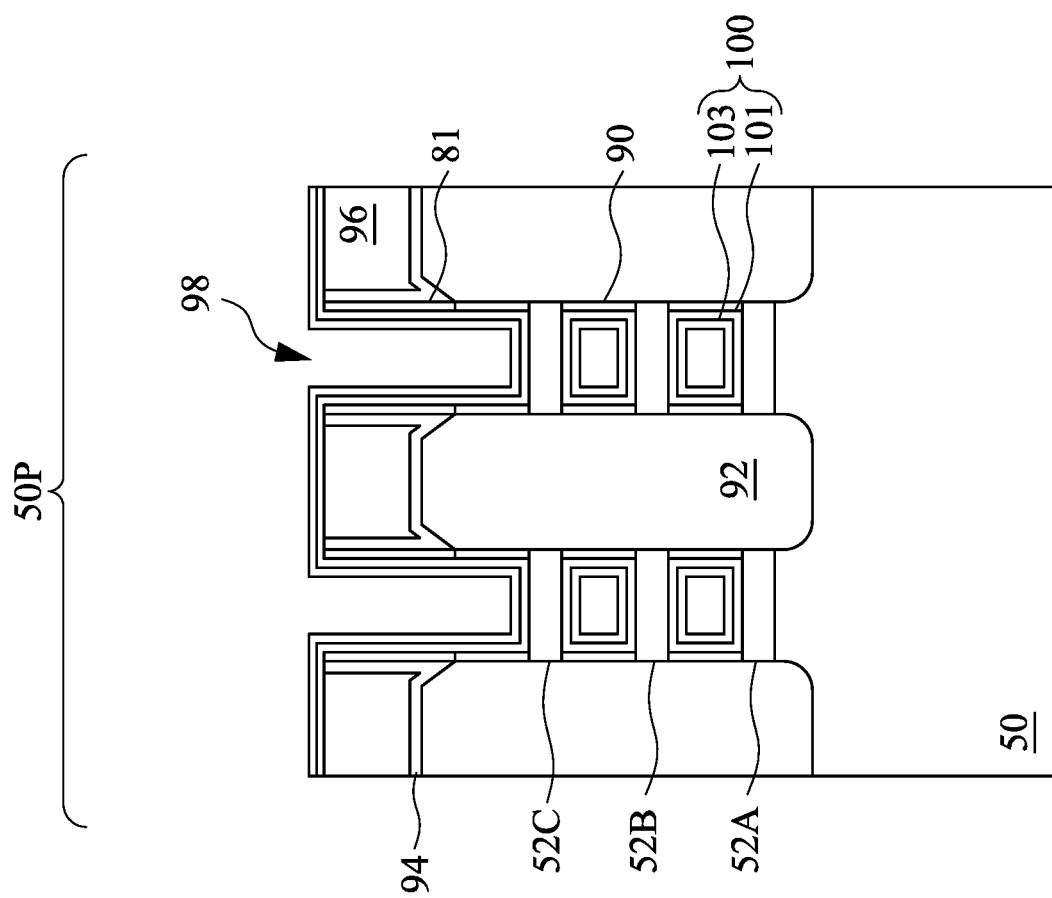

In FIGS. 17A and 17B, gate dielectrics 100 are deposited conformally in the second recesses 98 in the p-type region 50P. The gate dielectrics 100 comprise one or more dielectric layers, such as an oxide, a metal oxide, the like, or combinations thereof. For example, in some embodiments, the gate dielectrics 100 may comprise a first gate dielectric 101 (e.g., comprising silicon oxide, or the like) and a second gate dielectric 103 (e.g., comprising a metal oxide, or the like) over the first gate dielectric 101. In some embodiments, the second gate dielectric 103 includes a high-k dielectric material, and in these embodiments, the second gate dielectric 103 may have a k value greater than about 7.0, and may include a metal oxide or a silicate of hafnium, aluminum, zirconium, lanthanum, manganese, barium, titanium, lead, and combinations thereof. The first gate dielectric 101 may be referred to as an interfacial layer, and the second gate dielectric 103 may be referred to as a high-k gate dielectric in some embodiments.

The structure of the gate dielectrics 100 may be the same or different in the n-type region 50N and the p-type region 50P. For example, the n-type region 50N may be masked or exposed while forming the gate dielectrics 100 in the p-type region 50P. In embodiments where the n-type region 50N is exposed, the gate dielectrics 100 may be simultaneously formed in the n-type regions 50N. The formation methods of the gate dielectrics 100 may include molecular-beam deposition (MBD), ALD, PECVD, and the like.

Figure 18A:
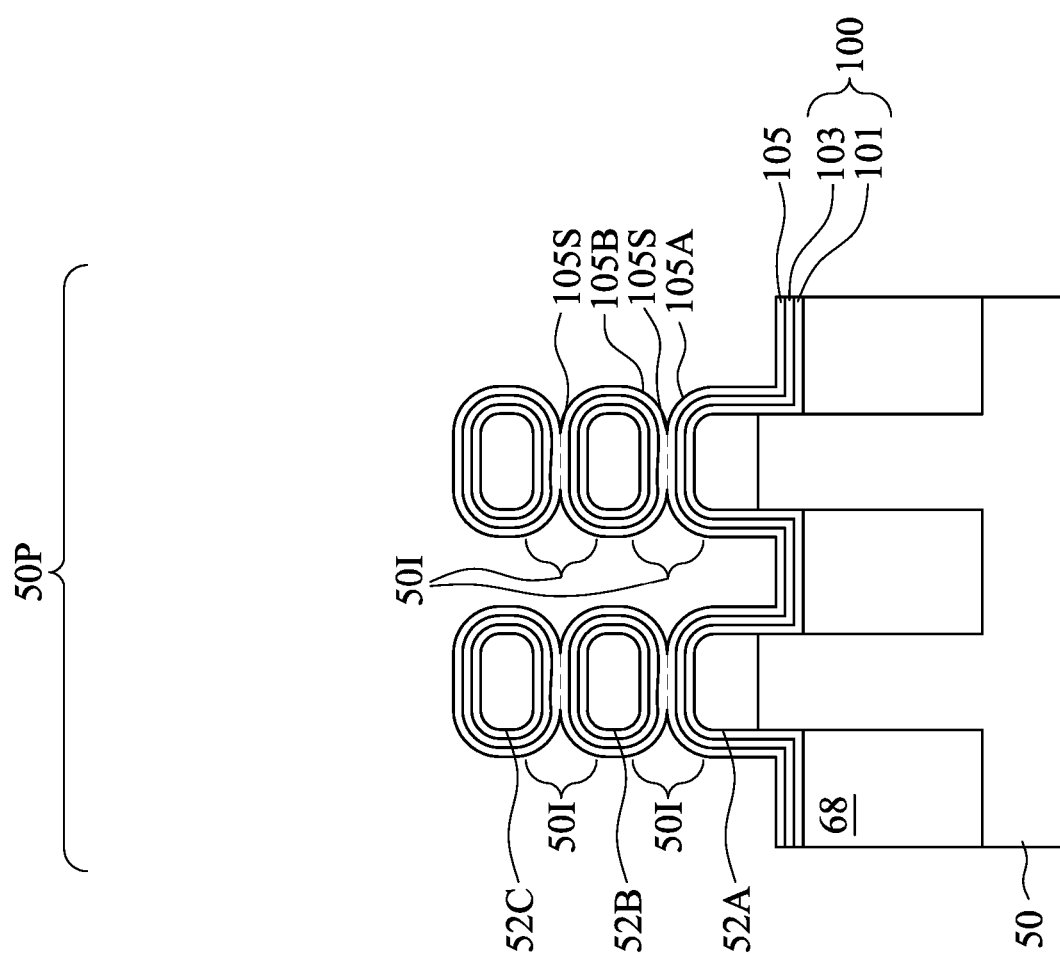
Figure 18B:
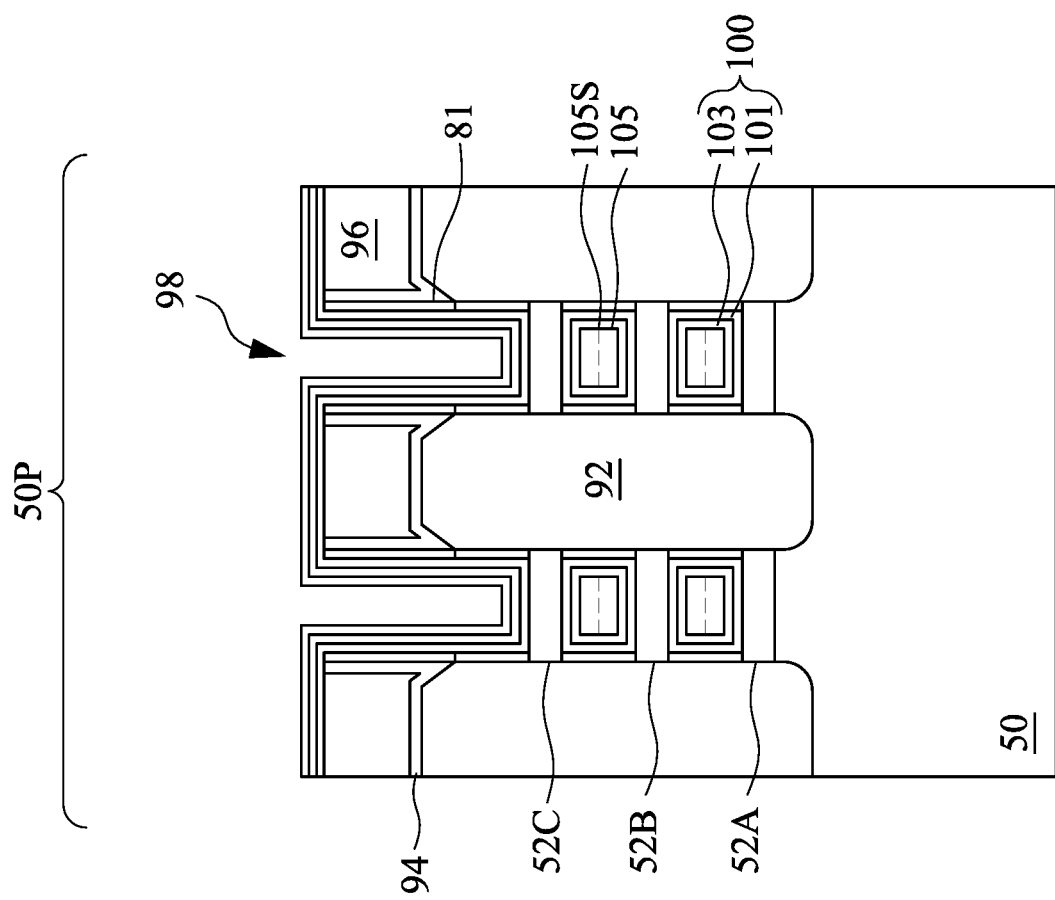

In FIGS. 18A and 18B, a conductive material 105 is deposited conformally on gate dielectrics 100 in the p-type region 50P. In some embodiments, the conductive material 105 is a p-type WFM, comprising titanium nitride, tantalum nitride, tungsten nitride, molybdenum nitride, combinations thereof, or the like. In some embodiments, the conductive material 105 has a multilayer structure and include more than one conductive material. For example, the conductive material 105 may comprise a layer of titanium nitride and a layer of a tantalum nitride on the layer of titanium nitride. The conductive material 105 may be deposited by CVD, ALD, PECVD, PVD, or the like. In some embodiments, the conductive material 105 may be deposited on exposed surfaces of the gate dielectrics 100 to a sufficient thickness such that the conductive material 105 merges in regions 501 between adjacent first nanostructures 52 (e.g., the first nanostructures 52A, 52B, and 52C). For example, the conductive material 105 may be deposited on surfaces of the first nanostructures 52 in the regions 501, and as the conductive material 105 increases in thickness during the deposition, separated portions of the conductive material 105 may touch and merge along seams 105S. Specifically, deposition of the conductive material 105 may continue until a first portion 105A of the conductive material 105 merges with a second portion 105B of the conductive material 105 in the regions 501.

Figure 19A:
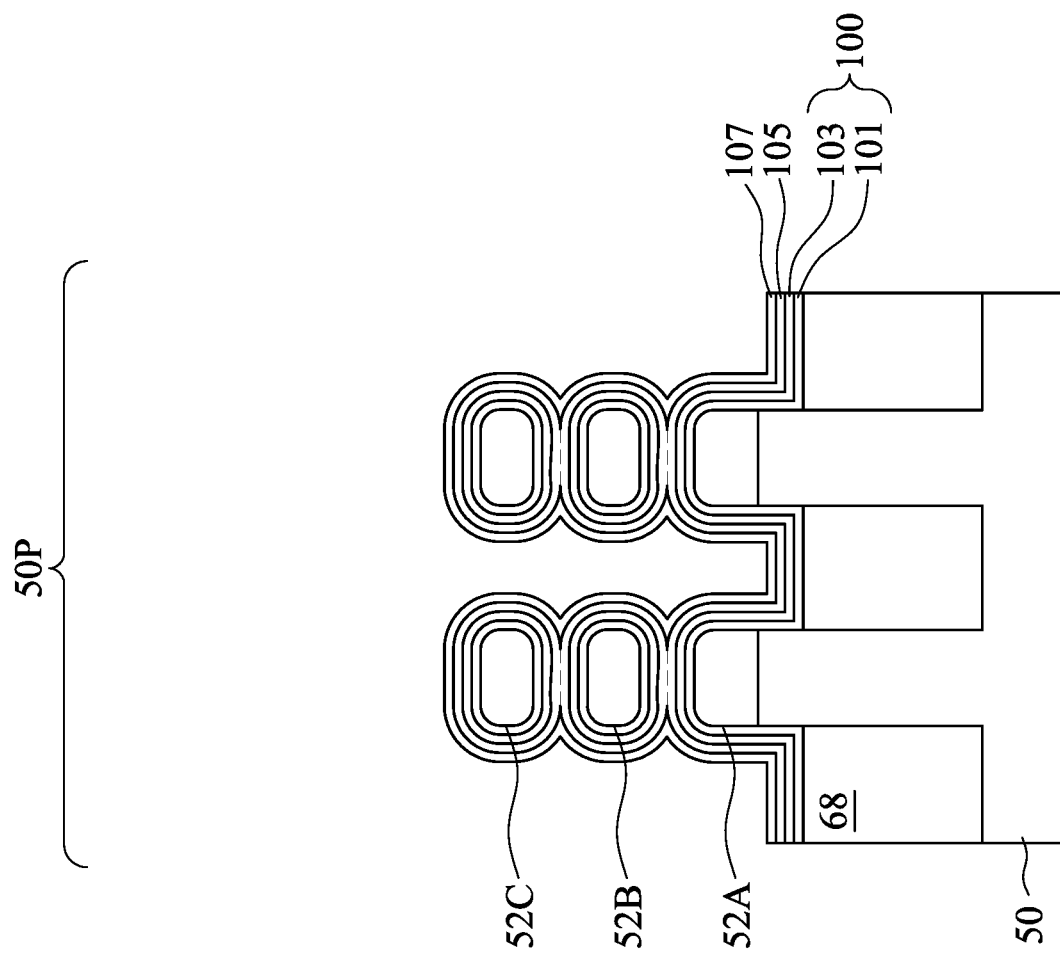
Figure 19B:
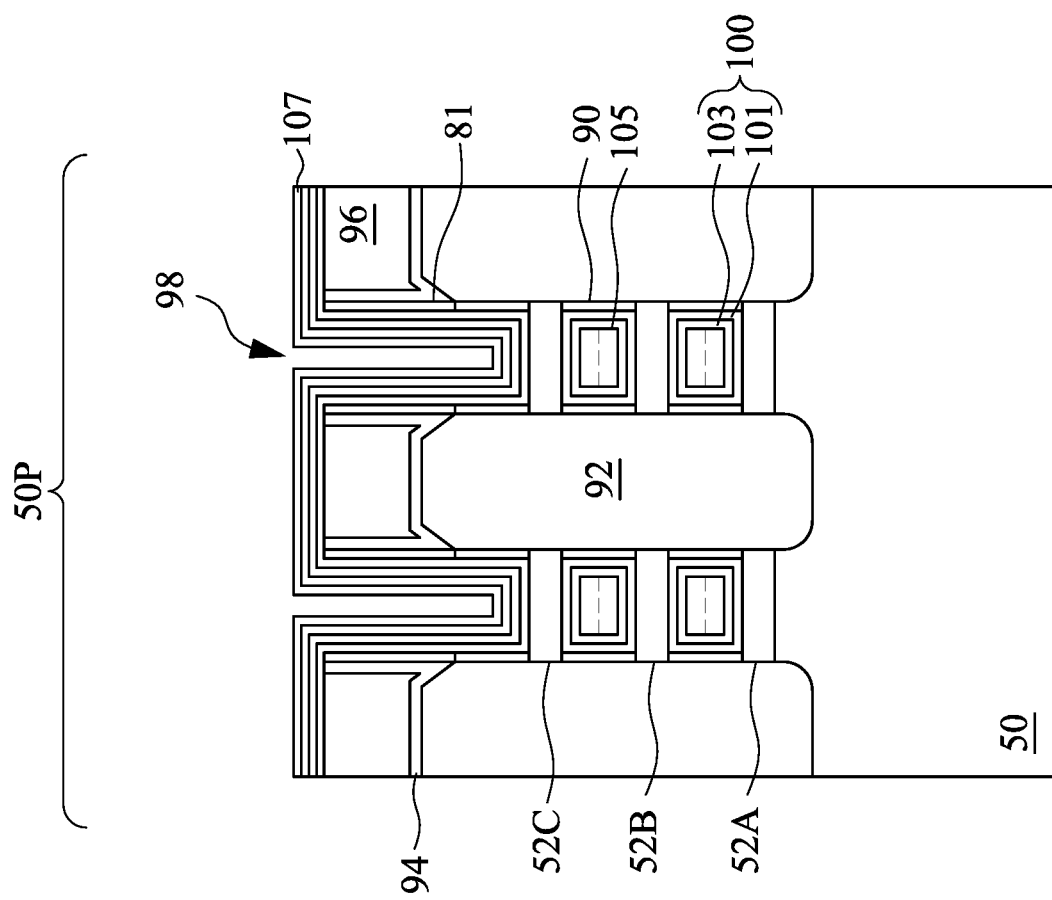

In FIGS. 19A and 19B an adhesion layer 107 may be deposited over the conductive material 105. In some embodiments, the adhesion layer 107 is deposited conformally on the conductive material 105 in the p-type region 50P. In some embodiments, the adhesion layer 107 comprises titanium nitride, tantalum nitride, or the like. The adhesion layer 107 may be deposited by CVD, ALD, PECVD, PVD, or the like. The adhesion layer 107 may alternately be referred to as a glue layer and improves adhesion between the conductive material 105 and the overlying layers of the gate electrode (e.g., the barrier layer 109 and first metal fill layer 117).

Figure 20A:
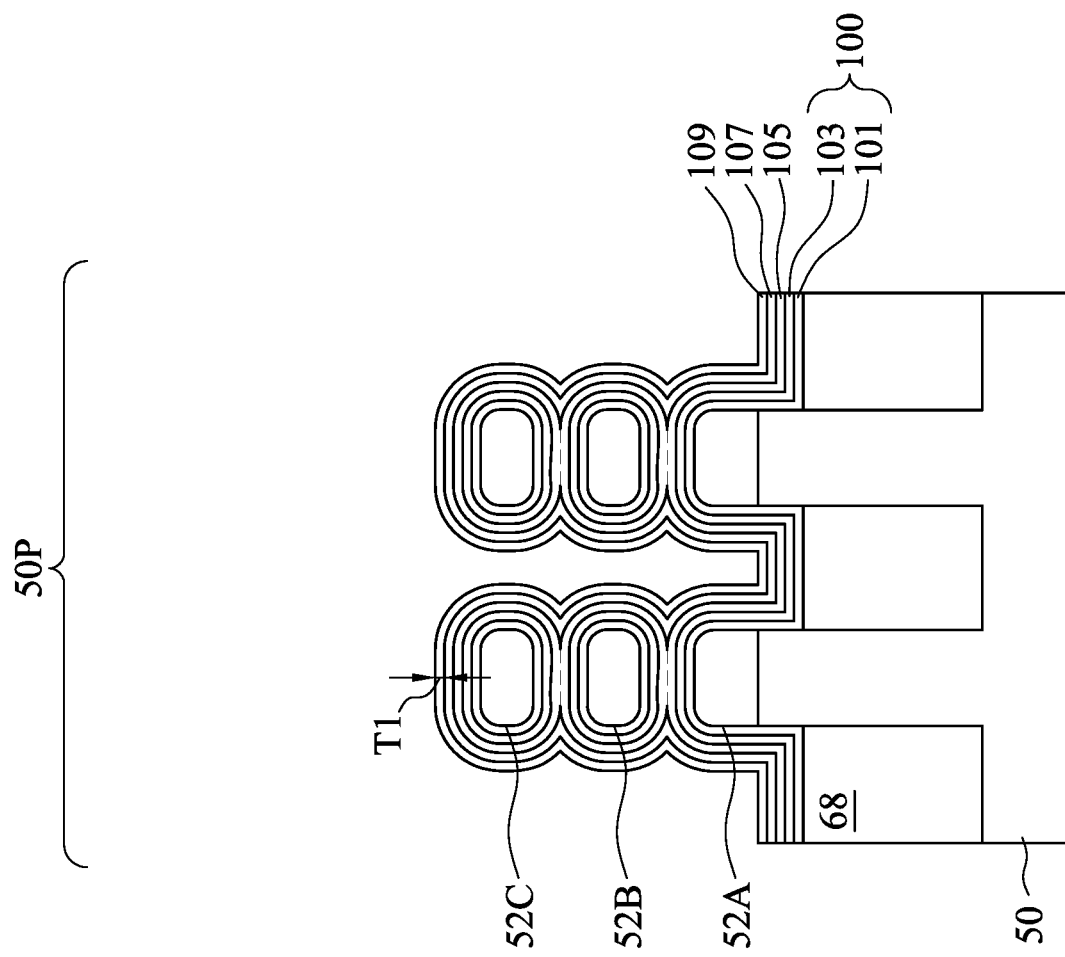
Figure 20B:
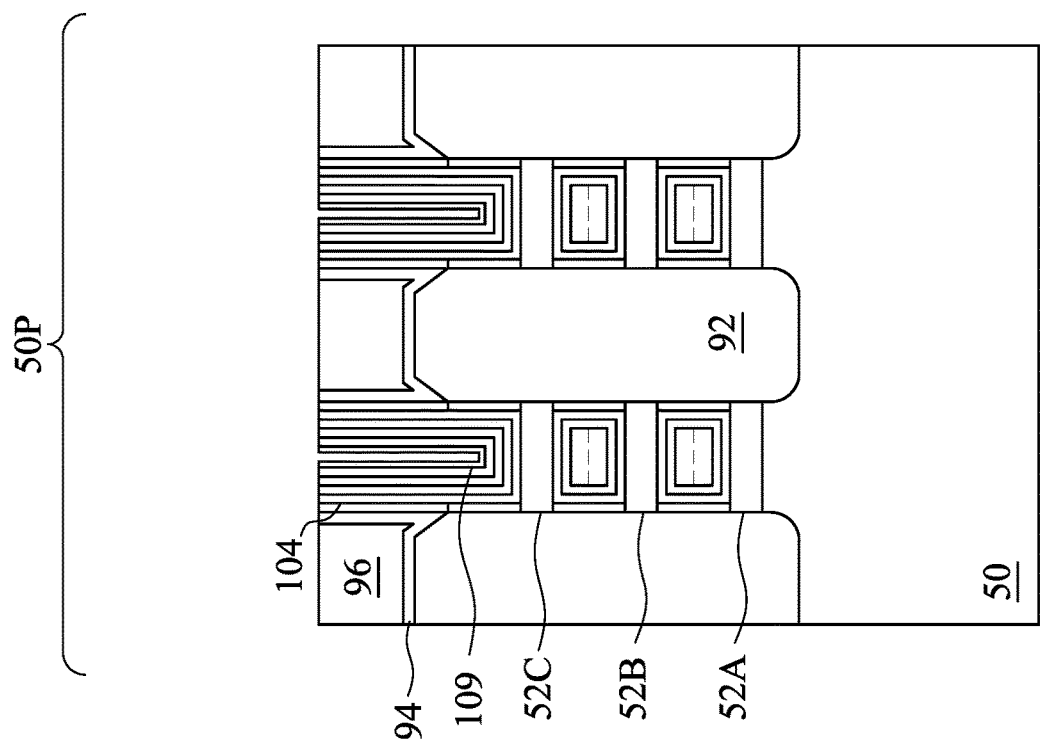

In FIGS. 20A and 20B, a barrier layer 109 is deposited conformally on the adhesion layer 107. In some embodiments, the barrier layer 109 comprises tungsten and is deposited by an ALD process, or the like. In some embodiments, a process temperature of the ALD process may be in a range of about 250° C. to about 450° C. It has been observed that a deposition temperature less than about 250° C. may result in an unacceptably low deposition rate, negatively affecting manufacturing yield. It has also been observed that a deposition temperature greater than 450° C. may result in process tool damage (e.g., ALD deposition chamber damage). In some embodiments, the ALD process may be performed at a pressure of about 0.5 Torr to about 20 Torr. It has been observed that a deposition pressure outside of this range (e.g., less than about 0.5 Torr or greater than about 20 Torr) may result in an inability to precisely control the deposition process, negatively affecting yield.

Further, the ALD process for the barrier layer 109 may include flowing one or more precursors into the deposition chamber, and the precursors used during the ALD process may be free of fluorine. For example, when the barrier layer 109 is a tungsten layer, the precursors used in the ALD process may include a combination of $W_xCl_y$ and $H_2$, where x and y are integers and $0<x<1$ and $0<y<1$. Because the ALD process does not use any fluorine-comprising precursors, the barrier layer 109 may be free of fluorine and prevents (or at least reduces) diffusion of fluorine from subsequently formed layers into the underlying adhesion layer 107 and the conductive material 105. The barrier layer 109 may be deposited to a thickness T1 in a range of 15 Å to 90 Å. It has been observed that a thickness T1 less than 15 Å may not sufficiently prevent diffusion of fluorine, thereby negatively affecting threshold voltage stability and control in the completed transistor. It has also been observed that a thickness T1 greater than 90 Å, manufacturing costs and/or time may be unacceptably high as ALD processes are more costly and time consuming than other deposition processes (e.g., CVD).

Figure 21A:
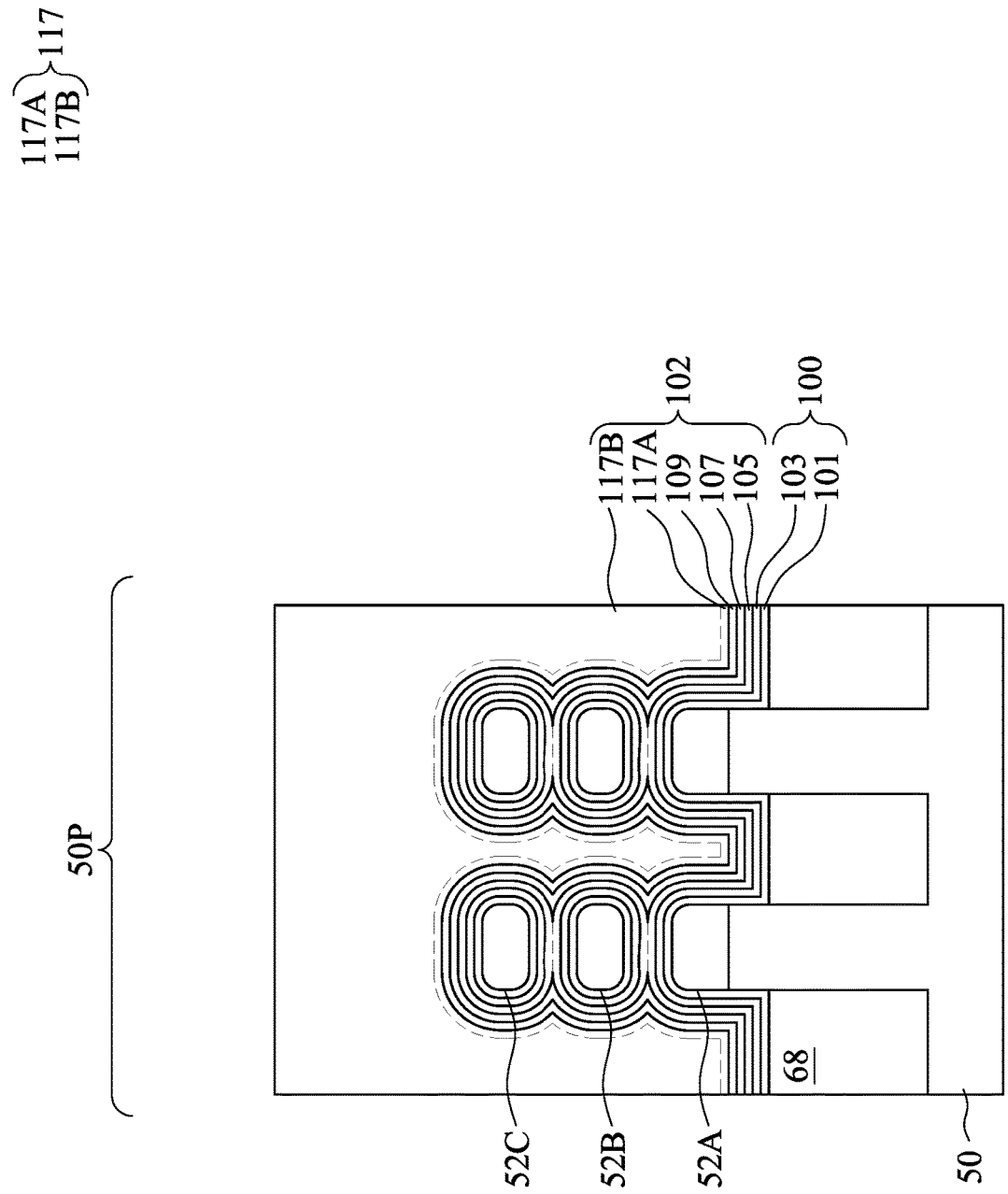
Figure 21C:
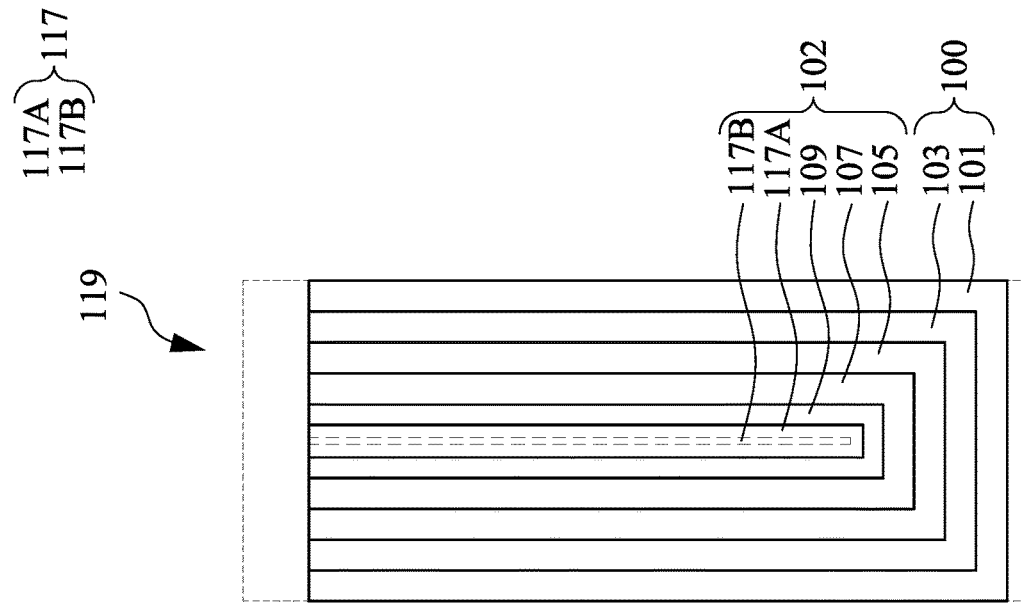
Figure 21B:
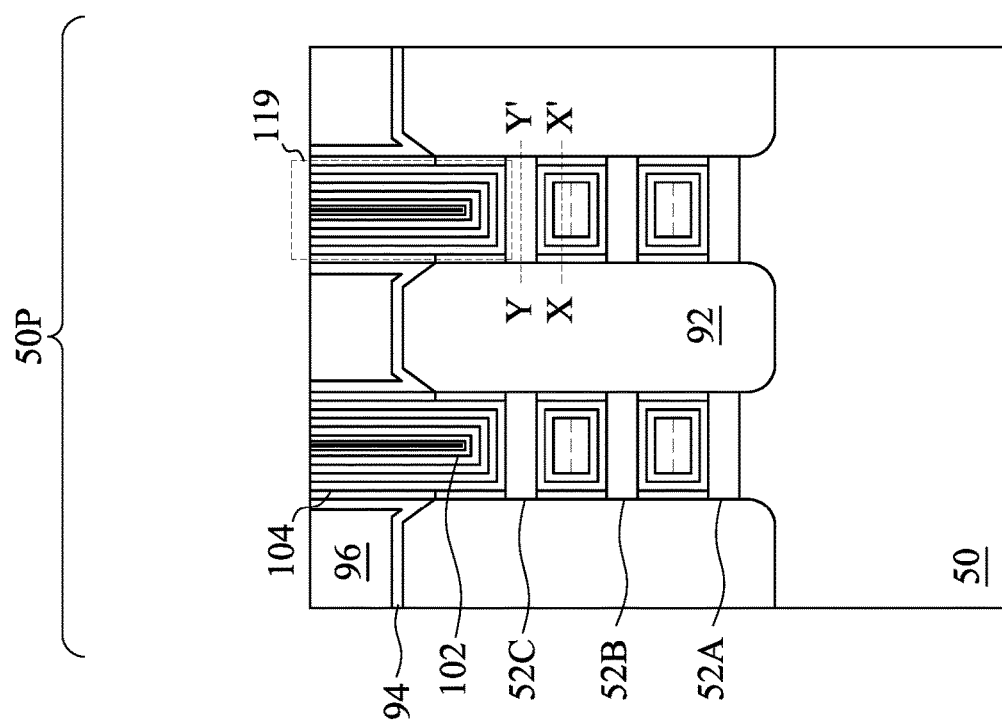
Figure 21E:
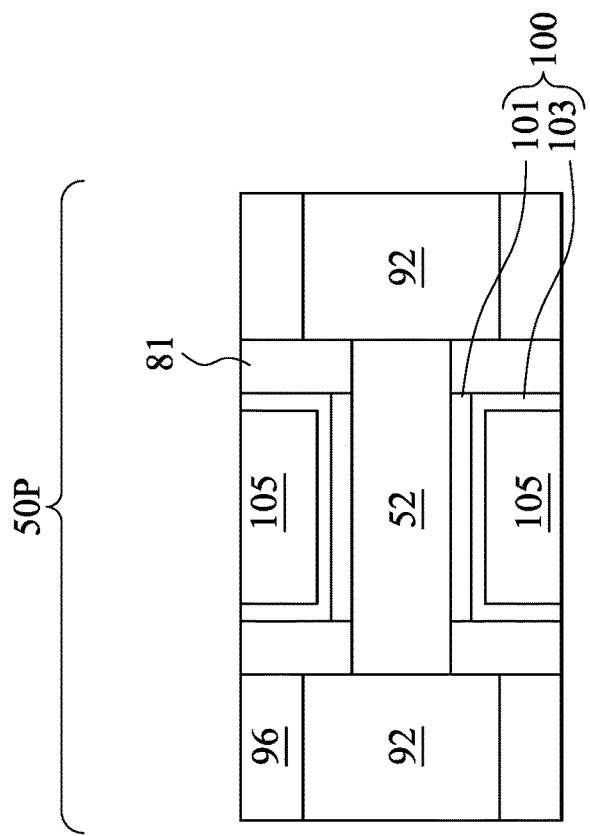
Figure 21D:
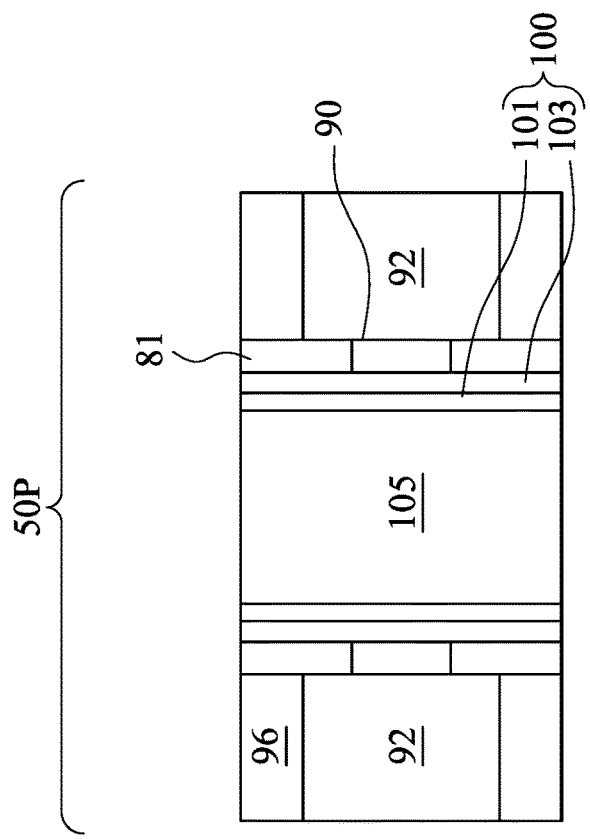

In FIGS. 21A, 21B, 21C, 21D, and 21E, remaining portions of the gate electrodes 102 are deposited, and a fill metal 117 is formed to fill the remaining portions of the second recesses 98. FIG. 21C illustrates a detailed view of area 119 of FIG. 21B. FIG. 21D illustrates a top down view along line X-X' of FIG. 21B (e.g., in the regions 501), and FIG. 21E illustrates a top down view along line Y-Y' of FIG. 21B (e.g., through the first nanostructures 52). The resulting gate electrodes 102 are formed for replacement gates and may comprise the conductive material 105, the adhesion layer 107, the barrier layer 109, the first fill metal layer 117, and the second fill metal layer 119.

The fill metal 117 may comprise cobalt, ruthenium, aluminum, tungsten, combinations thereof, or the like. In some embodiments, the fill metal 117 is deposited using two different deposition processes. For example, a first portion 117A of fill metal layer 117 is deposited over the barrier layer 109 by an ALD process, and a second portion 117B of the fill metal layer 117 may then be deposited over the first portion 117A using a CVD process. It has been observed that the ALD process may allow for a more controlled deposition in areas around the nanostructures 52 while the CVD process provides a faster deposition rate for improved yield. In other embodiments, the fill metal 117 may be deposited using a single deposition process (e.g., CVD), and the first portion 117A that is deposited by the ALD process may be omitted. Accordingly, the first portion 117A is illustrated with dashed lines to indicate that it is optional.

Depositing the fill metal 117 may include using a fluorine-comprising precursor in the ALD and/or CVD processes, and a material composition of the fill metal 117 may be uniform throughout the fill metal 117 regardless of whether a single deposition or multiple depositions are performed. For example, in embodiments where the fill metal 117 comprises tungsten, $WF_6$ may be used as a precursor in the ALD and/or CVD processes. Because a fluorine comprising precursor is used to deposit the fill metal 117, the fill metal 117 may also comprise fluorine. In various embodiments, a fluorine composition of the fill metal 117 may be higher than a fluorine composition of the barrier layer 109. For example, the barrier layer 109 may be substantially free of fluorine, and a fluorine concentration of the fill metal 117 may be in a range of 3.5% to 25%. Thus, the fill metal 117 may be distinguished from the barrier layer 109 by a fluorine composition analysis, such as XPS depth profile analysis.

Although the fill metal 117 comprises fluorine, the barrier layer 109 may prevent (or at least reduce) fluorine diffusion into the underlying adhesion layer 109 and conductive material 105, and an uneven distribution of fluorine in the different regions (e.g., within the regions 501 compared to outside of the regions 501) of the conductive material 105 can be avoided. As a result, threshold voltage control and stability in the resulting transistor can be improved by including the barrier layer 109.

In the p-type region 50P, the gate dielectrics 100, the conductive material 105 may be formed on top surfaces, sidewalls, and bottom surfaces of the first nanostructures 52. The gate dielectrics 100, the conductive material 105, the adhesion layer 107, the barrier layer 109, and the fill metal 117 may also be deposited on top surfaces and sidewalls of the first nanostructures 52 as well as the top surfaces of the first ILD 96, the CESL 94, the first spacers 81, and the STI regions 58. After the filling of the second recesses 98, a planarization process, such as a CMP, may be performed to remove the excess portions of the gate dielectrics 100, the conductive material 105, the adhesion layer 107, the barrier layer 109, and the fill metal 117 which excess portions are over the top surface of the first ILD 96. The remaining portions of material of the gate electrodes 102 and the gate dielectrics 100 thus form replacement gate structures of the resulting nano-FETs. The gate electrodes 102 and the gate dielectrics 100 may be collectively referred to as "gate structures."

Figure 22B:
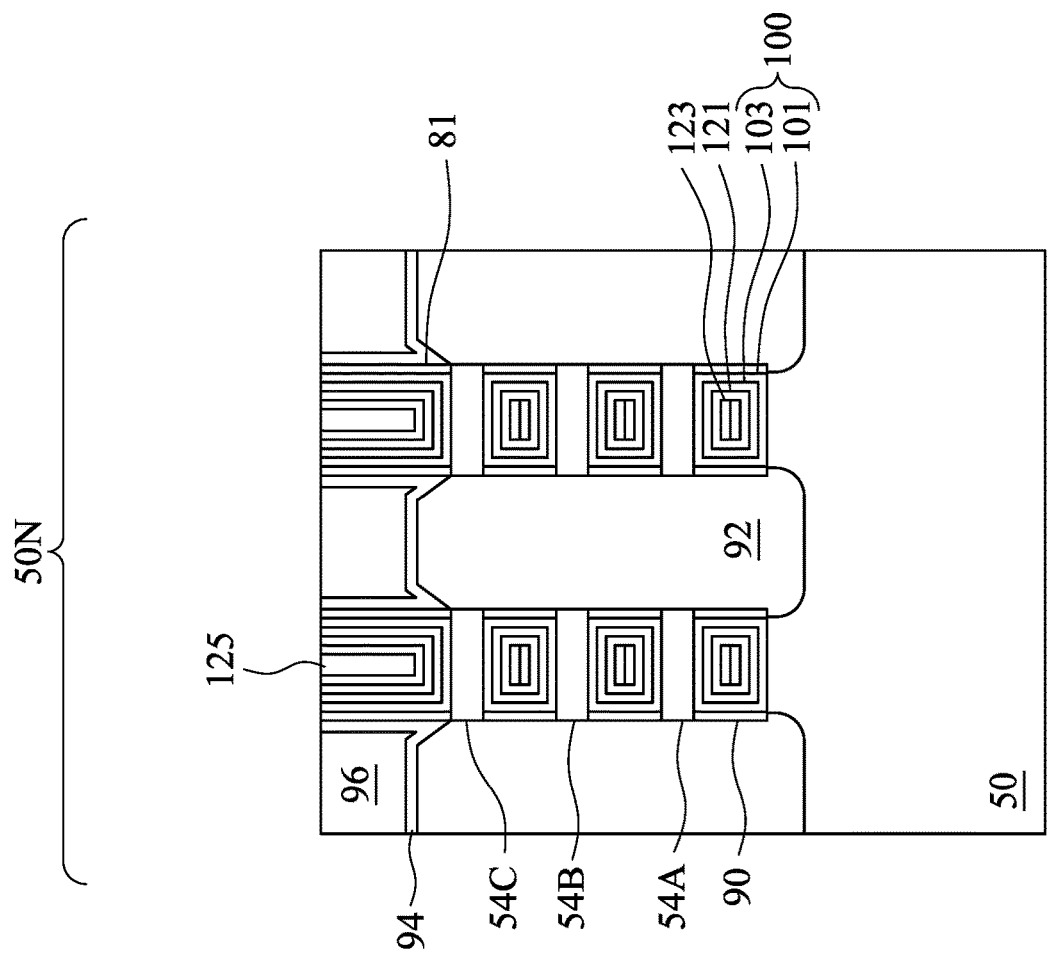

FIGS. 22A and 22B illustrate of a gate stack in the n-type region 50N. Forming the gate stack in the n-type region 50N may include first removing the first nanostructures 52 in the n-type region 50N. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, and the STI regions 68 remain relatively unetched as compared to the first nanostructures 52. In embodiments in which the first nanostructures 52A-52C include, e.g., SiGe, and the second nanostructures 54A-54C include, e.g., Si or SiC, tetramethylammonium hydroxide (TMAH), ammonium hydroxide ($NH_4OH$) or the like may be used to remove the first nanostructures 52 in the n-type region 50N.

The gate stack is then formed over and around the second nanostructures 54 in the n-type region 50N. The gate stack includes the gate dielectrics 100 and gate electrodes 127. In some embodiments, the gate dielectrics 100 in the n-type region 50N and the p-type region 50P may be formed simultaneously. Further, at least portions of the gate electrodes 127 may be formed either before or after forming the gate electrodes 102 (see FIGS. 20A and 20B), and at least portions of the gate electrodes 127 may be formed while the p-type region 50P is masked. As such, the gate electrodes 127 may comprise different materials than the gate electrodes 102. For example, the gate electrodes 127 may comprise a conductive layer 121, a barrier layer 123, and a fill metal 125. The conductive layer 121 may be an n-type work function metal (WFM) layer comprising an n-type metal, such as, titanium aluminum, titanium aluminum carbide, tantalum aluminum, tantalum carbide, combinations thereof, or the like. The conductive layer 121 may be deposited by CVD, ALD, PECVD, PVD, or the like. The barrier layer 123 may comprise titanium nitride, tantalum nitride, tungsten carbide, combinations thereof, or the like, and the barrier layer 123 may further function as an adhesion layer. The barrier layer 123 may be deposited by CVD, ALD, PECVD, PVD, or the like. The fill metal 125 comprises cobalt, ruthenium, aluminum, tungsten, combinations thereof, or the like, which is deposited by CVD, ALD, PECVD, PVD, combinations thereof, or the like. The fill metal 125 may or may not have a same material composition and be deposited concurrently with the fill metal 117. Although not explicitly illustrated, an additional barrier layer (e.g., similar to the barrier layer 109 discussed above) may be deposited between the barrier layer 123 and the fill metal 125 to prevent fluorine diffusion from the fill metal 125 into the underlying barrier layer 123 and/or the conductive layer 121.

After the filling of the second recesses 98, a planarization process, such as a CMP, may be performed to remove the excess portions of the gate dielectrics 100 and the gate electrodes 127, which excess portions are over the top surface of the first ILD 96. The remaining portions of material of the gate electrodes 127 and the gate dielectrics 100 thus form replacement gate structures of the resulting nano-FETs of the n-type region 50N. The CMP processes to remove excess materials of the gate electrodes 102 in the p-type region 50P and to remove excess materials of the gate electrodes 127 in the n-type region 50N may be performed concurrently or separately.

Figure 23C:
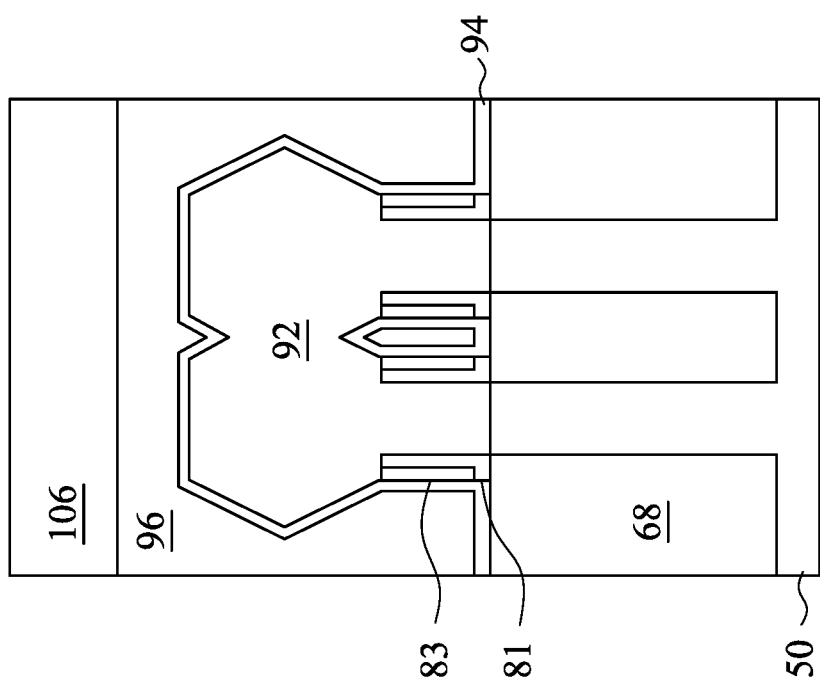

In FIGS. 23A-23C, the gate structure (including the gate dielectrics 100, the gate electrodes 102, and the gate electrodes 127) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 24A and 24B) penetrate through the gate mask 104 to contact the top surface of the recessed gate electrodes 102.

As further illustrated by FIGS. 23A-23C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 24C:
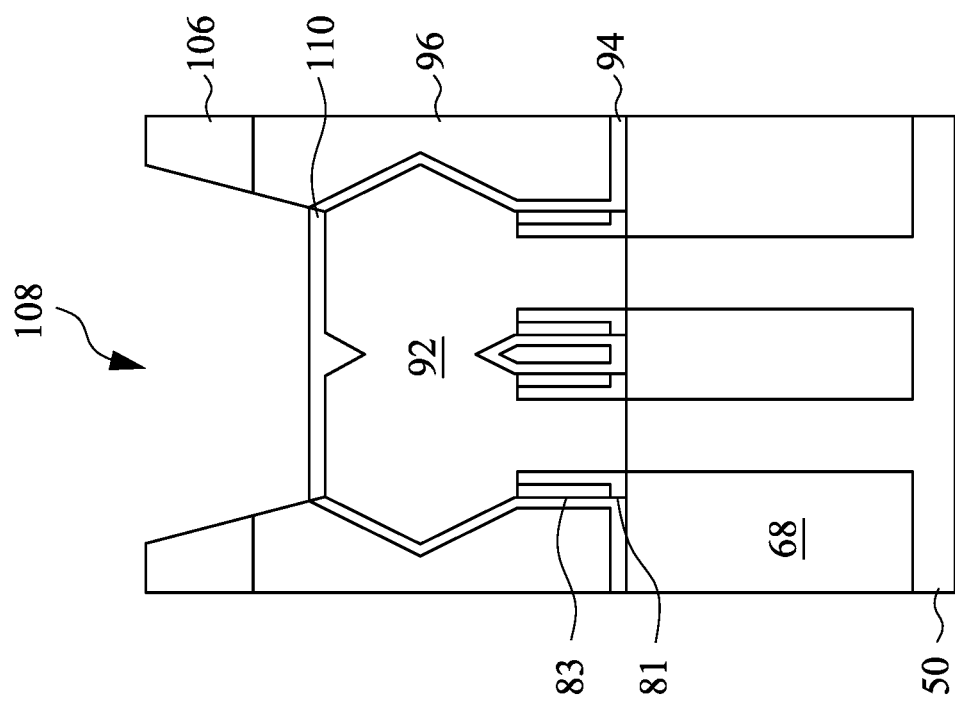

In FIGS. 24A-24C, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 24B illustrates the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts.

After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 25C:
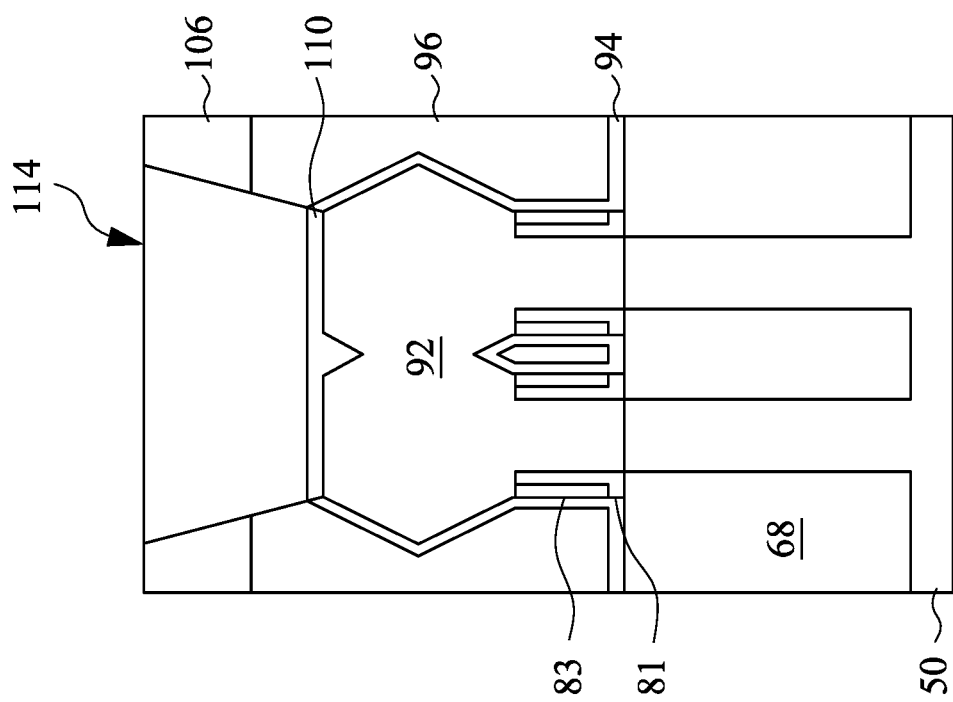

Next, in FIGS. 25A-C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive material, and is electrically coupled to the underlying conductive feature (e.g., the gate electrodes 102, the gate electrodes 127, and/or silicide region 110 in the illustrated embodiment). The contacts 114 are electrically coupled to the gate electrodes 102 and 127 and may be referred to as gate contacts, and the contacts 112 are electrically coupled to the silicide regions 110 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

Figure 26C:
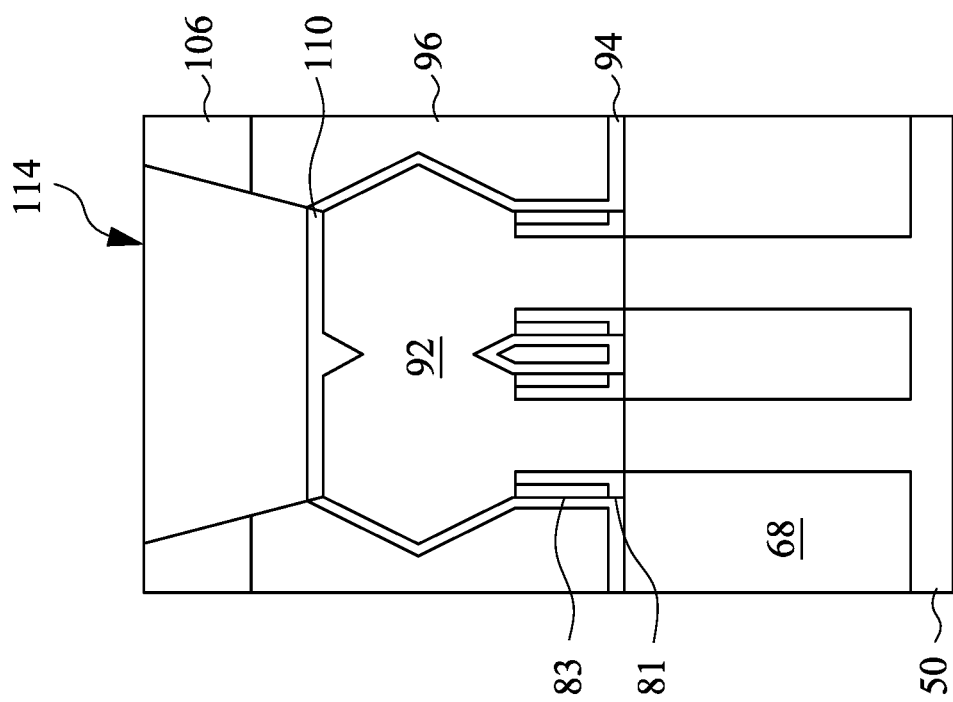
Figure 27C:
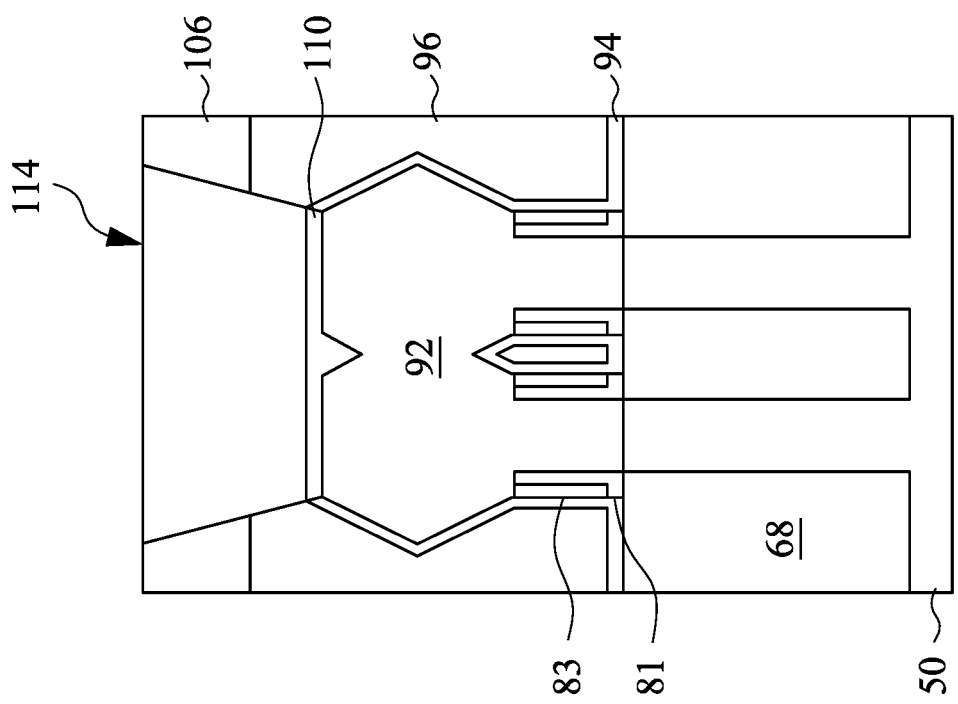

FIGS. 26A through 26C illustrate cross-sectional views of a device according to some alternative embodiments. FIG. 26A illustrates reference cross-section A-A' illustrated in FIG. 1. FIG. 26B illustrates reference cross-section B-B' illustrated in FIG. 1. FIG. 26C illustrates reference cross-section C-C' illustrated in FIG. 1. In FIGS. 26A-C, like reference numerals indicate like elements formed by like processes as the structure of FIGS. 25A-C. However, in FIGS. 26A-C, channel regions in the n-type region 50N and the p-type region 50P comprise a same material. For example, the second nanostructures 54, which comprise silicon, provide channel regions for p-type NSFETs in the p-type region 50P and for n-type NSFETs in the n-type region 50N. The structure of FIGS. 26A-C may be formed, for example, by removing the first nanostructures 52 from both the p-type region 50P and the n-type region 50N simultaneously; depositing the gate dielectrics 100 and the gate electrodes 102 around the second nanostructures 54 in the p-type region 50P; and depositing the gate dielectrics 100 and the gate electrodes 104 around the first nanostructures 54 in the n-type region 50N.

FIGS. 27A through 27C illustrate cross-sectional views of a device according to some alternative embodiments. FIG. 27A illustrates reference cross-section A-A' illustrated in FIG. 1. FIG. 27B illustrates reference cross-section B-B' illustrated in FIG. 1. FIG. 27C illustrates reference cross-section C-C' illustrated in FIG. 1. In FIGS. 27A-C, like reference numerals indicate like elements formed by like processes as the structure of FIGS. 25A-C. However, in FIGS. 27A-C, the fill metal 117 is omitted, and the material of the barrier layer 109 is deposited to fill the second recesses 98 and provide the fill material of the gate electrodes. As a result, the gate electrodes are formed to be substantially free of any fluorine. For example, fluorine-free tungsten may be used as a fill metal over the adhesion layer 107.

Various embodiments provide transistor gate stacks where a conductive material (e.g., tungsten) is deposited as a fill metal. Various embodiments may further include a barrier layer between the fill metal and underlying work function metal (WFM) layers to prevent fluorine diffusion during deposition and/or the fill metal into the underlying WFM layers. For example, the barrier layer may comprise a tungsten layer that is deposited with fluorine free precursors. By preventing fluorine diffusion into the underlying layers, advantages maybe achieved. For example, by preventing fluorine diffusion into the underlying layers, uneven fluorine distribution in the WFM layers may be avoided in different areas of the gate stack, which results in improved threshold voltage (Vt) stability and control. Vt stability and control may be especially improved in nano-FETs, which are susceptible to uneven fluorine diffusion in regions of the WFM layers between nanosheets compared to other regions of the WFM layers.

In some embodiments, a device includes a first nanostructure; a second nanostructure over the first nanostructure; a high-k gate dielectric around the first nanostructure and the second nanostructure, the high-k gate dielectric having a first portion on a top surface of the first nanostructure and a second portion on a bottom surface of the second nanostructure; and a gate electrode over the high-k gate dielectric. The gate electrode comprises: a first work function metal around the first nanostructure and the second nanostructure, the first work function metal filling a region between the first portion of the high-k gate dielectric and the second portion of the high-k gate dielectric; and a tungsten layer over the first work function metal, the tungsten layer being free of fluorine. Optionally, in some embodiments, the gate electrode further comprises a fill material over the tungsten layer, the fill material having a higher concentration of fluorine than the tungsten layer. Optionally, in some embodiments, the fill material comprises tungsten. Optionally, in some embodiments, a thickness of tungsten layer is in a range of 15 Å to 90 Å. Optionally, in some embodiments, the first work function metal is free of fluorine. Optionally, in some embodiments, the gate electrode further comprises an adhesion layer between the tungsten layer and the first work function metal.

In some embodiments, a transistor includes a first nanostructure over a semiconductor substrate; a second nanostructure over the first nanostructure; a gate dielectric surrounding the first nanostructure and the second nanostructure; and a gate electrode over the gate dielectric. The gate electrode comprises: a work function metal around the first nanostructure and the second nanostructure; a barrier layer on the work function metal; and a fill metal over the barrier layer, wherein the fill metal has a higher concentration of fluorine than the barrier layer. Optionally, in some embodiments, the transistor further comprises an adhesion layer between the barrier layer and the fill metal. Optionally, in some embodiments, a thickness of the barrier layer is in a range of 15 Å to 90 Å. Optionally, in some embodiments, the barrier layer is free of fluorine. Optionally, in some embodiments, the work function metal is free of fluorine. Optionally, in some embodiments, the barrier layer and the fill metal each comprise tungsten. Optionally, in some embodiments, the transistor further comprises an interfacial layer under the gate dielectric, the interface layer surrounding the first nanostructure and the second nanostructure, and the gate dielectric comprises a high-k material.

In some embodiments, a method includes depositing a gate dielectric around a first nanostructure and a second nanostructure, the first nanostructure is disposed over the second nanostructure; depositing a work function metal over the gate dielectric; depositing a barrier layer over the work function metal, wherein depositing the barrier layer comprises a first atomic layer deposition (ALD) process, and wherein the first ALD process does not use any fluorine-comprising precursors; and depositing a fill metal over the barrier layer, wherein depositing the fill metal comprises using a fluorine-comprising precursor. Optionally, in some embodiments, the first ALD process comprises using a combination of $W_xCl_y$ and $H_2$ as precursors. Optionally, in some embodiments, depositing the fill metal comprises a chemical vapor deposition (CVD) process, and wherein the fluorine-comprising precursor is $WF_6$. Optionally, in some embodiments, depositing the fill metal further comprises a second ALD process performed before the CVD process. Optionally, in some embodiments, the ALD process comprises using $WF_6$ as a precursor. Optionally, in some embodiments, the method further includes depositing an adhesion layer between the work function metal and the barrier layer. Optionally, in some embodiments, the barrier layer and the fill metal each comprise tungsten.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first nanostructure;
a second nanostructure over the first nanostructure;
a high-k gate dielectric around the first nanostructure and the second nanostructure, the high-k gate dielectric having a first portion on a top surface of the first nanostructure and a second portion on a bottom surface of the second nanostructure; and
a gate electrode over the high-k gate dielectric, wherein the gate electrode comprises:
a first work function metal around the first nanostructure and the second nanostructure, the first work function metal comprising a seam between a first portion of the first work function metal and a second portion of the first work function metal, wherein the seam is disposed between the first nanostructure and the second nanostructure; and
a tungsten layer over the first work function metal.

2. The device of claim 1, wherein the gate electrode further comprises a fill material over the tungsten layer, the fill material having a higher concentration of fluorine than the tungsten layer.

3. The device of claim 2, wherein the fill material comprises tungsten.

4. The device of claim 1, wherein the first work function metal is a p-type work function metal.

5. The device of claim 1, wherein the first work function metal is free of fluorine.

6. The device of claim 1, wherein the gate electrode further comprises an adhesion layer between the tungsten layer and the first work function metal.

7. A transistor comprising:
a first nanostructure over a semiconductor substrate;
a second nanostructure over the first nanostructure;
a gate dielectric surrounding the first nanostructure and the second nanostructure;
a gate electrode over the gate dielectric, wherein the gate electrode comprises:
a work function metal around the first nanostructure and the second nanostructure;
a barrier layer over the work function metal, the barrier layer comprising tungsten; and
a fill metal over the barrier layer, the fill metal comprising tungsten, wherein the fill metal has a higher concentration of fluorine than the barrier layer; and
a gate spacer on a sidewall of the gate electrode, wherein a bottom surface of the gate spacer contacts a top surface of the second nanostructure.

8. The transistor of claim 7 further comprising an adhesion layer between the barrier layer and the fill metal.

9. The transistor of claim 7, wherein a thickness of the barrier layer is in a range of 15 Å to 90 Å.

10. The transistor of claim 7, wherein the barrier layer is free of fluorine, and wherein the work function metal is free of fluorine.

11. The transistor of claim 7, wherein the work function metal is a p-type work function metal, and wherein a first portion of the work function metal meets a second portion of the work function metal at a seam between the first nanostructure and the second nanostructure.

12. The transistor of claim 7, wherein the barrier layer and the fill metal each comprise tungsten.

13. The transistor of claim 7 further comprising an interfacial layer under the gate dielectric, the interface layer surrounding the first nanostructure and the second nanostructure, and the gate dielectric comprises a high-k material.

14. A method comprising:
depositing a gate dielectric around a first nanostructure and a second nanostructure, the first nanostructure is disposed over the second nanostructure;
depositing a work function metal over the gate dielectric, wherein the work function metal completely fills a region extending from a first portion of the gate dielectric surrounding the first nanostructure to a second portion of the gate dielectric surrounding the second nanostructure;
depositing a barrier layer over the work function metal, wherein depositing the barrier layer comprises a first atomic layer deposition (ALD) process; and
depositing a fill metal over the barrier layer, wherein depositing the fill metal comprises using a fluorine-comprising precursor.

15. The method of claim 14, wherein the first ALD process does not use any fluorine-comprising precursors.

16. The method of claim 15, wherein the first ALD process comprises using a combination of $W_xCl_y$ and $H_2$ as precursors.

17. The method of claim 14, wherein depositing the fill metal comprises a chemical vapor deposition (CVD) process, and wherein the fluorine-comprising precursor is $WF_6$.

18. The method of claim 17, wherein depositing the fill metal further comprises a second ALD process performed before the CVD process, and wherein the second ALD process comprises using $WF_6$ as a precursor.

19. The method of claim 14 further comprising depositing an adhesion layer between the work function metal and the barrier layer.

20. The method of claim 14, wherein the barrier layer and the fill metal each comprise tungsten.

* * * * *